US012772537B2

(12) United States Patent
Yoo et al.

(10) Patent No.: US 12,772,537 B2
(45) Date of Patent: Oct. 20, 2026

(54) INTEGRATED CIRCUIT DEVICE

(71) Applicant: SAMSUNG ELECTRONICS CO., LTD., Suwon-si (KR)

(72) Inventors: Donggon Yoo, Suwon-si (KR); Eunhyea Ko, Suwon-si (KR); Sunjung Lee, Suwon-si (KR); Yongho Ha, Suwon-si (KR); Jeongwon Hwang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 329 days.

(21) Appl. No.: 18/658,176

(22) Filed: May 8, 2024

(65) Prior Publication Data

US 2024/0429303 A1 Dec. 26, 2024

(30) Foreign Application Priority Data

Jun. 22, 2023 (KR) ........................ 10-2023-0080636

(51) Int. Cl.
*H10D 64/62* (2025.01)
*H10D 30/01* (2025.01)
(Continued)

(52) U.S. Cl.
CPC ........... *H10D 64/62* (2025.01); *H10D 30/014* (2025.01); *H10D 30/43* (2025.01);
(Continued)

(58) Field of Classification Search
CPC ...... H10D 64/62; H10D 30/014; H10D 30/43; H10D 30/6729; H10D 30/6735;
(Continued)

(56) References Cited

U.S. PATENT DOCUMENTS

| | | | |
|---|---|---|---|
| 11,049,770 | B2 | 6/2021 | Parikh |
| 2020/0006127 | A1 | 1/2020 | Khaderbad et al. |

(Continued)

OTHER PUBLICATIONS

Vega-Gonzalez, V., et al. "Supervia process integration and reliability compared to stacked Vias using barrierless ruthenium." 2020 IEEE International Electron Devices Meeting (IEDM), Dec. 12, 2020, https://doi.org/10.1109/iedm13553.2020.9372096. (Year: 2020).*

*Primary Examiner* — J.E. Schoenholtz
(74) *Attorney, Agent, or Firm* — Fish & Richardson P.C.

(57) ABSTRACT

An integrated circuit device includes a substrate, a fin-type active region extending in a first horizontal direction on a first surface of the substrate, a source/drain region on the fin-type active region, an active contact on the source/drain region and electrically connected to the source/drain region, a wiring line extending at a vertical level higher than the source/drain region, a via contact penetrating an insulating layer on the source/drain region and serving as a medium of electrical connection between the active contact and the wiring line, and an adhesive layer between the wiring line and the insulating layer and contacting the wiring line, wherein the via contact includes a top via contact and a bottom via contact, the top via contact includes a metal different from a metal included in the bottom via contact, and the wiring line and the top via contact are in direct contact with each other.

20 Claims, 43 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.
CPC ..... *H10D 30/6729* (2025.01); *H10D 30/6735* (2025.01); *H10D 62/121* (2025.01); *H10D 64/01* (2025.01)

(58) Field of Classification Search
CPC .... H10D 62/121; H10D 64/01; H10D 30/019; H10D 30/6757; H10D 64/256; H10D 64/518; H10D 30/501; H10D 84/834; H10D 64/254; B82Y 10/00; H10W 70/65; H10W 70/611; H10W 20/42
See application file for complete search history.

(56) References Cited

U.S. PATENT DOCUMENTS

| | | | | |
|---|---|---|---|---|
| 2022/0108919 | A1 | 4/2022 | Wang et al. | |
| 2022/0199422 | A1 | 6/2022 | Yang et al. | |
| 2022/0285212 | A1 | 9/2022 | Ren et al. | |
| 2022/0293512 | A1 | 9/2022 | Lo et al. | |
| 2022/0336352 | A1 | 10/2022 | Bae et al. | |
| 2022/0352068 | A1 | 11/2022 | Lin et al. | |
| 2022/0372617 | A1 | 11/2022 | Cen et al. | |
| 2023/0033038 | A1 | 2/2023 | Lin et al. | |
| 2024/0321630 | A1* | 9/2024 | Xie ..................... | H10W 20/056 |
| 2025/0351524 | A1* | 11/2025 | Chen ...................... | H10D 64/01 |
| 2025/0357223 | A1* | 11/2025 | Chiu .................. | H10D 30/6735 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2023-0080636, filed on Jun. 22, 2023, in the Korean Intellectual Property Office, the disclosure of which is incorporated by reference herein in its entirety.

BACKGROUND

The present disclosure relates to an integrated circuit device, and more particularly, to an integrated circuit device including a structure formed through a self-align method.

Demands for reduced size, multi-functionality, and high performance of electronic devices, high capacity and high integration of integrated circuit devices continue in the semiconductor industry. Accordingly, wiring structures that are efficiently designed to improve high integration while securing functions and operation speeds are in demand.

SUMMARY

In general, in some aspects, the subject matter of the present disclosure is directed to an integrated circuit device including: a substrate, a fin-type active region extending in a first horizontal direction on a first surface of the substrate, a source/drain region on the fin-type active region, an active contact on the source/drain region and electrically connected to the source/drain region, a wiring line extending at a vertical level higher than the source/drain region, a via contact penetrating an insulating layer on the source/drain region and configured to serve as a medium of electrical connection between the active contact and the wiring line, and an adhesive layer between the wiring line and the insulating layer and, contacting the wiring line, wherein the via contact includes a top via contact and a bottom via contact, the top via contact includes a metal different from a metal included in the bottom via contact, and the wiring line and the top via contact directly contact each other.

In general, in some aspects, the subject matter of the present disclosure is directed to an integrated circuit device including: a substrate, a fin-type active region extending in a first direction on a first surface of the substrate, a source/drain region on the fin-type active region, a gate line extending, on the fin-type active region, in a second horizontal direction crossing the first horizontal direction, a wiring line extending at a vertical level higher than the source/drain region, a gate contact penetrating an insulating layer on the gate line, and serving as a medium of electrical connection between the gate line and the wiring line, and an adhesive layer arranged between the wiring line and the insulating layer and contacting the wiring line, wherein the gate contact includes a top gate contact and a bottom gate contact, the top gate contact includes a metal different from a metal included in the bottom gate contact, and the wiring line and the top gate contact are in direct contact with each other.

In general, in some aspects, the subject matter of the present disclosure is directed to an integrated circuit device including: a substrate, a fin-type active region extending in a first horizontal direction on a first surface of the substrate, a source/drain region on the fin-type active region, a gate line extending, on the fin-type active region, in a second horizontal direction crossing the first horizontal direction, a wiring line extending in the first horizontal direction at a vertical level higher than the source/drain region, an active contact on the source/drain region and electrically connected to the source/drain region, a via contact penetrating an insulating layer on the source/drain region and serving as a medium of electrical connection between the gate line and the wiring line, a gate contact penetrating the insulating layer and serving as a medium of electrical connection between the gate line and the wiring line, and a titanium nitride (TiN) layer between the wiring line and the insulating layer, and contacting the wiring line, wherein the via contact includes a top via contact including ruthenium (Ru) and a bottom via contact including molybdenum (Mo), the gate contact includes a top gate contact including Ru and a bottom gate contact including Mo, a width of the top via contact in the second horizontal direction is greater than a width of the wiring line in the second horizontal direction, a width of the top gate contact in the second horizontal direction is greater than a width of the wiring line in the second horizontal direction, the wiring line and the top via contact are in direct contact with each other, and the wiring line and the top gate contact are in direct contact with each other.

BRIEF DESCRIPTION OF THE DRAWINGS

Same reference numerals will be given to same components in the drawings, and descriptions thereof will not be repeatedly given.

DETAILED DESCRIPTION

Figure 1:
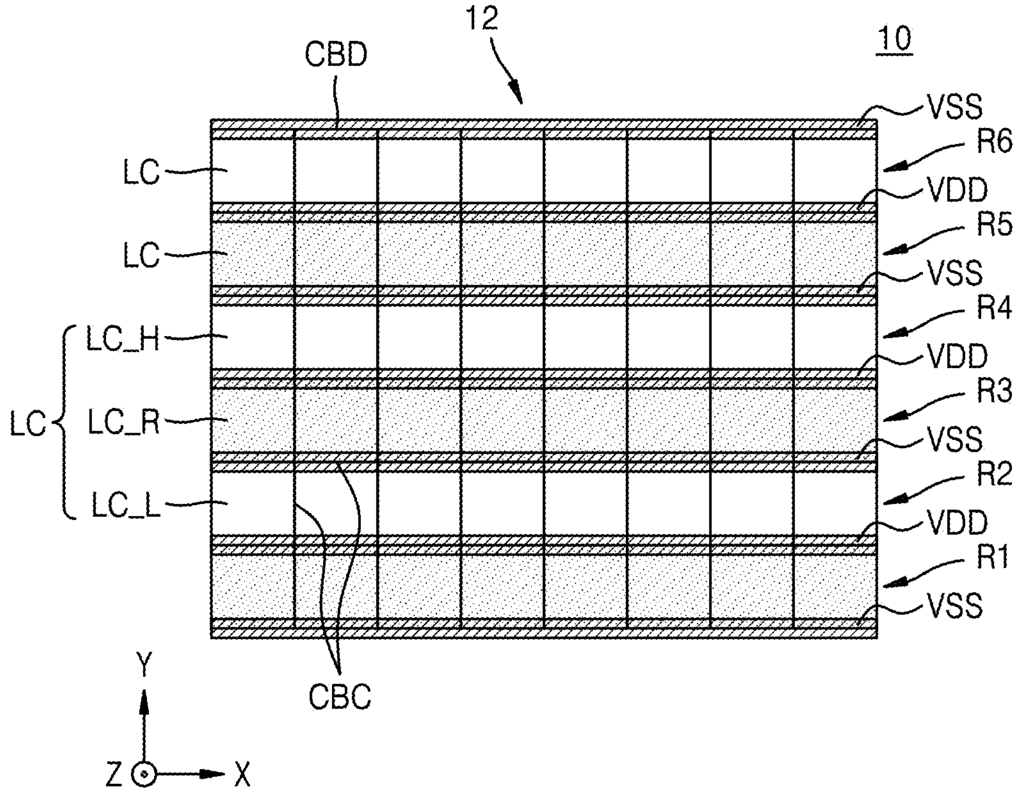
FIG. 1 is a diagram illustrating a floor layout of an example of a cell block of an integrated circuit device.

FIG. 1 is a diagram illustrating a floor layout of an example of a cell block 12 of an integrated circuit device 10.

Referring to FIG. 1, the cell block 12 of the integrated circuit device 10 includes a plurality of logic cells LC including a plurality of circuit patterns for construction of various types of circuits. The plurality of logic cells LC may be arranged in the form of a matrix, in the cell block 12, in a width direction (an X direction) and a height direction (a Y direction).

The plurality of logic cells LC may include a circuit pattern having a layout designed according to Place and Route (PnR) method to perform at least one logic function. The plurality of logic cells LC may be configured to perform various logic functions. In some implementations, the plurality of logic cells LC may include a plurality of standard cells. In some implementations, at least some of the plurality of logic cells LC may be configured to perform a same logic function. In some implementations, at least some of the plurality of logic cells LC may be respectively configured to perform different logic functions.

The plurality of logic cells LC may include various kinds of logic cells including a plurality of circuit elements. For example, the plurality of logic cells LC may each include AND, NAND, OR, NOR, exclusive OR (XOR), exclusive NOR (XNOR), inverter (INV), adder (ADD, buffer (BUF), delay (DLY), filter (FIL), multiplexer (MXT/MXIT), OR/AND/INVERTER (OAI), AND/OR (AO), AND/OR/INVERTER (AOI), a D flip-flop, a reset flip-flop, a master-slave flip-flop, a latch, or combination thereof, but other implementations are possible.

In the cell block 12, at least some of the plurality of logic cells LC forming a row R1, R2, R3, R4, R5, or R6 in the width direction (the X direction) may have a same width. In addition, at least some of the plurality of logic cells LC forming the row R1, R2, R3, R4, R5, or R6 may have a same height. However, other implementations are possible, and at least some of the plurality of logic cells LC forming the row R1, R2, R3, R4, R5, or R6 may have different widths and heights.

An area of each of the plurality of logic cells LC included in the cell block 12 of the integrated circuit device 10 may be defined by a cell boundary CBD. A cell boundary contact CBC in which cell boundaries CBD of two logic cells LC meet each other is between the two logic cells LC adjacent to each other in the width direction (the X direction) or the height direction (the Y direction) among the plurality of logic cells LC.

In some implementations, among the plurality of logic cells LC included in one row R1, R2, R3, R4, R5, or R6, two logic cells LC adjacent to each other in the width direction may contact each other in the cell boundary contact CBC without a distance therebetween. In some implementations, among the plurality of logic cells LC included in one row R1, R2, R3, R4, R5, or R6, two logic cells LC adjacent to each other in the width direction may be apart from each other with a certain distance therebetween.

In some implementations, among the plurality of logic cells LC included in one row R1, R2, R3, R4, R5, or R6, two logic cells LC adjacent to each other may be configured to perform a same function. In this case, the two logic cells LC adjacent to each other may have a same structure. In some implementations, among the plurality of logic cells LC included in one row R1, R2, R3, R4, R5, or R6, two logic cells LC adjacent to each other may be configured to perform different functions.

In some implementations, a logic cell LC selected from among the plurality of logic cells LC included in the cell block 12 of the integrated circuit device 10 and another logic cell LC adjacent to the selected logic cell LC in the height direction (the Y direction shown in FIG. 1) may have a symmetrical structure with reference to a cell boundary contact CBC therebetween. For example, a reference logic cell LC_R in a third row R3 and a lower logic cell LC_R in a second row R2 may have a symmetrical structure with reference to a cell boundary contact CBC therebetween. In addition, the reference logic cell LC_R in the third row and an upper logic cell LC_R in a fourth row R4 may have a symmetrical structure with reference to a cell contact portion CBC therebetween.

Although FIG. 1 illustrates the cell block 12 including the six rows R1, R2, R3, R4, R5, and R6, this is merely an example. The cell block 12 may include various numbers of rows selected according to needs, and one row may include various numbers of logic cells selected for a particular application.

A line selected from among a plurality of ground lines VSS and a plurality of power lines VDD may be arranged between each two of the plurality of rows R1, R2, R3, R4, R5, and R6 including the plurality of logic cells LC serially arranged in the width direction (the X direction). The plurality of ground lines VSS and the plurality of power lines VDD may extend in the first horizontal direction (the X direction) and may be alternately arranged apart from one another in the second direction (the Y direction). Accordingly, each of the plurality of ground lines VSS and the plurality of power lines VDD may be arranged to overlap the cell boundary CBD in the second horizontal direction (the Y direction) of the logic cell LC.

Figure 2:
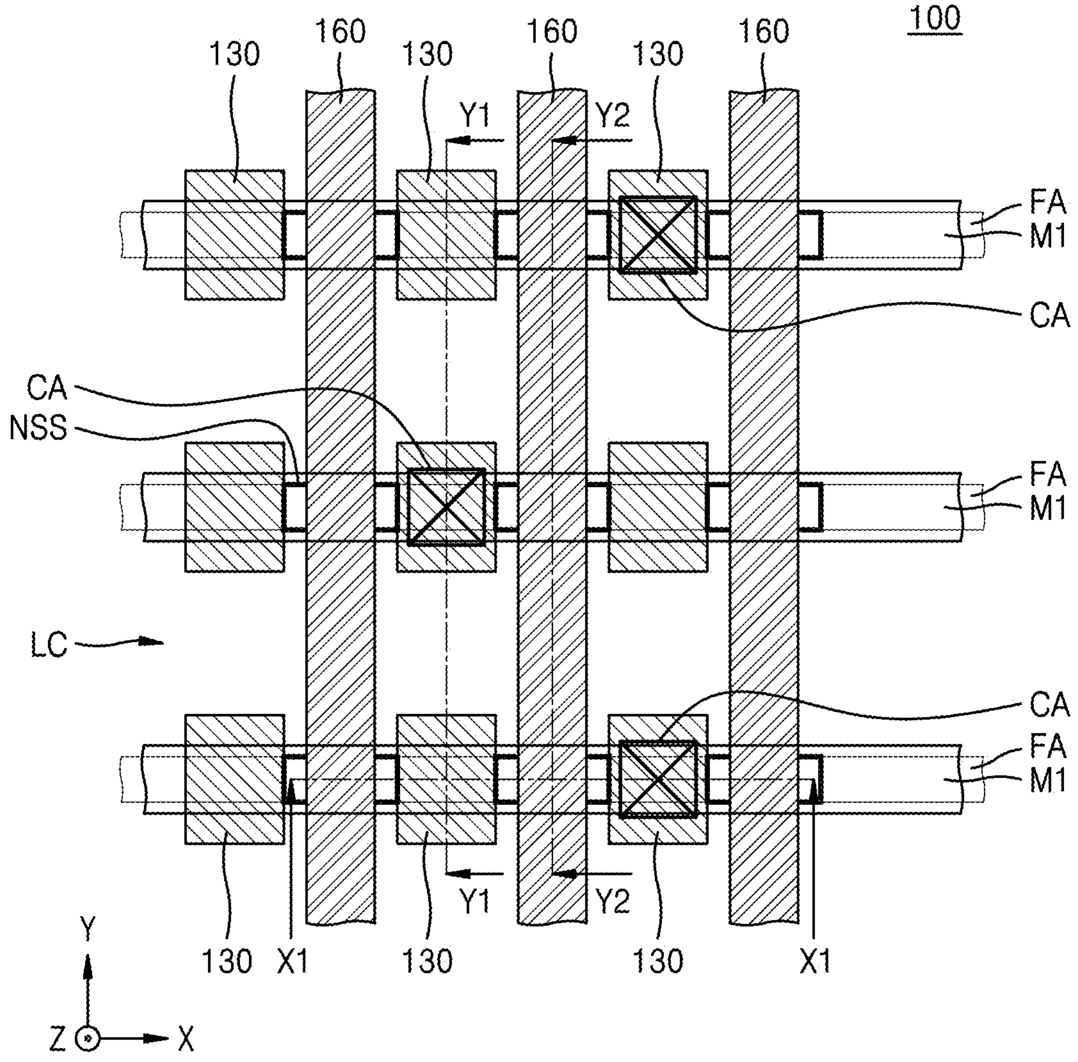
FIG. 2 is a floor layout diagram of an example of an integrated circuit device.
Figure 3:
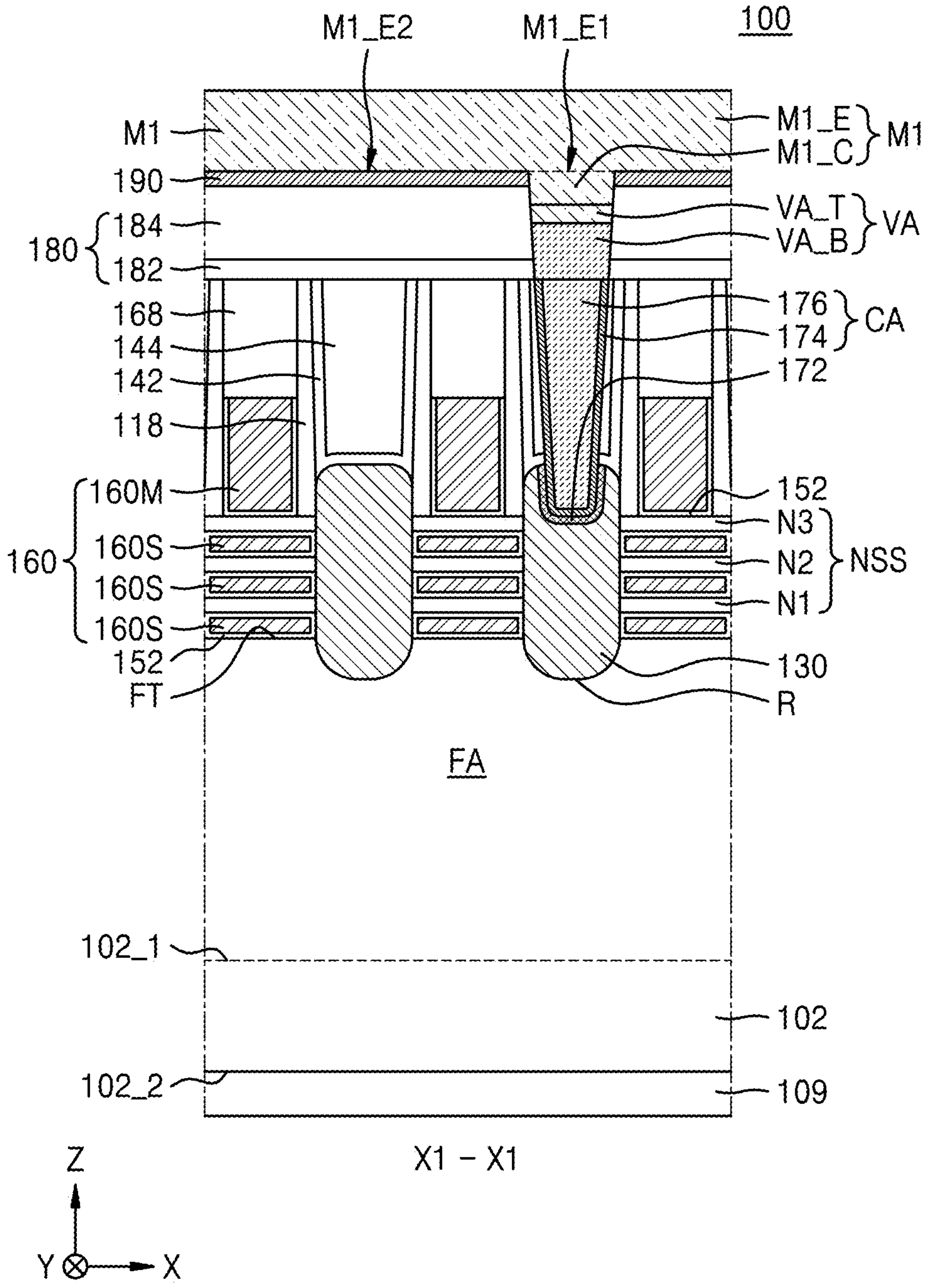
FIGS. 3, 4A, 4B, and 5 are cross-sectional views of an example of an integrated circuit device.
Figure 4A:
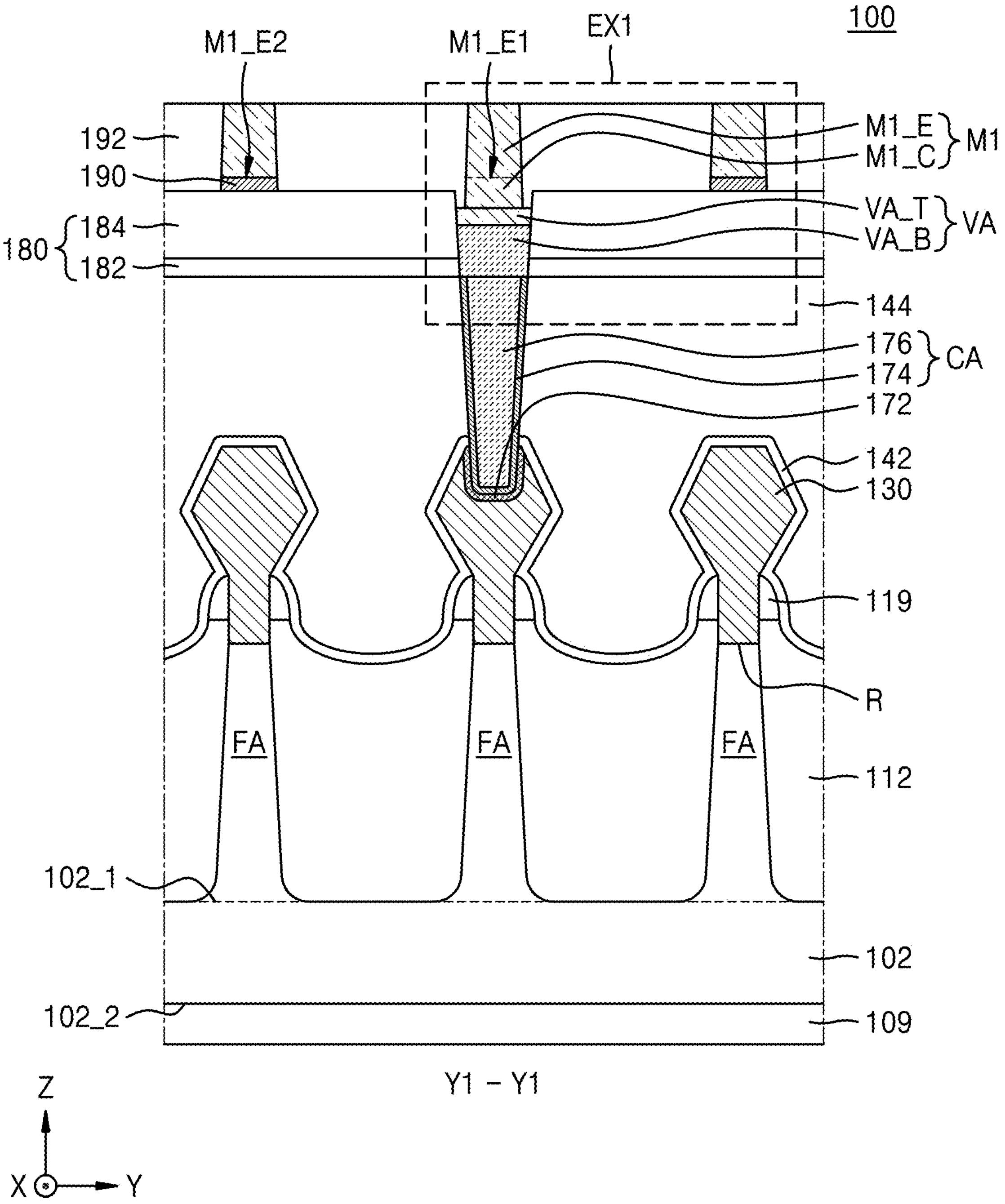
Figure 4B:
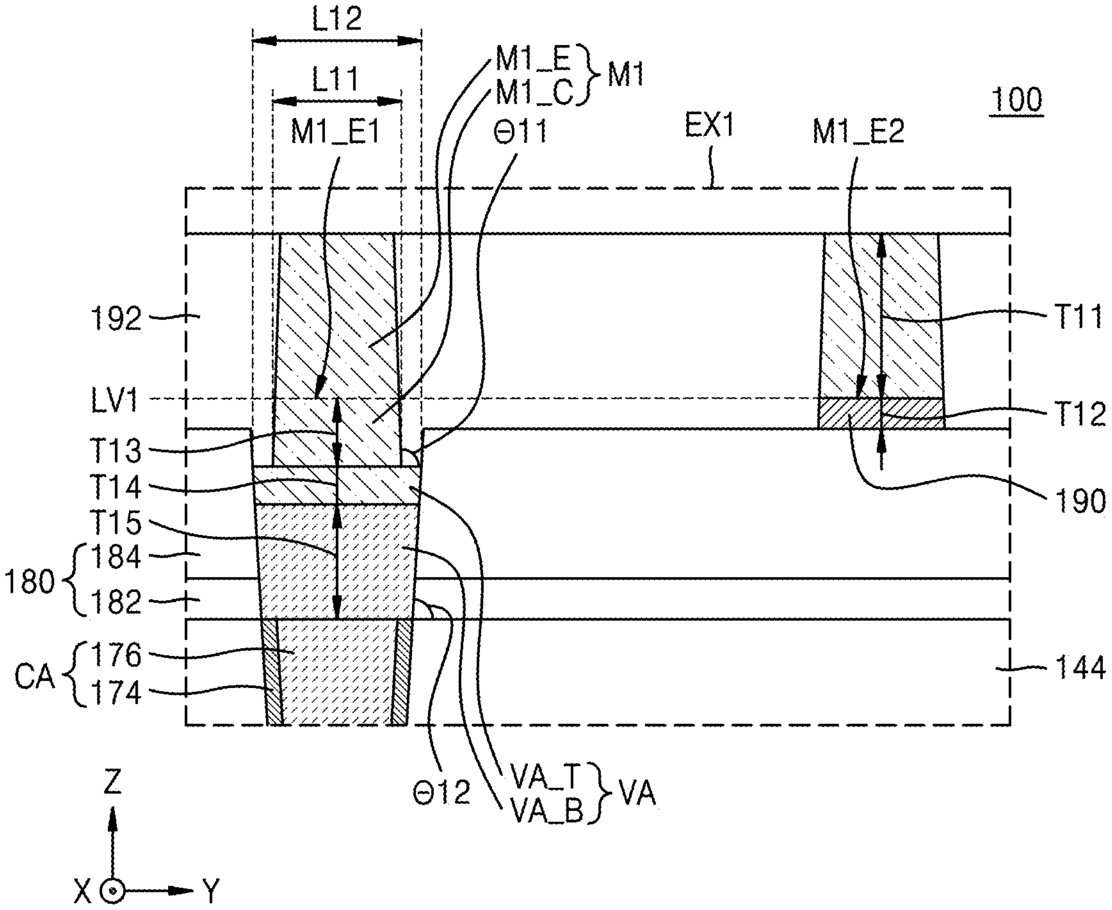
Figure 5:
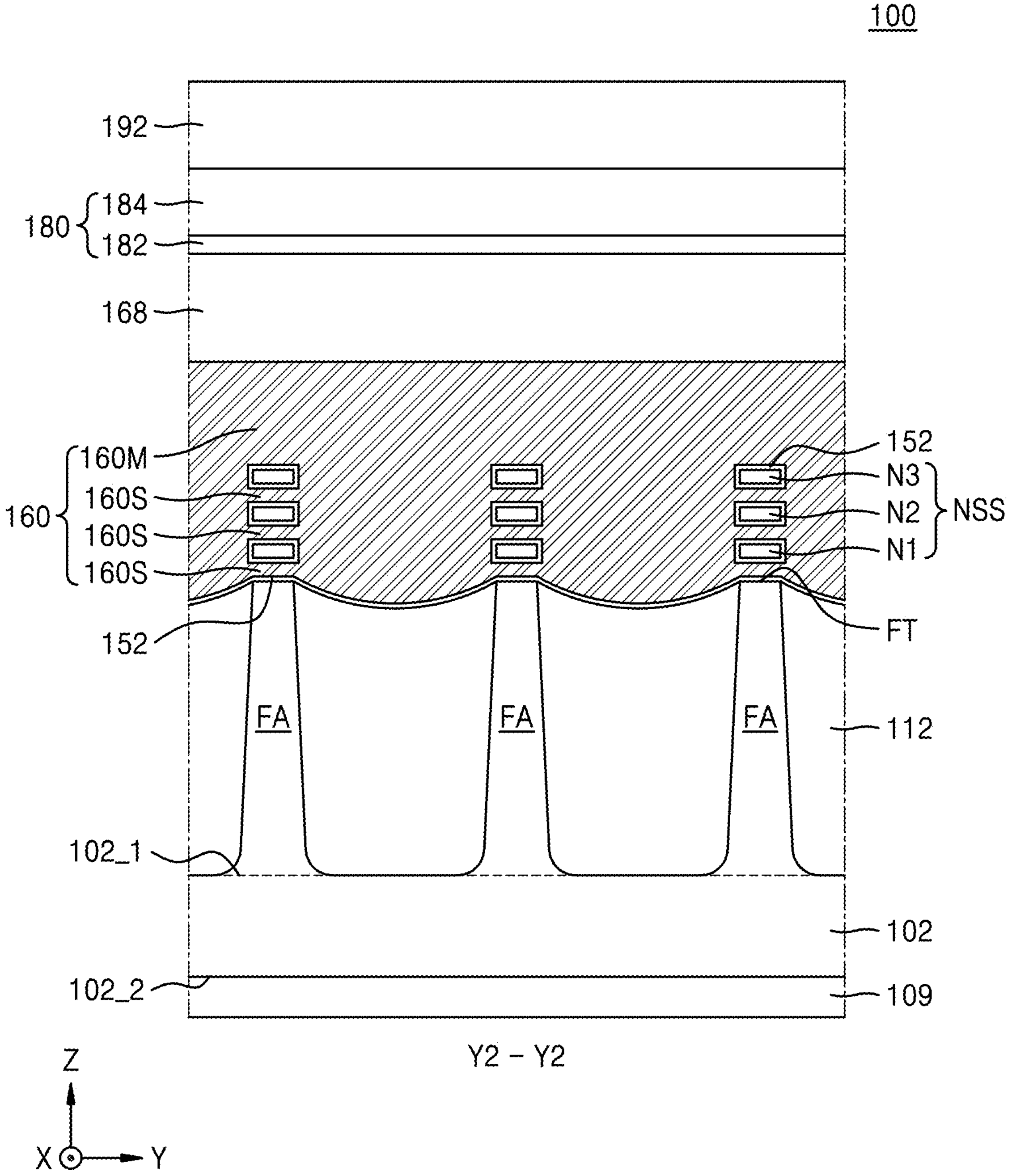

FIG. 2 is a floor layout diagram for describing the integrated circuit device 100. FIGS. 3, 4A, 4B, and 5 are cross-sectional views for describing the integrated circuit device 100. More particularly, FIG. 3 is a cross-sectional view taken along a line X1-X1 shown in FIG. 2. FIG. 4 is a cross-sectional view taken along a line Y1-Y1 shown in FIG. 2. FIG. 4B is an enlarged cross-sectional view of a region EX1 shown in FIG. 4A. FIG. 5 is a cross-sectional view taken along a line Y2-Y2 shown in FIG. 2.

The integrated circuit device 100 including a field-effect transistor having a gate-all-around structure including an active region having the form of a nanowire or nanosheet and a gate surrounding the active region will be described with reference to FIGS. 2, 3, 4A, 4B, and 5. The plurality of logic cells LC may construct some of the plurality of logic cells LC illustrated in FIG. 1.

The integrated circuit device 100 may include a substrate 102, which has a first surface 102_1 and a second surface 102_2, and a plurality of fin-type active regions FA protruding on the first surface 102_1 of the substrate 102. The plurality of fin-type active regions FA may extend along a first horizontal direction (the X direction) and may extend parallel to each other.

The substrate 102 may include a semiconductor such as Si or Ge or a compound semiconductor such as SiGe, SiC, GaAs, InAs, InGaAs, or InP. In the present specification, the terms "SiGe", "SiC", "GaAs", "InAs", "InGaAs", and "InP" indicate material formed of elements included in the terms and do not include chemical formulae indicating stoichiometric relationships. The substrate 102 may include a conductive region, e.g., a well doped with impurities or a structure doped with impurities.

A device isolation film 112 may be arranged in a trench defining the plurality of fin-type active regions FA. The device isolation film 112 may cover a portion of a sidewall of each of the plurality of fin-type active regions FA and may be apart from the substrate 102 in a vertical direction (a Z direction). The device isolation film 112 may be formed of a silicon oxide film. The device isolation film 112 may include a material having an etching selectivity ratio different from an etching selectivity ratio of a material of the substrate 102.

The second surface 102_2 of the substrate 102 may be covered with a backside insulating film 109. The backside insulating film 109 may include a silicon oxide film, a silicon nitride film, a silicon carbide film, a low-dielectric film, or a combination thereof. The low-dielectric film may include fluorine-doped silicon oxide, organosilicate glass, a carbon-doped oxide, porous silicon oxide, porous organo-silicate glass, a spin-on organic polymeric dielectric, a spin-on silicon-based polymeric dielectric, or a combination thereof, but is not limited thereto.

As illustrated in FIGS. 2, 3, and 5, a plurality of gate lines 160 may be on the plurality of fin-type active regions FA. Each of the plurality of gate lines 160 may extend in the second horizontal direction (the Y direction) crossing the first horizontal direction (the X direction). A plurality of nanosheet stacks NSS may be arranged on fin top surfaces FT in the plurality of fin-type active regions FA in regions in which the plurality of fin-type active regions FA cross the plurality of gate lines 160. Each of the plurality of nanosheet stacks NSS may include at least one nanosheet facing fin top surface FT at a position apart from the fin top surface FT of fin-type active region FA in the vertical direction (the Z direction). In the present specification, the term "nanosheet" indicates a conductive structure having a cross-section that is substantially perpendicular to a direction in which a current flows. The nanosheet will be understood as including nanowires.

As illustrated in FIGS. 3 and 5, each of the plurality of nanosheet stacks NSS may include a first nanosheet N1, a second nanosheet N2, and a third nanosheet N3 overlapping one another in the vertical direction (the Z direction) on the fin-type active region FA. The first nanosheet N1, the second nanosheet N2, and the third nanosheet N3 may have different vertical distances (distances in the Z direction) from the fin top surfaces FT of the fin-type active region FA. Each of the plurality of gate lines 160 may cover the first nanosheet N1, the second nanosheet N2, and the third nanosheet N3 overlapping one another in the vertical direction (the Z direction) and included in the nanosheet stack NSS.

Although FIG. 2 illustrates that a shape of a flat surface of the nanosheet stack NSS is approximately square, example is not limited thereto. The nanosheet stack NSS may have various shapes of flat surfaces according to shapes of a flat surface of the fin-type active region FA and the gate line 160. In the present example, the plurality of nanosheet stacks NSS and the plurality of gate lines 160 are on one fin-type active region FA and the plurality of nanosheet stacks NSS are arranged in a row in the first horizontal direction (the X direction) on the one fin-type active region FA. However, the numbers of the nanostack sheets NSS and the gate lines 160 arranged on the one fin-type active region FA are not limited to the illustrated example.

The first nanosheet N1, the second nanosheet N2, and the third nanosheet N3 included in the nanosheet stack NSS may each function as a channel region. In some implementations, each of the first nanosheet N1, the second nanosheet N2, and the third nanosheet N3 may have a thickness selected from a range from about 4 nm to about 6 nm, but the examples are not limited thereto. In the present disclosure, the term "about" means nearly equal to, e.g., within 1%, 5%, or 10% of the disclosed value.

Here, the thickness of each of the first nanosheet N1, the second nanosheet N2, and the third nanosheet N3 indicates a size in the vertical direction (the Z direction). In some implementations, the first nanosheet N1, the second nanosheet N2, and the third nanosheet N3 may have a substantially same vertical thickness (the Z direction). In some implementations, at least some of the first nanosheet N1, the second nanosheet N2, and the third nanosheet N3 may have different vertical thicknesses (the Z direction). In some implementations, the first nanosheet N1, the second nanosheet N2, and the third nanosheet N3 included in the nanosheet stack NSS may each include a Si layer, a SiGe layer, or a combination thereof.

As illustrated in FIG. 3, sizes of the first nanosheet N1, the second nanosheet N2, and the third nanosheet N3 included in one nanosheet stack NSS may be identical or similar to one another in the first horizontal direction (the X direction). In some implementations, unlike in FIG. 3, at least some of the first nanosheet N1, the second nanosheet N2, and the third nanosheet N3 included in one nanostack NSS may have different sizes in the first horizontal direction (the X direction). Although a case in which each of the plurality of nanosheet stacks NSS includes three nanosheets is described with reference to the present example, other implementations are possible. For example, the nanosheet stack NSS may include at least one nanosheet, and the number of nanosheets included in the nanosheet stack NSS is not limited to the present example.

As illustrated in FIGS. 3 and 5, each of the plurality of gate lines 160 may include a main gate portion 160M and a plurality of sub gate portions 160S. The main gate portion 160M may cover a top surface of the nanosheet stack NSS and extend in the second horizontal direction (the Y direction). The plurality of sub gate portions 160S may be integrally connected to the main gate portion 160M and the plurality of sub gate portions 160S may each be disposed between the first nanosheet N1, the second nanosheet N2, and the third nanosheet N3 and between the first nanosheet N1 and the fin-type active region FA. In the vertical direction (the Z direction), a thickness of each of the plurality of sub gate portions 160S may be less than a thickness of the main gate portion 160M.

The plurality of gate lines 160 may each include a metal, a metal nitride, a metal carbide, or a combination thereof. The metal may be selected from among Ti, W, Ru, Nb, Mo, Hf, Ni, Co, Pt, Yb, Tb, Dy, Er, and Pd. The metal nitride may be selected from between TiN and TaN. The metal carbide may include TiAlC. However, a material included in the plurality of gate lines 160 is not limited thereto.

As illustrated in FIGS. 3 and 4A, a plurality of recesses R may be formed on the fin-type active regions FA. A vertical level of a bottom surface of each of the plurality of recesses R may be lower than a vertical level of the fin top surface FT of the fin-type active region FA.

As illustrated in FIGS. 3 and 4A, a plurality of source/drain regions 130 may be arranged in the plurality of recesses R. Each of the plurality of source/drain regions 130 may be arranged at a position adjacent to at least one gate line 160 selected from among the plurality of gate lines 160. The plurality of source/drain regions 130 may have surfaces each facing the first nanosheet N1, the second nanosheet N2, and the third nanosheet N3 included in an adjacent nanosheet stack NSS. Each of the plurality of source/drain regions 130 may contact the first nanosheet N1, the second nanosheet N2, and the third nanosheet N3 included in the adjacent nanosheet stack NSS. In the implementations illustrated herein, the phrase "source/drain region" may be understood to mean a source terminal region and/or a drain terminal region of a transistor.

A gate dielectric film 152 may be arranged between the nanosheet stack NSS and the gate line 160. In some implementations, the gate dielectric film 152 may include a stack structure including an interface dielectric film and a high-dielectric film. The interface dielectric film may include a low-dielectric material having a permittivity of about 9 or less, e.g., a silicon oxide film, a silicon oxynitride film, or a combination thereof. In some implementations, the interface dielectric film may be omitted. The high-dielectric film may include a material having a dielectric constant greater than a dielectric constant of the silicon oxide film. For example, the high-dielectric film may have a dielectric constant between about 10 and about 25. The high-dielectric film may include hafnium oxide but is not limited thereto.

As illustrated in FIGS. 3 and 5, top surfaces of the gate dielectric film 152 and the gate line 160 may be covered with a capping insulating pattern 168. The capping insulating pattern 168 may include a silicon nitride film.

Two sidewalls of each of the gate line 160 and the capping insulating pattern 168 may be covered by an outer insulating spacer 118. The outer insulating spacer 118 may cover two sidewalls of the main gate portion 160M on each of top surfaces of the plurality of nanosheet stacks NSS. The outer insulating spacer 118 may be apart from the gate line 160 with the gate dielectric film 152 therebetween.

As illustrated in FIG. 4A, a plurality of recess-side insulating spacers 119 covering side walls of the source/drain regions 130 may be arranged on a top surface of the device isolation film 112. In some implementations, each of the plurality of recess-side insulating spacers 119 may be integrally connected to the outer insulating spacer 118 adjacent to the recess-side insulating spacer 119.

The plurality of outer insulating spacers 118 and the plurality of recess-side insulating spacers 119 may each include silicon nitride, silicon oxide, SiCN, SiBN, SiON, SiOCN, SiBCN, SiOC, or combinations thereof. In the present specification, the terms "SiCN", "SiBN", "SiON", "SiOCN", "SiBCN", and "SiOC" indicate materials including elements included in the terms and do not include chemical formulae indicating stoichiometric relationships.

A metal silicide film 172 may be formed on a top surface of each of the source/drain regions 130. The metal silicide film 172 may include a metal including Ti, W, Ru, Nb, Mo, Hf, Ni, Co, Pt, Yb, Tb, Dy, Er, or Pd. For example, the metal silicide film 172 may include titanium silicide but is not limited thereto.

On the substrate 102, the plurality of source/drain regions 130, the plurality of metal silicide films 172, and the plurality of outer insulating spacers 118 may be covered with an insulating liner 142. In some implementations, the insulating liner 142 may be omitted. An inter-gate insulating film 144 may be arranged on the insulating liner 142. When the insulating liner 142 is omitted, the inter-gate insulating film 144 may contact the plurality of source/drain regions 130.

The insulating liners 142 and the inter-gate insulating films 144 may be sequentially arranged on the plurality of source/drain regions 130 and the plurality of metal silicide films 172. The insulating liner 142 and the inter-gate insulating film 144 may together form an insulating structure. In some implementations, the insulating liner 142 may include silicon nitride, SiCN, SiBN, SiON, SiOCN, SiBCN, or combinations thereof, but is not limited thereto. The inter-gate insulating film 144 may include a silicon oxide film, but is not limited thereto.

Two sidewalls of each of the plurality of sub gate portions 160S included in the plurality of gate lines 160 may be apart from the source/drain region 130 with the gate dielectric film 152 therebetween. The gate dielectric film 152 may be arranged between the sub-gate portion 160S included in the gate line 160 and each of the first nanosheet N1, the second nanosheet N2, and the third nanosheet N3 and between the sub gate portion 160S included in the gate line 160 and the source/drain region 130.

The plurality of nanosheet stacks NSS may be arranged on the fin top surfaces FT of the plurality of fin active areas FA in regions in which the plurality of fin-type active regions FA cross the plurality of gate lines 160 and may face the fin top surfaces FT at positions apart from the fin-type active regions FA. A plurality of nanosheet transistors may be formed in the regions of the substrate 102 in which the plurality of fin-type active regions FA cross the plurality of gate lines 160.

As illustrated in FIGS. 3 and 4A, an active contact CA may be arranged on the source/drain region 130. The active contact CA may penetrate each of the inter-gate insulating film 144 and the insulating liner 142 in the vertical direction (the Z direction) and contact the metal silicide film 172. The active contact CA may be electrically connectable to the source/drain region 130 through the metal silicide film 172.

The active contact CA may include a conductive barrier pattern 174 and a contact plug 176 sequentially stacked on the source/drain region 130. The conductive barrier pattern 174 may cover and contact a bottom surface and sidewalls of the contact plug 176. The active contact CA may penetrate the inter-gate insulating film 144 and the insulating liner 142 and extend in the vertical direction (e.g., the Z direction). The conductive barrier pattern 174 may be arranged between the metal silicide film 172 and the contact plug 176. The conductive barrier pattern 174 may have a surface contacting the metal silicide film 172 and a surface contacting the contact plug 176. In some implementations, the conductive barrier pattern 174 may include a metal or a metal nitride. For example, the conductive barrier pattern 174 may include Ti, Ta, W, TiN, TaN, WN, WCN, TiSiN, TaSiN, WSiN, or combinations thereof, but is not limited thereto. The contact plug 176 may include molybdenum (Mo), copper (Cu), tungsten (W), cobalt (Co), ruthenium (Ru), Manganese (Mn), titanium (Ti), tantalum (Ta), aluminum (Al), combinations thereof, or alloys thereof, but is not limited thereto. The active contact CA will be described in detail below with reference to FIG. 4B.

As illustrated in FIGS. 3, 4A, and 5, a top surface of each of the active contact CA, the capping insulating pattern 168, and the inter-gate insulating film 144 may be covered with a top insulating structure 180. The top insulating structure 180 may include an etch stop layer 182 and an interlayer insulating film 184 sequentially stacked on each of the active contact CA, a plurality of the capping insulating patterns 168, and the inter-gate insulating film 144. The etch stop layer 182 may include silicon carbide (SiC), silicon nitride (SiN), nitrogen-doped silicon carbide (SiC:N), SiOC, AlN, AlON, AlO, AlOC, or combinations thereof. The interlayer insulating film 184 may include an oxide film, a nitride film, an ultra low-k (ULK) film having an ultra-low dielectric constant K of about 2.2 to about 2.4, or a combination thereof. For example, the interlayer insulating film 184 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto.

As illustrated in FIGS. 3 and 4A, via contacts VA may be arranged on the active contacts CA. Each of the via contacts VA may penetrate the top insulating structure 180 and contact the active contact CA. The source/drain region 130 may be electrically connected to the via contact VA through the metal silicide film 172 and the active contact CA. A bottom surface of each of the via contacts VA may contact a top surface of the active contact CA. The via contact VA may include W, Mo, and/or Ru, but is not limited thereto. The via contact VA will be described in detail below with reference to FIG. 4B.

A plurality of wiring lines M1 may be arranged to penetrate a top insulating film 192. Each of the plurality of wiring lines M1 may be connected to a via contact VA selected from among the plurality of via contacts VA under the plurality of wiring lines M1. In some implementations, the wiring line M1 may extend in the first horizontal direction (the X direction). In some implementations, the wiring line M1 may include an extending part M1_E extending in the first horizontal direction (the X direction) and a connecting part M1_C arranged between the extending part M1_E and the via contact VA. In some implementations, the connecting part M1_C may be arranged on a first portion M1_E1 of the extending part M1_E.

The plurality of wiring lines M1 may include Mo, Cu, W, Co, Ru, Mn, Ti, Ta, Al, a combination thereof, or an alloy thereof, but is not limited thereto. The wiring line M1 will be described in detail below with reference to FIG. 4B.

As illustrated in FIGS. 3 and 4A, an adhesive layer 190 may be arranged on a region of the wiring line M1. The adhesive layer 190 may include titanium nitride (TiN). More particularly, the adhesive layer 190 may be arranged between the wiring line M1 and the top insulating structure 180. More particularly, the adhesive layer 190 may be arranged between the wiring line M1 and the interlayer insulating film 184. The adhesive layer 190 may contact the wiring line M1 and the interlayer insulating film 184 between the wiring line M1 and the interlayer insulating film 184. The adhesive layer 190 may overlap the wiring line M1 and the interlayer insulating film 184 in the vertical direction (the Z direction). In some implementations, the wiring line M1 may overlap the top insulating structure 180 with the adhesive layer 190 therebetween. More particularly, the wiring line M1 may be apart from the interlayer insulating film 184 with the adhesive layer 190 therebetween.

More particularly, the adhesive layer 190 may be arranged on a second portion M1_E2 of the extending part M1_E. The second portion M1_E2 may include a portion except the first portion M1_E1 of a surface of the extending part M1_E facing the top insulating structure 180. That is, in some implementations, the adhesive layer 190 is not arranged on the first portion M1_E1 of the extending part M1_E.

In some implementations, the adhesive layer 190 is arranged between the extending part M1_E of the wiring line M1 and the top insulating structure 180 but not between the connecting part M1_C of the wiring line M1 and the top insulating structure 180. More particularly, the adhesive layer 190 may be arranged between the extending part M1_E of the wiring line M1 and the interlayer insulating film 184 and may be arranged not between the extending part M1_E and the connecting part M1_C of the wiring line M1 and between the connecting part M1_C and the interlayer insulating film 184. More particularly, the adhesive layer 190 may be arranged not between the connecting part M1_C of the wiring line M1 and the via contact VA.

In some implementations, between the extending part M1_E of the wiring line M1 and the interlayer insulating film 184, the adhesive layer 190 may horizontally surround the connecting part M1_C of the wiring line M1.

In conjunction with FIG. 4B, the wiring line M1 may be connected to the active contact CA through the via contact VA.

As described above, the wiring line M1 may include the extending part M1_E extending in the first horizontal direction (the X direction) and the connecting part M1_C arranged on the first portion M1_E1 of the extending part M1_E.

In some implementations, the extending part M1_E and the connecting part M1_C may include a same kind of metal. For example, the extending part M1_E and the connecting part M1_C may both include Ru. More particularly, the extending part M1_E and the connecting part M1_C may be formed of a same kind of metal. For example, the extending part M1_E and the connecting part M1_C both may be formed of Ru.

In some implementations, a top surface of the connecting part M1_C may be at a vertical level higher than a top surface of the interlayer insulating film 184. More particularly, the top surface of the connecting part M1_C may be at a same vertical level as a top surface of the adhesive layer 190. For example, the top surface of the connecting part M1_C and the top surface of the adhesive layer 190 both may be at a first vertical level LV1.

In some implementations, a vertical thickness T11 of the extending part M1_E may be greater than a vertical thickness T12 of the adhesive layer 190.

In some implementations, the adhesive layer 190 may be arranged on the second portion M1_E2, i.e., a portion of the extending part M1_E in which the connecting part M1_C is not arranged, and accordingly, the extending part M1_E and the connecting part M1_C may directly contact each other. In other words, a top surface of the extending part M1_E may directly contact a bottom surface of the connecting part M1_C.

In some implementations, an angle θ11 formed by an outer sidewall of the wiring line M1 and a top surface of the via contact VA may be 90° or more. In the present specification, the outer sidewall of the wiring line M1 may indicate a sidewall directly contacting the top insulating film 192 surrounding the wiring line M1. For example, the angle θ11 formed by the outer sidewall of the wiring line M1 and the top surface of the via contact VA may be 90° or more but not more than 110°.

In some implementations, the adhesive layer 190 is not arranged on a contact portion of the wiring line M1 with the via contact VA. More particularly, in some implementations, the adhesive layer 190 is not formed on the connecting part M1_C. More particularly, in some implementations, the adhesive layer 190 is not formed between the connecting part M1_C and the via contact VA. Accordingly, the connecting part M1_C and the via contact VA may directly contact each other. More particularly, the bottom surface of the connecting part M1_C and the top surface of the via contact VA may directly contact each other. In some implementations, the wiring line M1 and a top via contact VA_T may be integrally formed and contact each other.

In some implementations, the via contact VA may include the top via contact VA_T and a bottom via contact VA_B. In some implementations, the top via contact VA_T may be arranged between the wiring line M1 and the bottom via contact VA_B. The top via contact VA_T may directly contact the wiring line M1. More particularly, the top via contact VA_T may directly contact the connecting part M1_C of the wiring line M1. For example, the top surface of the top via contact VA_T may directly contact the bottom surface of the connecting part M1_C. In some implementations, the bottom via contact VA_B may be arranged between the top via contact VA_T and the active contact CA. The bottom via contact VA_B may directly contact the active contact CA. For example, a bottom surface of the bottom via contact VA_B may directly contact the top surface of the active contact CA.

In some implementations, the top surface of the via contact VA may be at a vertical level lower than the top surface of the interlayer insulating film 184. That is, the top surface of the top via contact VA_T may be at a vertical level lower than the top surface of the interlayer insulating film 184. The top surface of the top via contact VA_T may be at a vertical level lower than a bottom surface of the adhesive layer 190. That is, the bottom surface of the connecting part M1_C may be at a vertical level lower than the bottom surface of the adhesive layer 190. Therefore, a vertical thickness T13 of the connecting part M1_C may be greater than the vertical thickness T12 of the adhesive layer 190.

In some implementations, the top via contact VA_T and the bottom via contact VA_B may respectively include different kinds of metal. For example, while the top via contact VA_T may include Ru, the bottom via contact VA_B may include Mo. More particularly, the top via contact VA_T and the bottom via contact VA_B may be respectively formed of different kinds of metals. For example, while the top via contact VA_T may be formed of Ru, the bottom via contact VA_B may be formed of Mo.

In some implementations, the top via contact VA_T may include a same kind of metal as a metal included in the wiring line M1. For example, both the top via contact VA_T and the wiring line M1 may include Ru. More particularly, the top via contact VA_T and the wiring line M1 may be formed of a same kind of metal. For example, both the top via contact VA_T and the wiring line M1 may be formed of Ru. In some implementations, the bottom via contact VA_B may include a metal different from a metal included in the wiring line M1. More particularly, the bottom via contact VA_B may be formed of a metal different from a metal included in the wiring line M1.

In some implementations, a vertical thickness T14 of the top via contact VA_T may be less than a vertical thickness T15 of the bottom via contact VA_B.

In some implementations, an angle θ12 formed by the outer sidewall of the via contact VA and a top surface of the inter-gate insulating film 144 surrounding the active contact CA may be 90° or less. In the present specification, the outer sidewall of the via contact VA may indicate a sidewall directly contacting the top insulating structure 180 surrounding the via contact VA. For example, the angle θ12 formed by the outer sidewall of the via contact VA and the top surface of the inter-gate insulating film 144 may be 70° or more but not more than 90°.

In some implementations, the bottom via contact VA_B and the active contact CA may include a same kind of metal. More particularly, the bottom via contact VA_B and the contact plug 176 may include a same kind of metal. For example, the bottom via contact VA_B and the contact plug 176 may include Mo. More particularly, the bottom via contact VA_B and the contact plug 176 may be formed of a same kind of metal. For example, the bottom via contact VA_B and the contact plug 176 may be formed of Mo. In some implementations, the top via contact VA_T and the active contact CA may include different kinds of metal. More particularly, the top via contact VA_T and the active contact CA may be formed of different kinds of metal.

In some implementations, a width of the wiring line M1 in the second horizontal direction may be less than a width of the via contact VA in the second horizontal direction. More particularly, an average width of the wiring line M1 in the second horizontal direction may be less than an average width of the via contact VA in the second horizontal direction. More particularly, at a contact portion between the wiring line M1 and the via contact VA, the width of the wiring line M1 in the second horizontal direction may be less than a width of the via contact VA in the second horizontal direction. For example, a width L11 in the second horizontal direction at a lowest vertical level of the wiring line M1 may be less than a width L12 in the second horizontal direction at a highest vertical level of the via contact VA. For example, the width L11 on the bottom surface of the connecting part M1_C of the wiring line M1 in the second horizontal direction may be less than the width L12 on a top surface of the top via contact VA_T in the second horizontal direction.

In some implementations, the wiring line M1 and the outer sidewall of the via contact VA may have step differences. More particularly, the wiring line M1 and the external sidewall of the via contact VA contacting each other may have a step difference at a boundary between the wiring line M1 and the via contact VA.

In the integrated circuit device 100 described with reference to FIGS. 2 to 5, the adhesive layer 190 is not provided at the contact portion with the via contact in a wiring line M1. In some implementations, the integrated circuit device 100 and the wiring line M1 have a reduced resistance due to removal of the adhesive layer 190 at the contact portion with the via contact VA compared to wiring lines with an adhesive layer at a contact portion with a via contact.

In the integrated circuit device 100 described above with reference to FIGS. 2 to 5, the top via contact VA_T and the bottom via contact VA_B respectively include different kinds of metal. More particularly, in some implementations, a via contact VA has reduced resistance and improved controllability, where the via contact VA includes the top via contact VA_T including Ru, and the top via contact VA_B includes a metal different from Ru.

FIGS. 6 to 10 are cross-sectional views for describing examples of integrated circuit devices 100A, 100B, 101, 101A, and 101B.

Referring to FIGS. 6 to 10, differences from the integrated circuit device 100 described with reference to FIGS. 2 to 5 will be mainly described.

Figure 6:
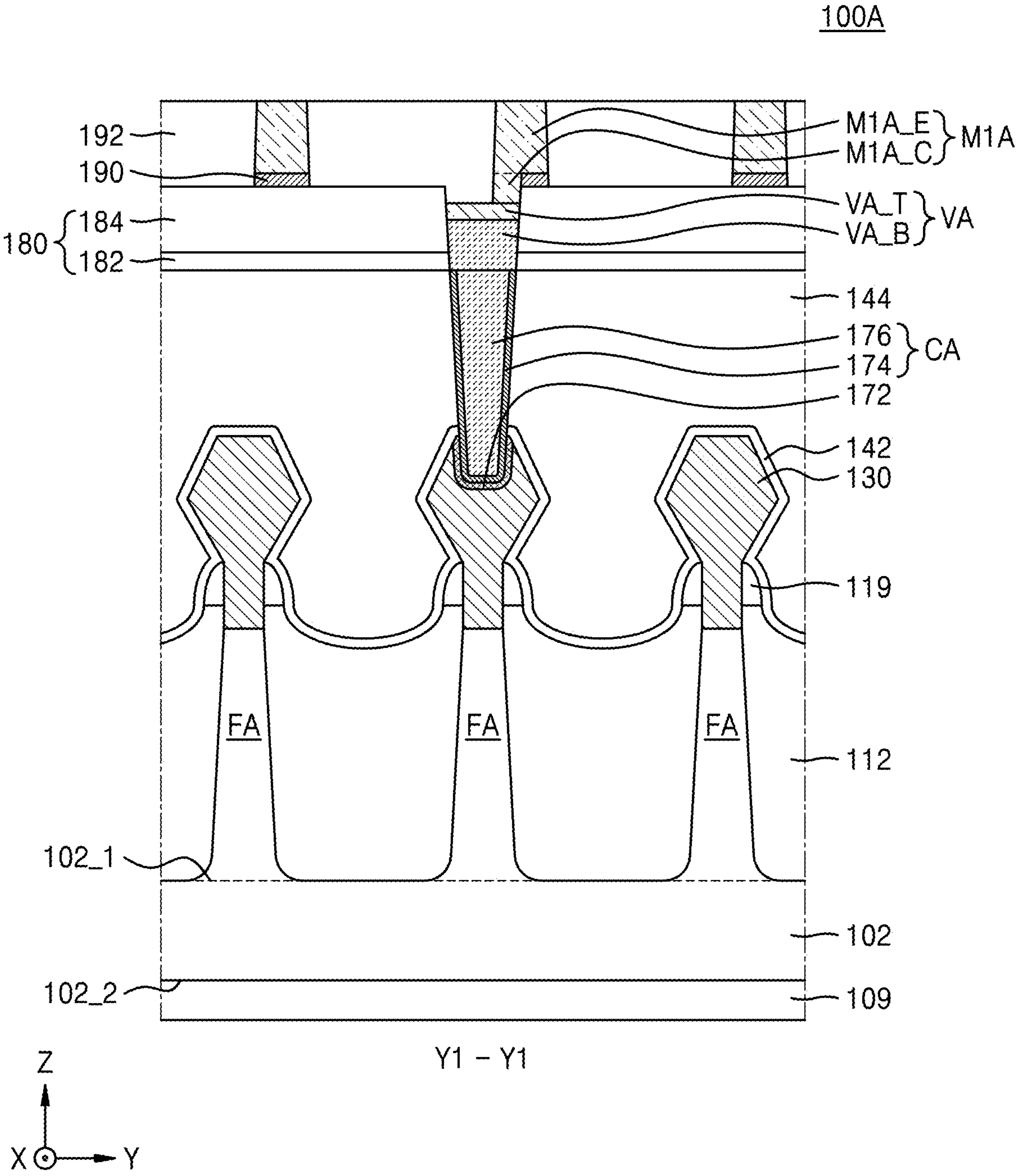
FIGS. 6 to 10 are cross-sectional views of an example of an integrated circuit.

Referring to FIG. 6, the integrated circuit device 100A may include a wiring line M1A and the via contact VA, and the wiring line M1A may be misaligned with the via contact VA. More particularly, only a portion of the wiring line M1A may overlap, in the vertical direction (the Z direction), the via contact VA contacting the wiring line M1A, and another portion of the wiring line M1A may not overlap the via contact VA.

More particularly, the wiring line M1A may extend in the first horizontal direction (the X direction), and may include an extending part M1A_E extending in the first horizontal direction (the X direction) and a connecting part M1A_C arranged between the extending part M1A_E and the via contact VA. The connecting part M1A_C may be arranged on a portion of the extending part M1A_E, which overlaps in the vertical direction (the Z direction) the via contact VA contacting the wiring line M1A, and the adhesive layer 190 may be arranged on another portion of the extending part M1A_E.

Figure 7:
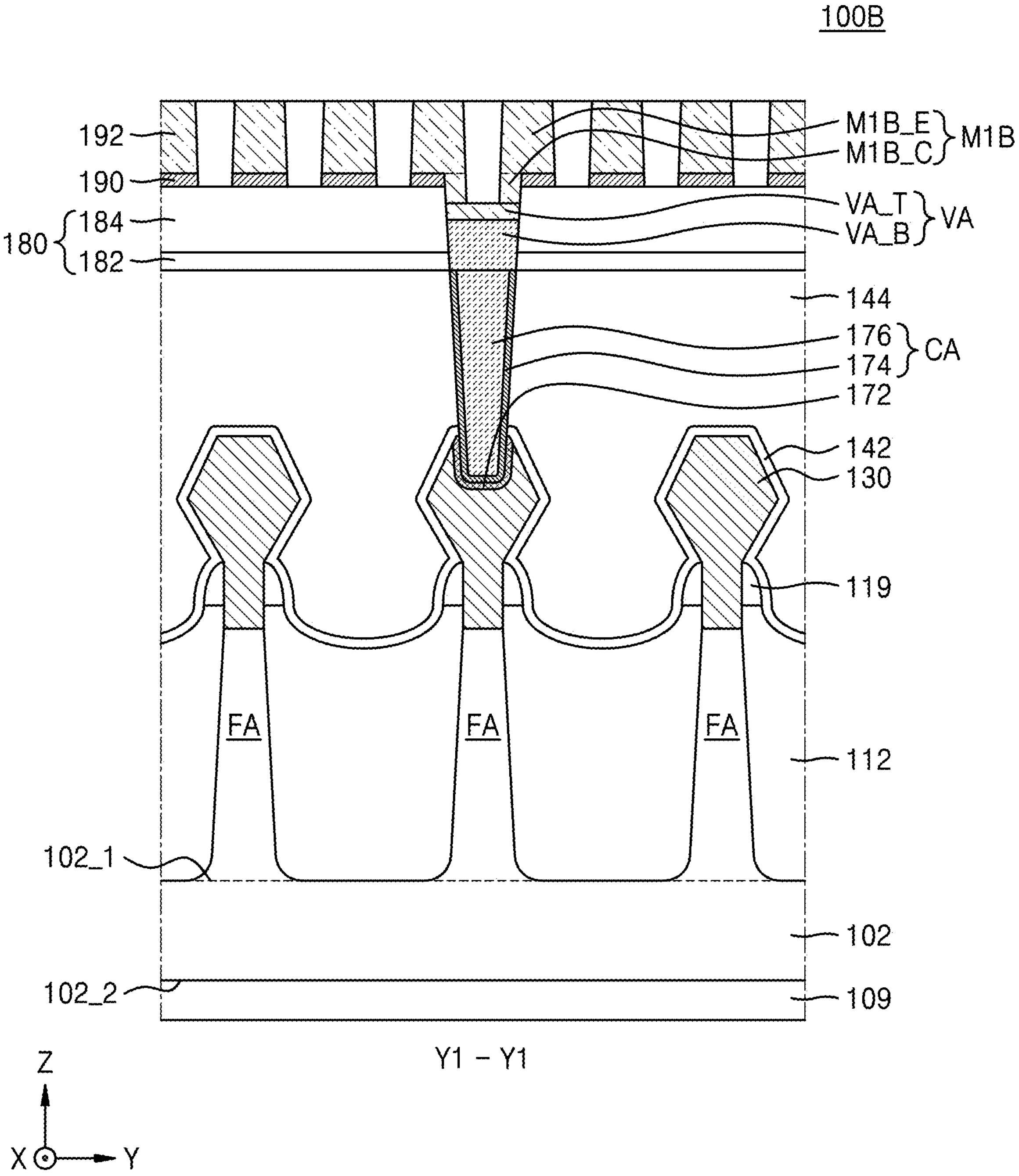

Referring to FIG. 7, the integrated circuit device 100B may include a wiring line M1B and a via contact VA, and the wiring line M1B may be misaligned with the via contact VA. More particularly, only a portion of the wiring line M1B may overlap the via contact VA contacting the wiring line M1B, in the vertical direction (the Z direction), and another portion of the wiring line M1B may not overlap the via contact VA.

More particularly, one via contact VA may be connected to at least one wiring line M1B. For example, one via contact VA may be connected to two wiring lines M1B. More particularly, one via contact VA may be connected to a connecting part M1B_C of each of the two wiring lines M1B.

Figure 8:
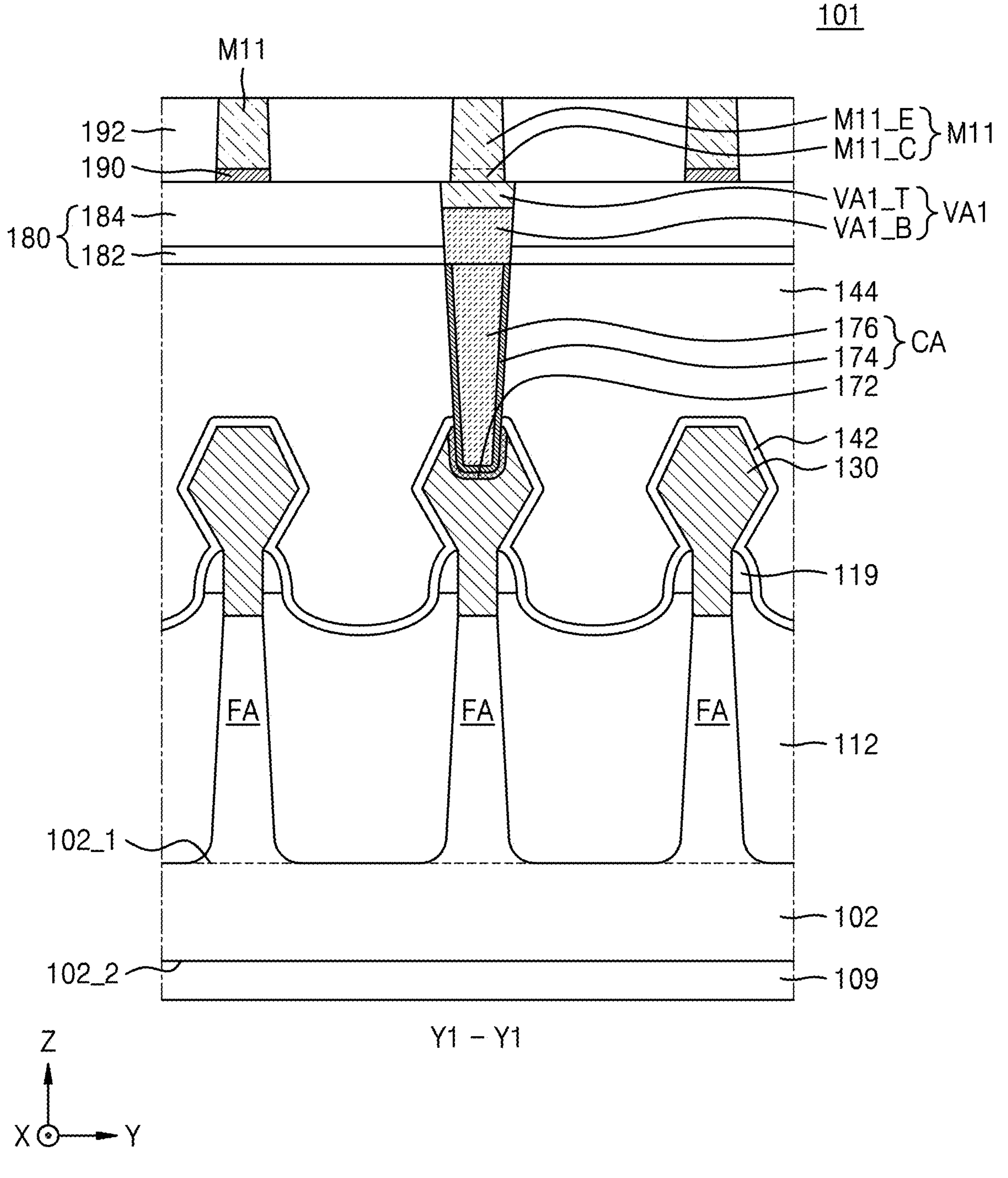
Figure 9:
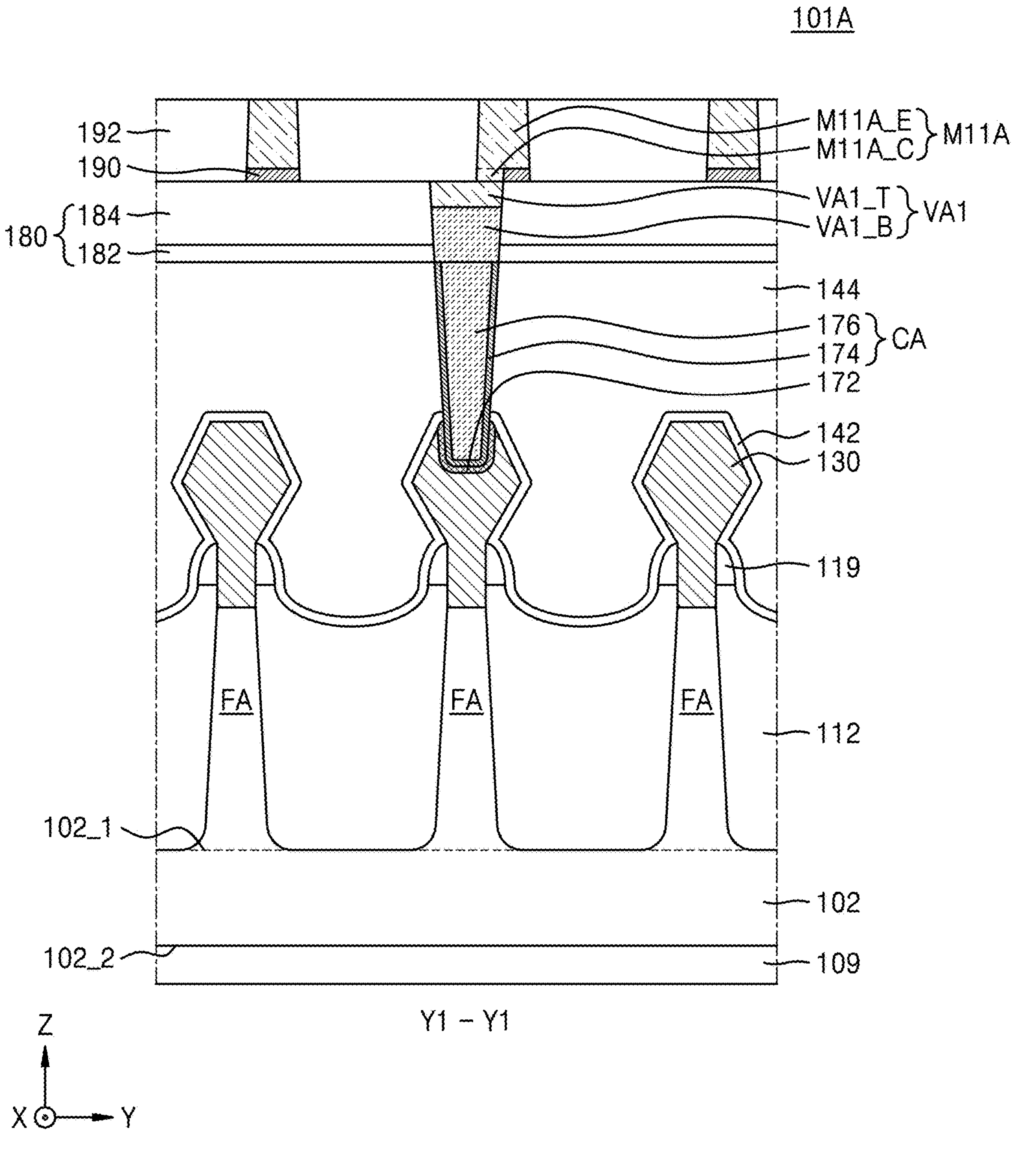
Figure 10:
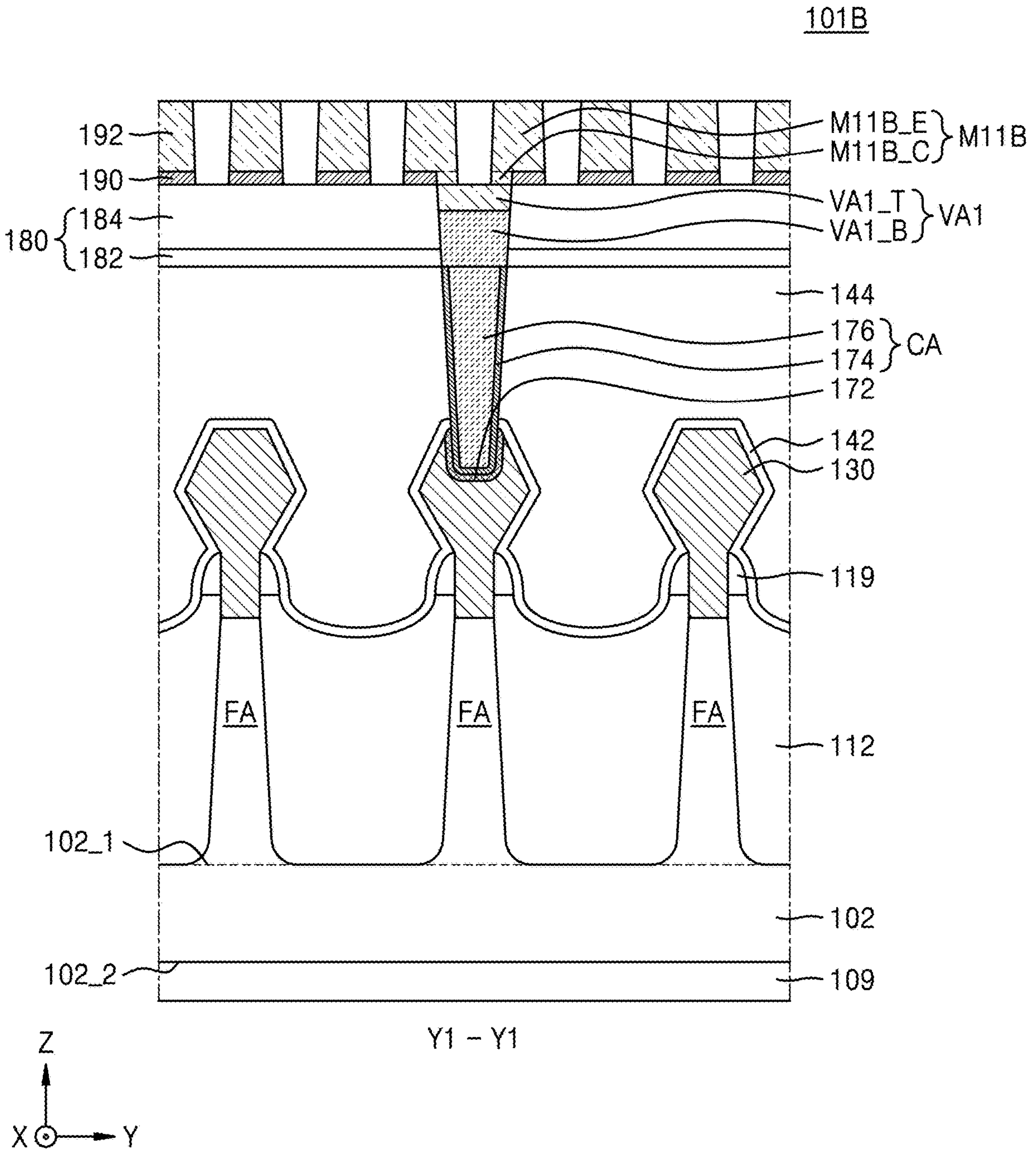

Referring to FIGS. 8 to 10, the integrated circuit device 101, 101A, and 101B may include wiring lines M11, 11A, and M11B and a via contact VA1. A top surface of the via contact VA1 may be at a same vertical level as the top surface of the interlayer insulating film 184. That is, a top surface of a top via contact VA1_T may be at a same vertical level as the top surface of the interlayer insulating film 184. That is, the top surface of the top via contact VA1_T may be at a same vertical level as the bottom surface of the adhesive layer 190. That is, bottom surfaces of connecting parts M11_C, M11A_C, and M11B_C may be at a same vertical level as the bottom surface of the adhesive layer 190. Therefore, a vertical thickness of the connecting part M11_C, M11A_C, and M11B_C may be identical to the vertical thickness of the adhesive layer 190.

Figure 11:
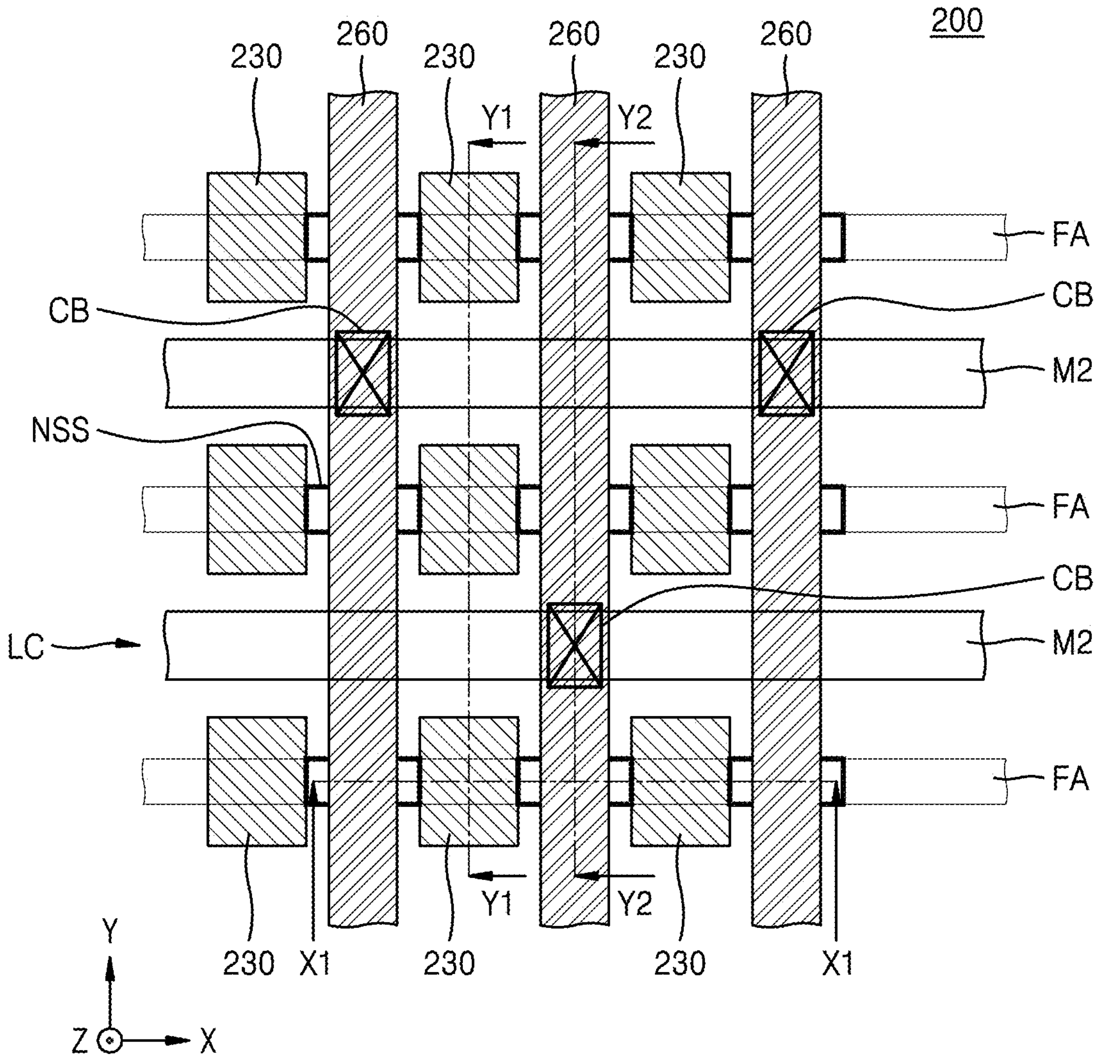
FIG. 11 is a floor layout diagram of an example of an integrated circuit device.
Figure 12:
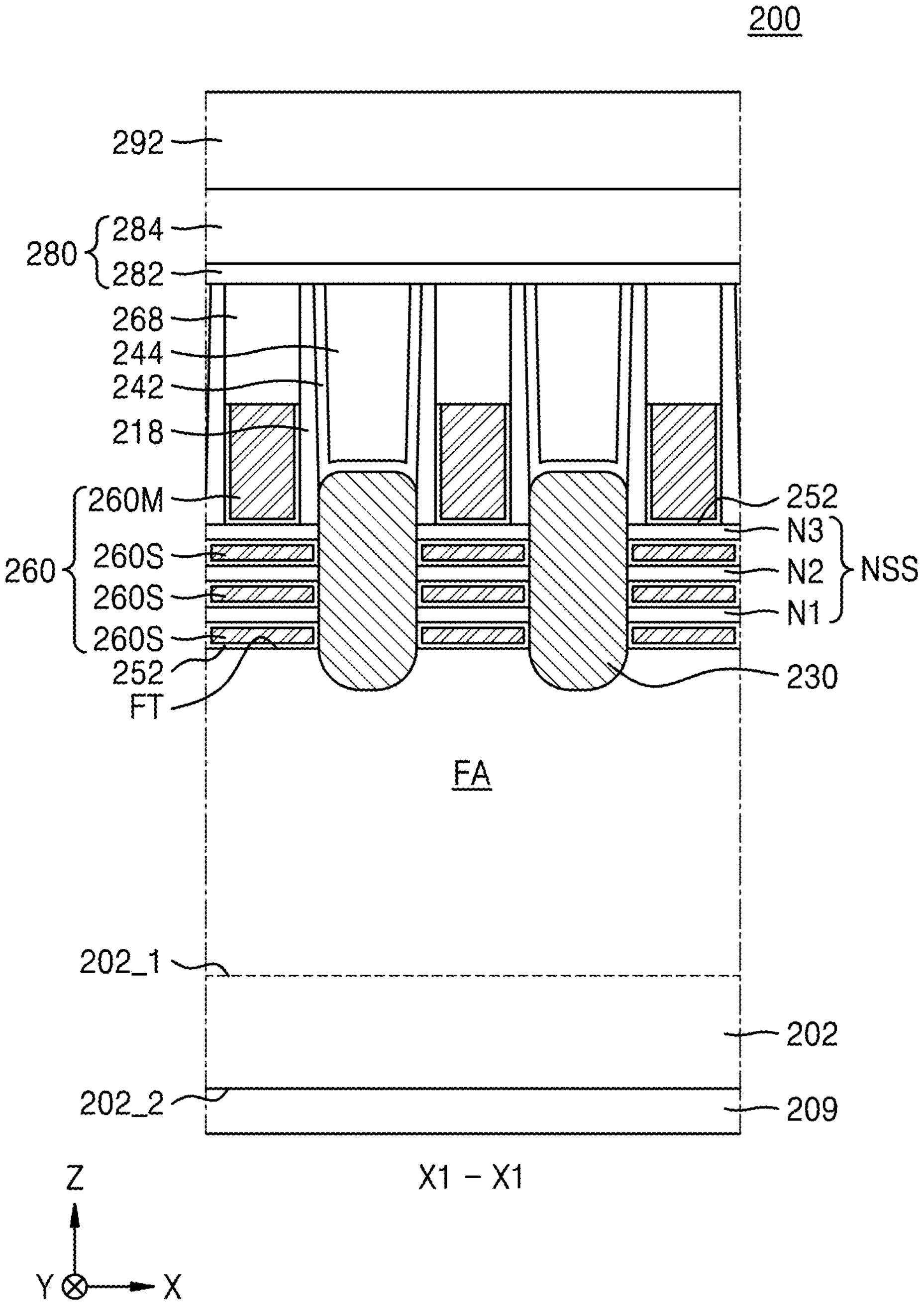
FIGS. 12, 13, 14A, and 14B are cross-sectional views of an example of an integrated circuit device.
Figure 13:
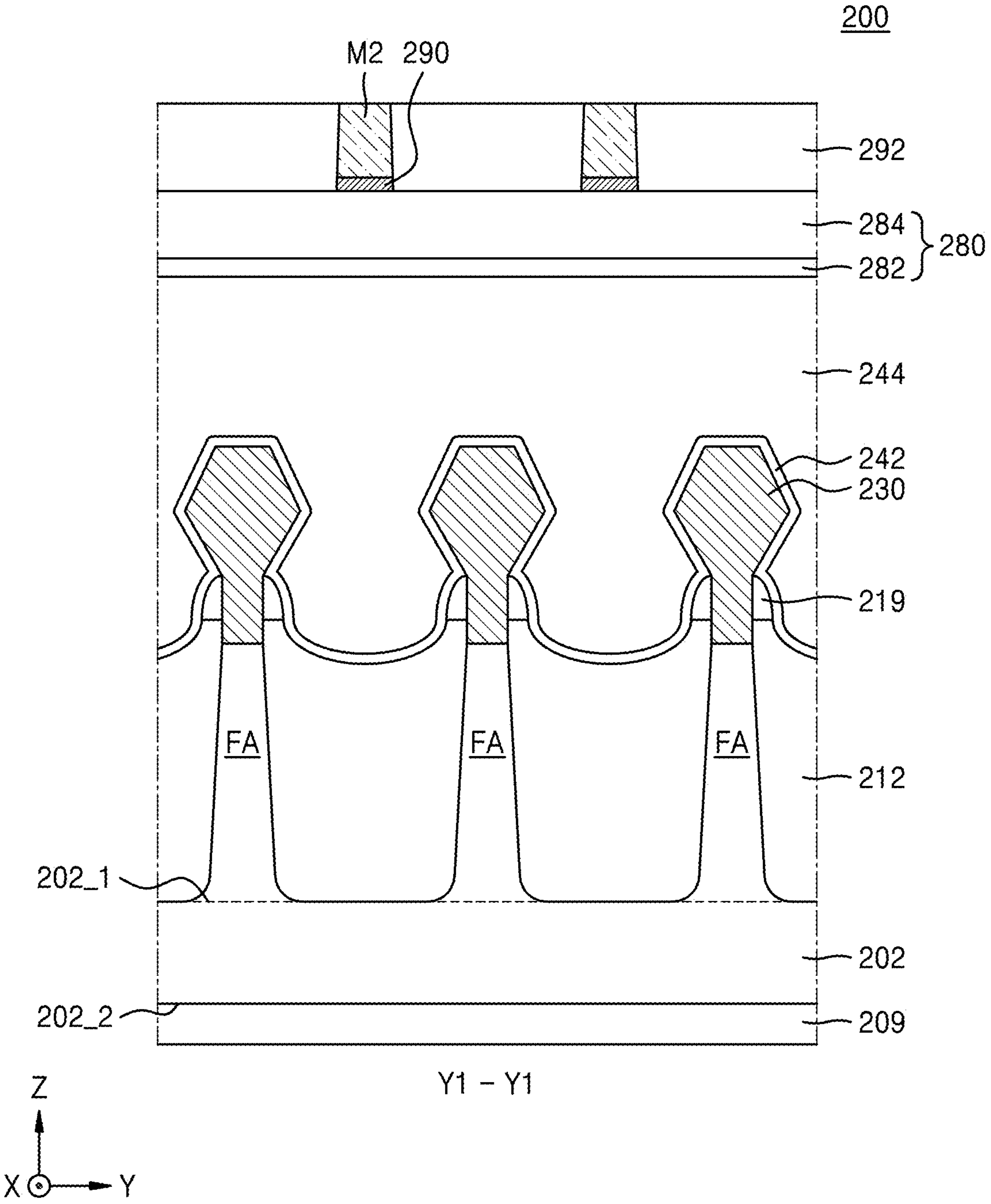
Figure 14A:
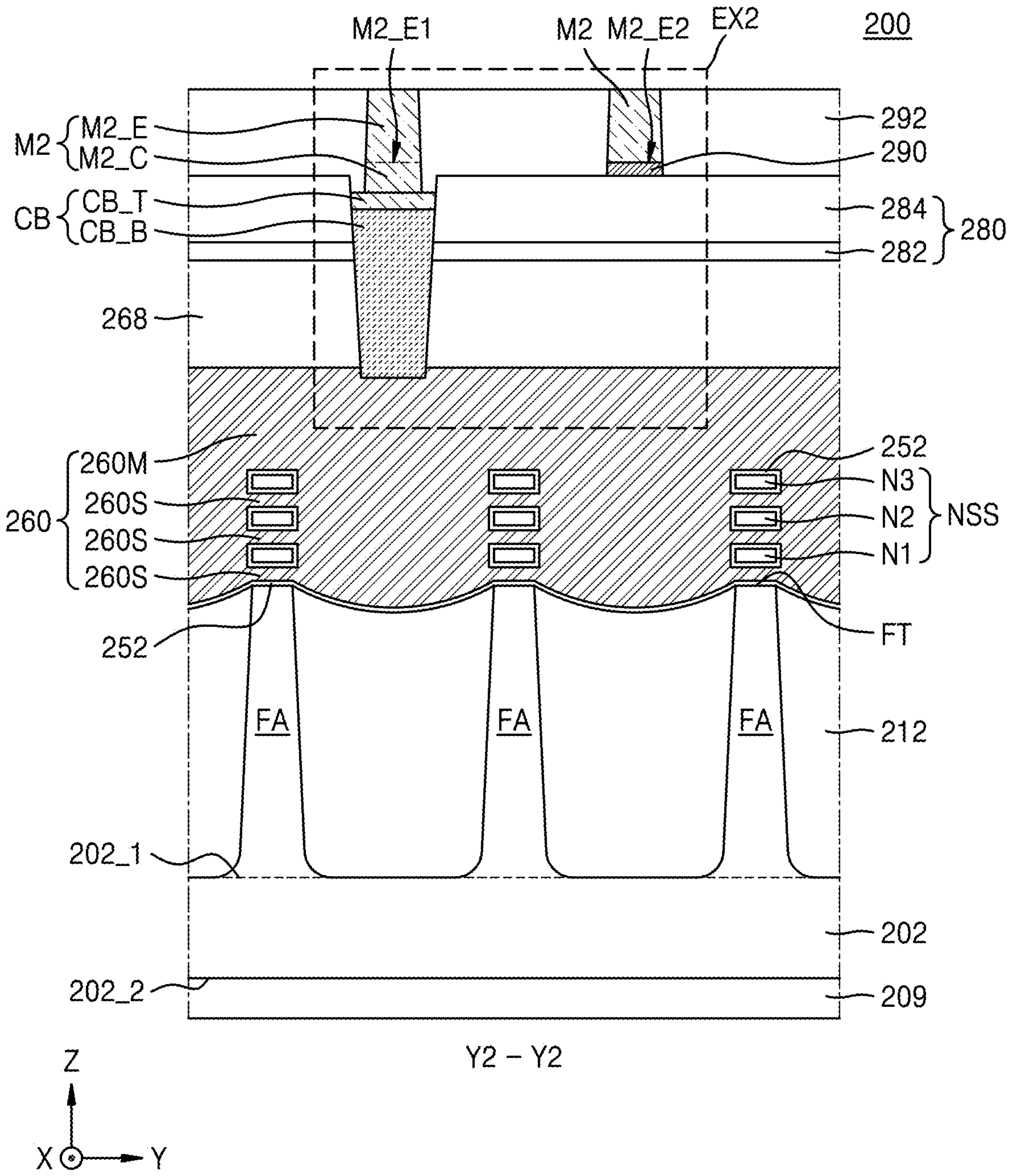
Figure 14B:
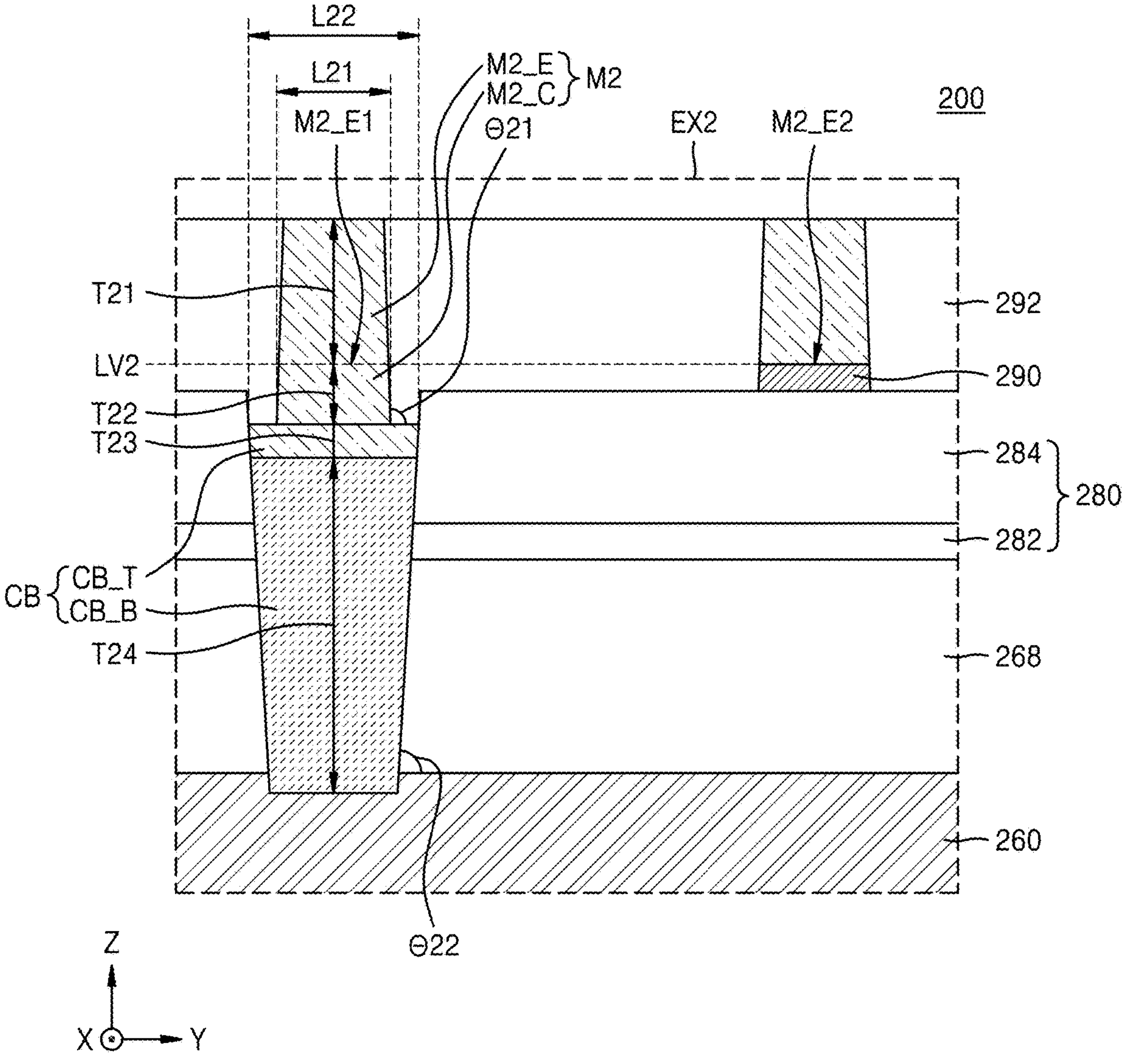

FIG. 11 is a floor layout diagram for describing an example of an integrated circuit device 200. FIGS. 12, 13, 14A, and 14B are cross-sectional views for describing the integrated circuit device 200 according to other embodiments. More particularly, FIG. 12 is a cross-sectional view taken along a line X1-X1 shown in FIG. 11. FIG. 13 is a cross-sectional view taken along a line Y1-Y1 shown in FIG. 11. FIG. 14A is a cross-sectional view taken along a line Y2-Y2 shown in FIG. 2. FIG. 14B is an enlarged cross-sectional view of a region EX2 shown in FIG. 14A.

Referring to FIGS. 11, 13, and 14A, the integrated circuit device 200 may include a substrate 202, which has a first surface 202_1 and a second surface 202_2, and a plurality of fin-type active regions FA protruding on the first surface 202_1 of the substrate 202. The plurality of fin-type active regions FA may extend parallel to each other in the first horizontal direction (the X direction) on the substrate 202.

A device isolation film 212 may be arranged in a trench defining the plurality of fin-type active regions FA. The device isolation film 212 may cover a portion of a sidewall of each of the plurality of fin-type active regions FA. The second surface 202_2 of the substrate 202 may be covered with a backside insulating film 209.

As illustrated in FIGS. 11, 12, and 14A, a plurality of gate lines 260 may be arranged on the plurality of fin-type active regions FA. Each of the plurality of gate lines 260 may extend in the second horizontal direction (the Y direction). Each of the plurality of gate lines 260 may include a main gate portion 260M and a plurality of sub gate portions 260S.

As illustrated in FIGS. 12 and 14A, in regions in which the plurality of fin-type active regions FA cross the plurality of gate lines 260, a plurality of nanosheet stacks NSS may be arranged on a fin top surface FT of each of the plurality of fin-type active region FA. The plurality of nanosheet stacks NSS may include at least one nanosheet facing fin top surface FT at a position apart from the fin top surface FT of the fin-type active region FA in the vertical direction (the Z direction).

The plurality of nanosheet stacks NSS may each include a first nanosheet N1, a second nanosheet N2, and a third nanosheet N3, which may each function as a channel region.

As illustrated in FIGS. 12 and 13, a plurality of source/drain regions 230 may be arranged on the plurality of fin-type active regions FA. Each of the plurality of source/drain regions 230 may be arranged at a position adjacent to at least one gate line 260 selected from among the plurality of gate lines 260. Each of the source/drain regions 230 may contact the first nanosheet N1, the second nanosheet N2, and the third nanosheet included in an adjacent nanosheet stack. NSS.

A gate dielectric film 252 may be between the nanosheet stack NSS and the gate line 260. A top surface of each of the gate dielectric film 252 and the gate line 260 may be covered with a capping insulating pattern 268. Two sidewalls of each of the gate line 260 and the capping insulating pattern 268 may be covered with an outer insulating spacer 218. A plurality of recess-side insulating spacers 219 covering sidewalls of the plurality of source/drain regions 230 may be arranged on a top surface of the device isolation film 212.

A metal silicide film 272 may be formed on a top surface of each of the source/drain regions 230. An insulating liner 242 and an inter-gate insulating film 244 may be sequentially arranged on the plurality of source/drain regions 230 and a plurality of the metal silicide films 272.

As illustrated in FIGS. 11 and 14*a*, a gate contact CB may be arranged on the gate line 160. In the present specification, it is illustrated that the gate contact CB is arranged between the plurality of fin-type active regions FA and the plurality of nanosheet stacks NSS, but this is only an example, and other implementations are possible. For example, in some implementations, the gate contact CB may overlap the plurality of fin-type active regions FA and the plurality of nanosheet stacks NSS in the vertical direction (the Z direction).

The gate contact CB may penetrate a top insulating structure 280 and the capping insulating pattern 268 in the vertical direction (the Z direction) and may be connected to the gate line 260. A bottom surface of the gate contact CB may contact a top surface of the gate line 260. The gate contact CB may include a contact plug including molybdenum (Mo), copper (Cu), tungsten (W), cobalt (Co), ruthenium (Ru), manganese (Mn), titanium (Ti), tantalum (Ta), aluminum (Al), combinations thereof, or alloys thereof, but materials included in the contact plug are not limited thereto.

In some implementations, the gate contact CB may further include a conductive barrier pattern surrounding a portion of the contact plug. The conductive barrier pattern included in the gate contact CB may include a metal or a metal nitride. For example, the conductive barrier pattern may include Ti, Ta, W, TiN, TaN, WN, WCN, TiSiN, TaSiN, WSiN, or combinations thereof, but is not limited thereto. The gate contact CB will be described in detail below with reference to FIG. 14B.

A plurality of wiring lines M2 may be arranged to penetrate an upper insulating film 292. In the present specification, it is illustrated that the plurality of wiring lines M2 are respectively arranged between the plurality of fin-type active regions FA and the plurality of nanosheet stacks NSS, but this is only an example, and other implementations are possible. For example, in some implementations, when the gate contact CB overlaps the plurality of fin-type active regions FA and the plurality of nanosheet stacks NSS in the vertical direction, the plurality of wiring lines M2 may respectively overlap the plurality of fin-type active regions FA and the plurality of nanosheet stacks in the vertical direction (the Z direction).

Each of the plurality of wiring lines M2 may be connected to one gate contact CB selected from among the plurality of gate contacts below the plurality of wiring lines M2. In some implementations, the wiring line M2 may extend in the first horizontal direction (the X direction). In some implementations, the wiring line M2 may include an extending part M2_E extending in the first horizontal direction (the X direction) and a connecting part M2_C arranged between the extending part M2_E and the via contact VA. In some implementations, the connecting part M2_C may be arranged on a first portion M2_E1 of the extending part M2_E.

The plurality of wiring lines M2 may include Mo, Cu, W, Co, Ru, Mn, Ti, Ta, Al, combinations thereof, or alloys thereof, but are not limited thereto. Regarding the wiring lines M2, refer to the descriptions of the wiring lines M1 with reference to FIGS. 2 to 5.

As illustrated in FIGS. 12 and 13, an adhesive layer 290 may be arranged on a portion of the wiring line M2. The adhesive layer 290 may include titanium nitride (TiN). More particularly, the adhesive layer 290 may be arranged between the wiring line M2 and the top insulating structure 280. More particularly, the adhesive layer 290 may be arranged between the wiring line M2 and an interlayer insulating film 284. Between the wiring line M2 and the interlayer insulating film 284, the adhesive layer 290 may contact the wiring line M2 and the interlayer insulating film 284. The adhesive layer 290 may overlap the wiring line M2 and the interlayer insulating film 284 in the vertical direction (the Z direction). In some implementations, the wiring line M2 may be apart from the top insulating structure 280 with the adhesive layer 290 therebetween. More particularly, the wiring line M2 may be apart from the interlayer insulating film 284 with the adhesive layer 290 therebetween.

More particularly, the adhesive layer 290 may be arranged in a second portion M2_E2 of the extending part M2_E. The second portion M2_E2 may include a region except the first portion M2_E1 in a surface of the extending part M2_E facing the top insulating structure 280. That is, in some implementations, the adhesive layer 290 is not arranged on the first portion M2_E1 of the extending part M2_E.

In some implementations, the adhesive layer 290 is arranged between the extending part M2_E of the wiring line M2 and the top insulating structure 280 and is not arranged between the connecting part M2_C of the wiring line M2 and the top insulating structure 280. More particularly, in some implementations, the adhesive layer 290 is arranged between the extending part M2_E of the wiring line M2 and the interlayer insulating film 284 and is not arranged between the extending part M2_E and the connecting part M2_C of the wiring line M2 and between the connecting part M2_C and the interlayer insulating film 284. More particularly, in some implementations, the adhesive layer 290 is not arranged between the connecting part M2_C of the wiring line M2 and the gate contact CB.

In some implementations, between the extending part M2_E of the wiring line M2 and the interlayer insulating film 284, the adhesive layer 290 may horizontally surround the connecting part M2_C of the wiring line M2.

Referring to FIG. 14B, the wiring line M2 may be connected to the gate line 260 through the gate contact CB.

In some implementations, the extending part M2_E and the connecting part M2_C may include a same kind of metal. For example, both the extending part M2_E and the connecting part M2_C may include Ru. More particularly, the extending part M2_E and the connecting part M2_C may be formed of a same kind of metal. For example, both the extending part M2_E and the connecting part M2_C may be formed of Ru.

In some implementations, a top surface of the connecting part M2_C may be at a vertical level higher than a top surface of the interlayer insulating film 284. More particularly, the top surface of the connecting part M2_C may be at a same vertical level as the top surface of the adhesive layer 290. For example, both the top surface of the connecting part M2_C and the top surface of the adhesive layer 290 may be at a second vertical level LV2.

In some implementations, a vertical thickness T21 of the extending part M2_E may be greater than a vertical thickness T22 of the adhesive layer 290.

In some implementations, the adhesive layer 290 may be arranged on a portion of the extending part M2_E in which the connecting part M2_C is not arranged, i.e., the second portion M2_E2, and therefore, the extending part M2_E and the connecting part M2_C may directly contact each other. In other words, the top surface of the extending part M2_E may directly contact a bottom surface of the connecting part M2_C.

In some implementations, an angle θ21 formed by an outer sidewall of the wiring line M2 and a top surface of the gate contact CB may be 90° or more. In the present specification, the outer sidewall of the wiring line M2 may indicate a sidewall directly contacting the upper insulating film 292 surrounding the wiring line M2. For example, the angle formed by the outer sidewall of the wiring line M2 and the top surface of the gate contact CB may be 90° or more but not more than 110°.

In some implementations, the adhesive layer 290 is not arranged on a contact portion of the wiring line M2 to contact the gate contact CB. More particularly, in some implementations, the adhesive layer 290 is not formed on the connecting part M2_C. More particularly, in some implementations, the adhesive layer 290 is not formed between the connecting part M2_C and the gate contact CB. Accordingly, the connecting part M2_C and the gate contact CB may directly contact each other. More particularly, a bottom surface of the connecting part M2_C and the top surface of the gate contact CB may directly contact each other. In some implementations, the wiring line M2 and a top gate contact CB_T may be integrally formed and directly contact each other.

In some implementations, the gate contact CB may include the top gate contact CB_T and a bottom gate contact CB_B. In some implementations, the top gate contact CB_T may be arranged between the wiring line M2 and the bottom gate contact CB_B. The top gate contact CB_T may directly contact the wiring line M2. More particularly, the top gate contact CB_T may directly contact the connecting part M2_C of the wiring line M2. For example, a top surface of the top gate contact CB_T may directly contact the bottom surface of the connecting part M2_C. In some implementations, the bottom gate contact CB_B may be arranged between the top gate contact CB_T and the gate line 260. The bottom gate contact CB_B may directly contact the gate line 260. For example, a bottom surface of the bottom gate contact CB_B may directly contact the top surface of the gate line 260.

In some implementations, the top surface of the gate contact CB may be at a vertical level lower than the top surface of the interlayer insulating film 284. That is, the top surface of the top gate contact CB_T may be at a vertical level lower than the top surface of the interlayer insulating film 284. That is, the top surface of the top gate contact CB_T may be at a vertical level lower than a bottom surface of the adhesive layer 290. That is, the bottom surface of the connecting part M2_C may be at a vertical level lower than the bottom surface of the adhesive layer 290. Accordingly, a vertical thickness T23 of the connecting part M2_C may be greater than the vertical thickness T22 of the adhesive layer 290.

In some implementations, the top gate contact CB_T and the bottom gate contact CB_B may include different kinds of metal. For example, while the top gate contact CB_T includes Ru, the bottom gate contact CB_B may include Mo. More particularly, the top gate contact CB_T and the bottom gate contact CB_B may be formed of different kinds of metal. For example, while the top gate contact CB_T is formed of Ru, the bottom gate contact CB_B may be formed of Mo.

In some implementations, the top gate contact CB_T may include a same kind of metal as a metal included in the wiring line M2. For example, both the top gate contact CB_T and the wiring line M2 may include Ru. More particularly, the top gate contact CB_T and the wiring line M2 may include a same kind of metal. For example, both the top gate contact CB_T and the wiring line M2 may be formed of Ru. In some implementations, the bottom gate contact CB_B and the wiring line M2 may include different kinds of metal. More particularly, the bottom gate contact CB_B and the wiring line M2 may be formed of different kinds of metal.

In some implementations, the thickness T23 in the vertical direction (the Z direction) of the top gate contact CB_T may be less than a thickness T24 in the vertical direction (the Z direction) of the bottom gate contact CB_B.

In some implementations, an angle θ22 formed by an outer sidewall of the gate contact CB and the top surface of the gate line 260 may be 90° or less. In the present specification, the outer sidewall of the gate contact CB may indicate a sidewall directly contacting the top insulating structure 280, which surrounds the gate contact CB, and the capping insulating pattern 268. For example, the angle θ22 formed by the outer sidewall of the gate contact CB and the top surface of the gate line 260 may be 70° or more but not more than 90°.

In some implementations, a width of the wiring line M2 in the second horizontal direction may be less than a width of the gate contact CB in the second horizontal direction. More particularly, an average width of the wiring line M2 in the second horizontal direction may be less than an average width of the gate contact CB in the second horizontal direction. More particularly, at a contact portion between the wiring line M2 and the gate contact CB, the width of the wiring line M2 in the second horizontal direction may be less than the width of the gate contact CB in the second horizontal direction. For example, a width L21 in the second vertical direction at a lowest vertical level of the wiring line M2 may be less than a width L22 in the second vertical direction at a highest vertical level of the gate contact CB. For example, the width L21 in the second horizontal direction of the bottom surface of the connecting part M2_C of the wiring line M2 may be less than the width L22 in the second horizontal direction of the top surface of the top gate contact CB.

In some implementations, the wiring line M2 and the outer sidewall of the gate contact CB contacting each other may have a step difference. More particularly, the wiring line M2 and the outer sidewall of the gate contact CB contacting each other may have a step difference at a boundary between the wiring line M2 and the gate contact CB.

In the integrated circuit device 200 described with reference to FIGS. 11 to 14, the adhesive layer 290 is not arranged on the contact portion between the wiring line M2 and the gate contact CB. In some implementations, the wiring line M2 has reduced resistance due to removal of the adhesive layer 290 in the contact portion with the gate contact CB compared to a wiring line with an adhesive layer at the contact portion with a gate contact.

In the integrated circuit device 200 described above with reference to FIGS. 11 to 14B, the gate contact CB can include the top gate contact CB_T and the bottom gate contact CB_B respectively including different kinds of metal. More particularly, in some implementations, the gate contact CB can have reduced resistance and improved controllability compared to a gate contact that is likely to oxidize, where the gate contact CB includes the top gate contact CB_T including Ru and the bottom gate contact CB_B including a metal different from Ru.

FIGS. 15 to 19 are cross-sectional views of examples of integrated circuit devices 200A, 200B, 201, 201A, and 201B according to other embodiments.

Referring to FIGS. 15 to 19, differences from the integrated circuit device 200 described with reference to FIGS. 11 to 14B will be mainly described.

Figure 15:
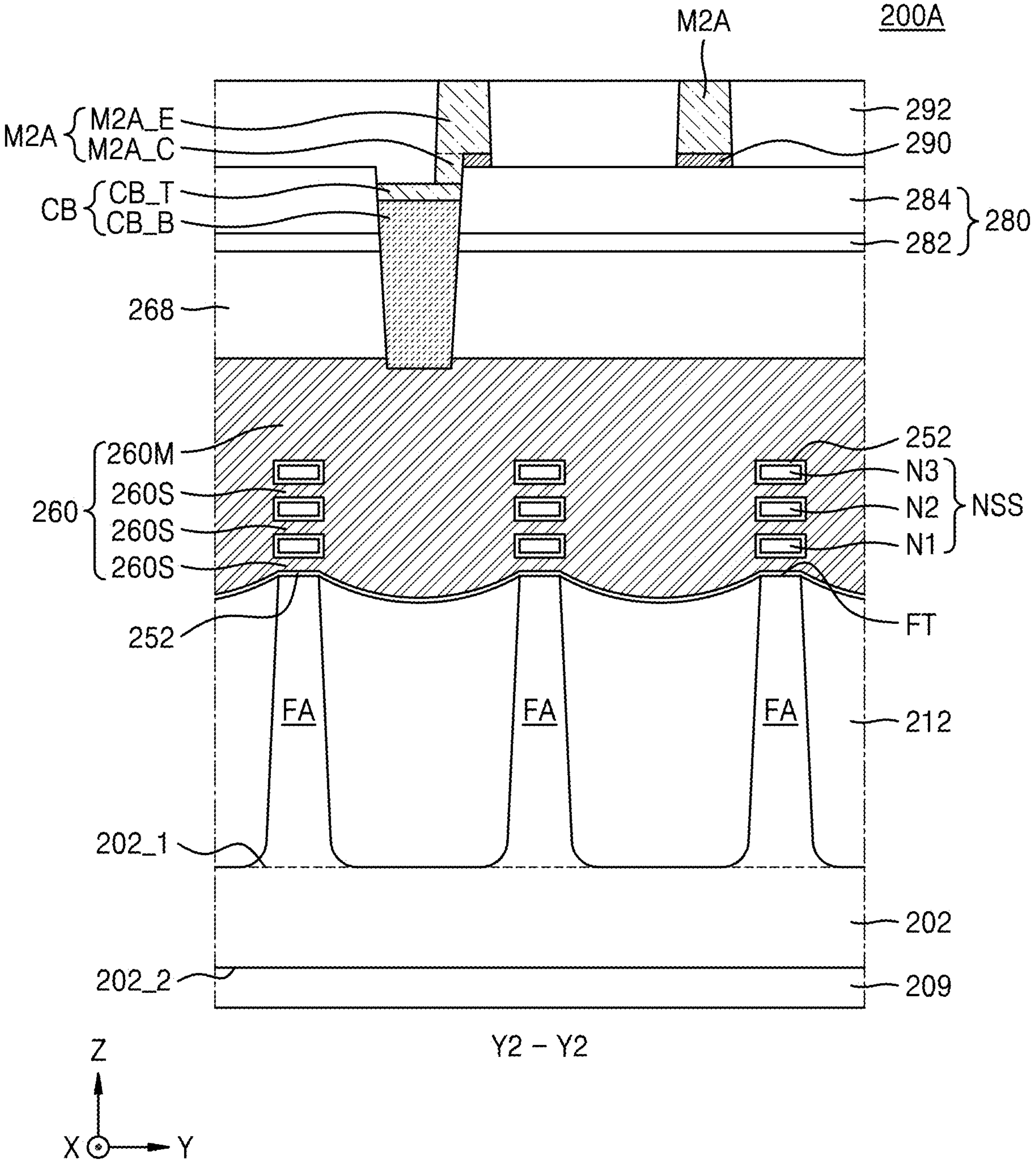
FIGS. 15 to 19 are cross-sectional views of an example of an integrated circuit device.
Figure 16:
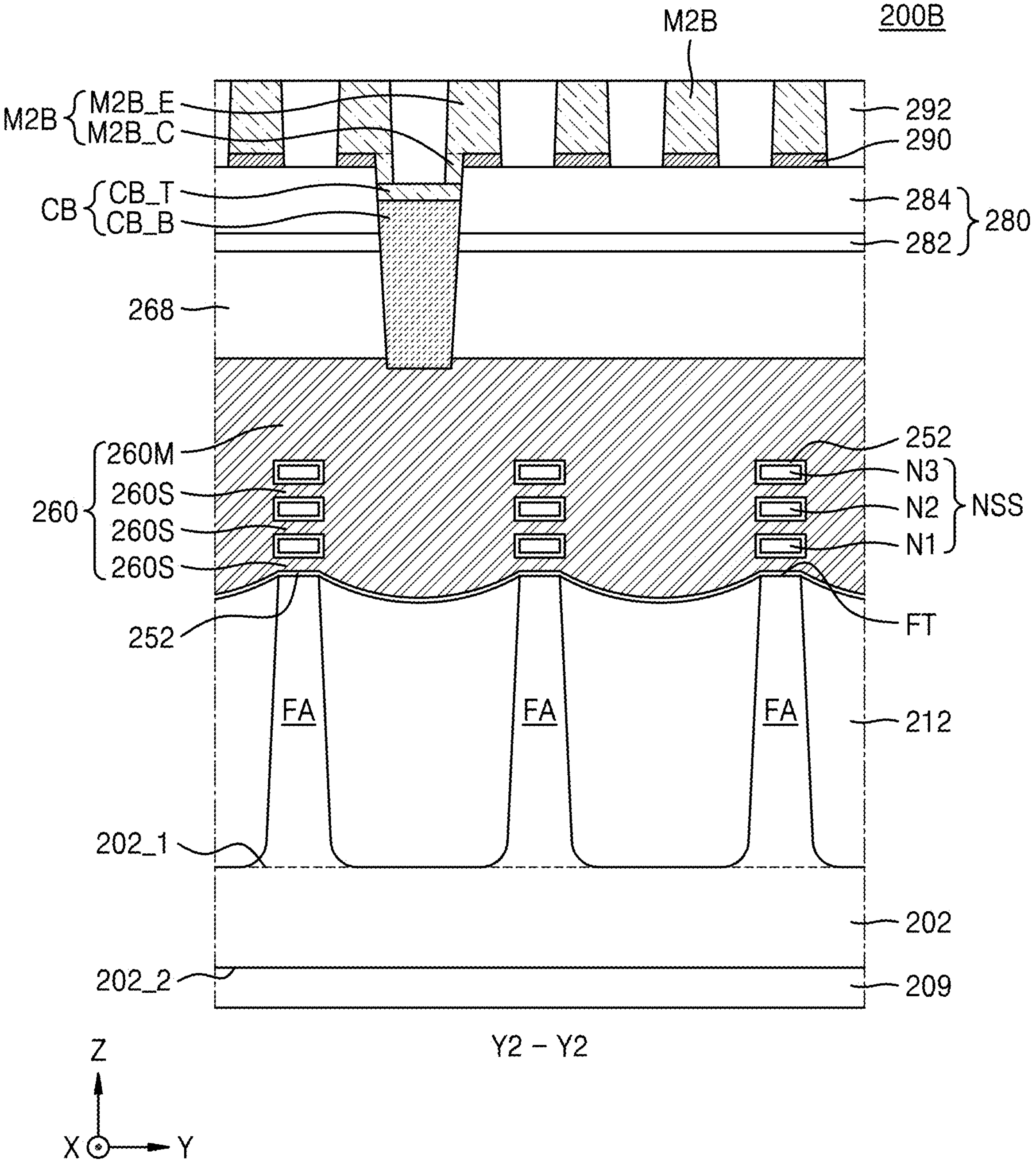

Referring to FIGS. 15 and 16, the integrated circuit devices 200A may include a wiring line M2A and a gate contact CB; and the integrated circuit device 200B may include a wiring line M2B and a gate contact CB, and the wiring lines M2A and M2B may be misaligned with the gate contact CB. More particularly, only a portion of each of the wiring lines M2A and M2B may overlap the gate contact CB the gate contact CB contacting corresponding wiring lines M2A and M2B, in the vertical direction (the Z direction), and another portion may not overlap the gate contact CB.

Figure 17:
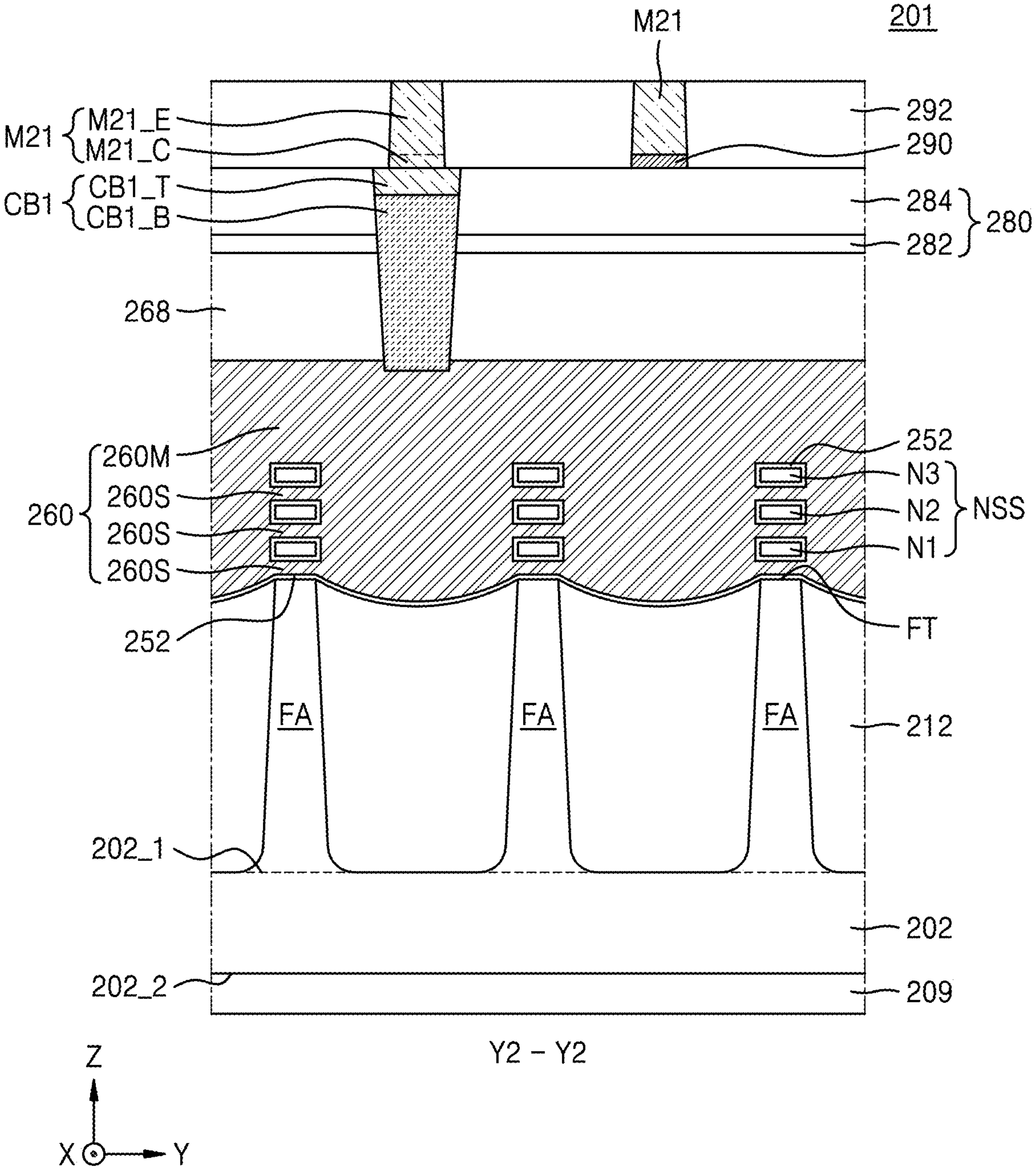
Figure 18:
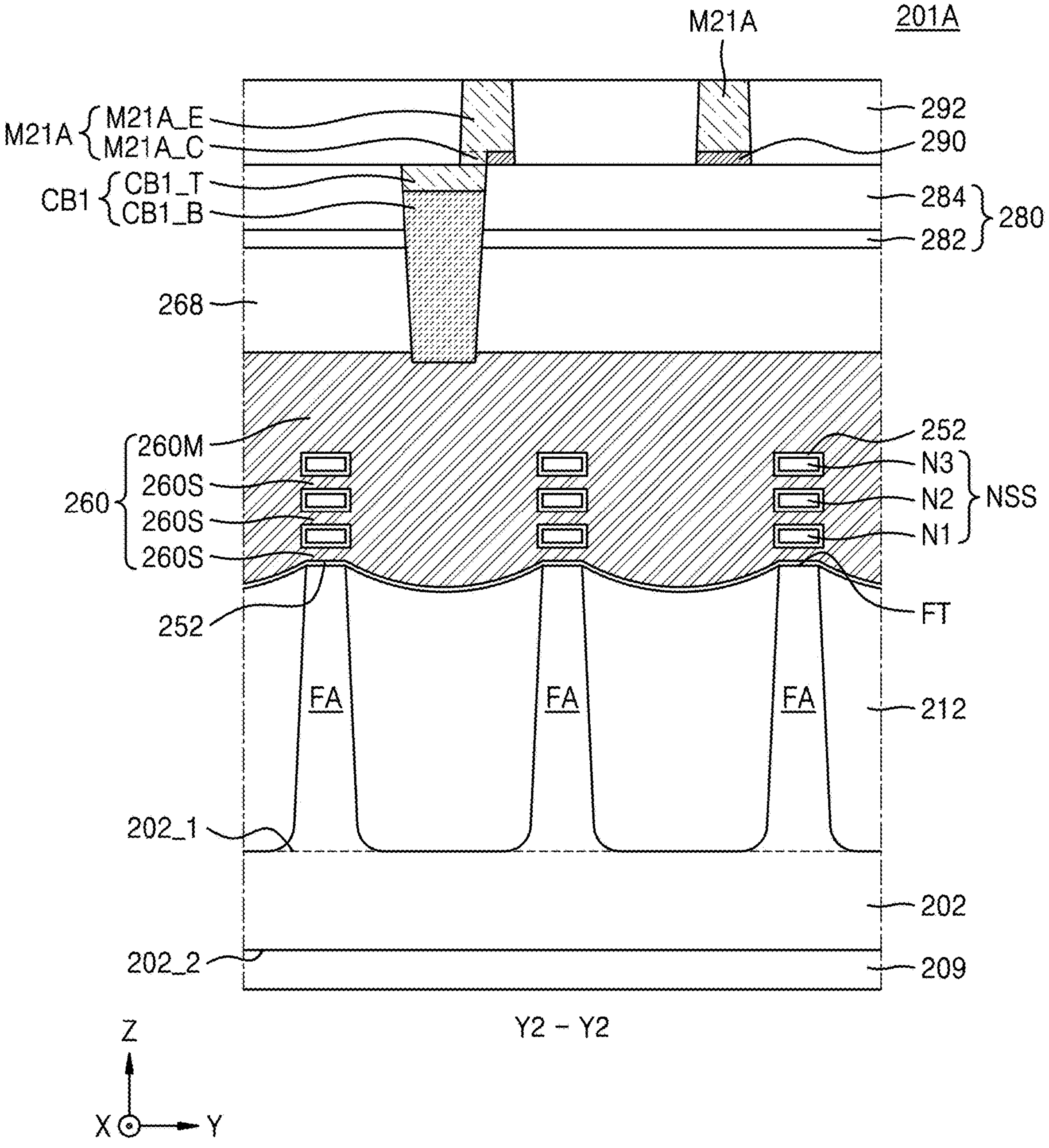
Figure 19:
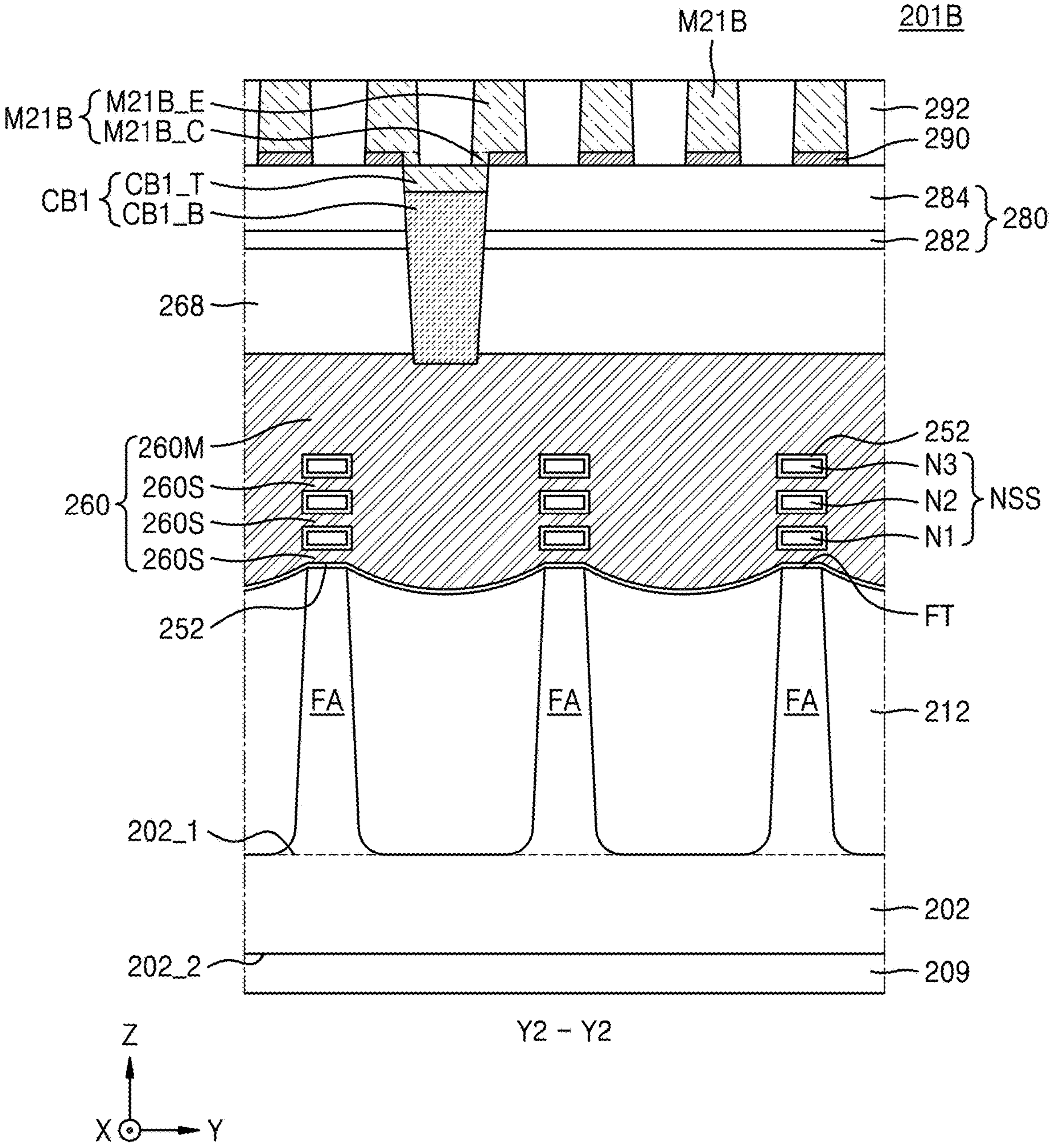

Referring to FIGS. 17 to 19, the integrated circuit device 201 may include a wiring line M21 and a gate contact CB1; the integrated circuit device 201A may include a wiring line M21A and a gate contact CB1; and the integrated circuit device 201B may include a wiring line M21B and a gate contact CB1. A top surface of the gate contact CB1 may be at a same vertical level as the top surface of the interlayer insulating film 284. That is, a top surface of a top gate contact CB1_T may be at a same vertical level as the top surface of the interlayer insulating film 284. That is, the top surface of the top gate contact CB1_T may be at a same vertical level as the bottom surface of the adhesive layer 290. That is, bottom surfaces of connecting parts M21_C, M21A_C, and M21B_C may be at a same vertical level as the bottom surface of the adhesive layer 290. Therefore, a vertical thickness of the connecting parts M21_C, M21A_C, and M21B_C may be identical to the vertical thickness of the adhesive layer 290.

Figure 20:
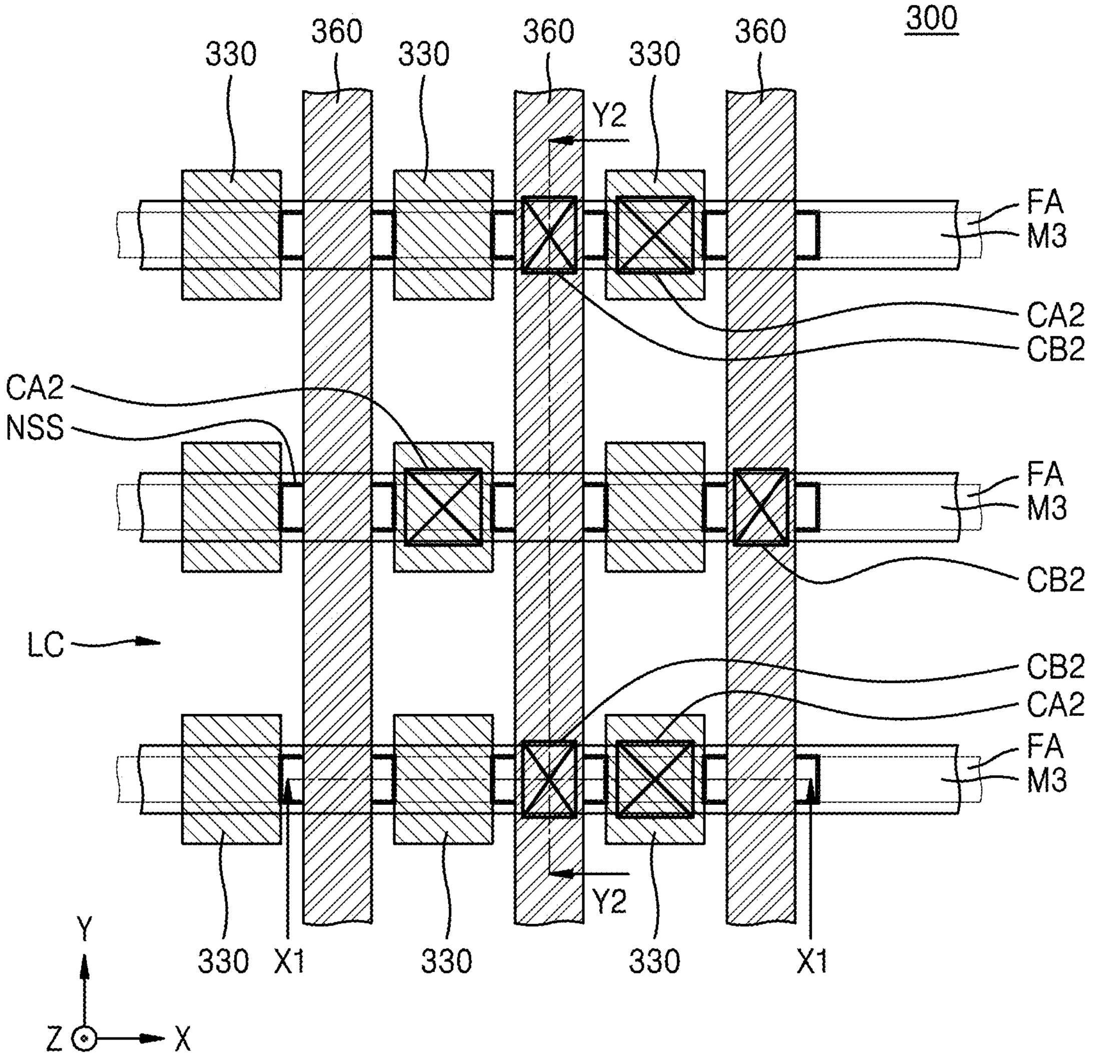
FIG. 20 is a floor layout diagram of an example of an integrated circuit device.
Figure 21:
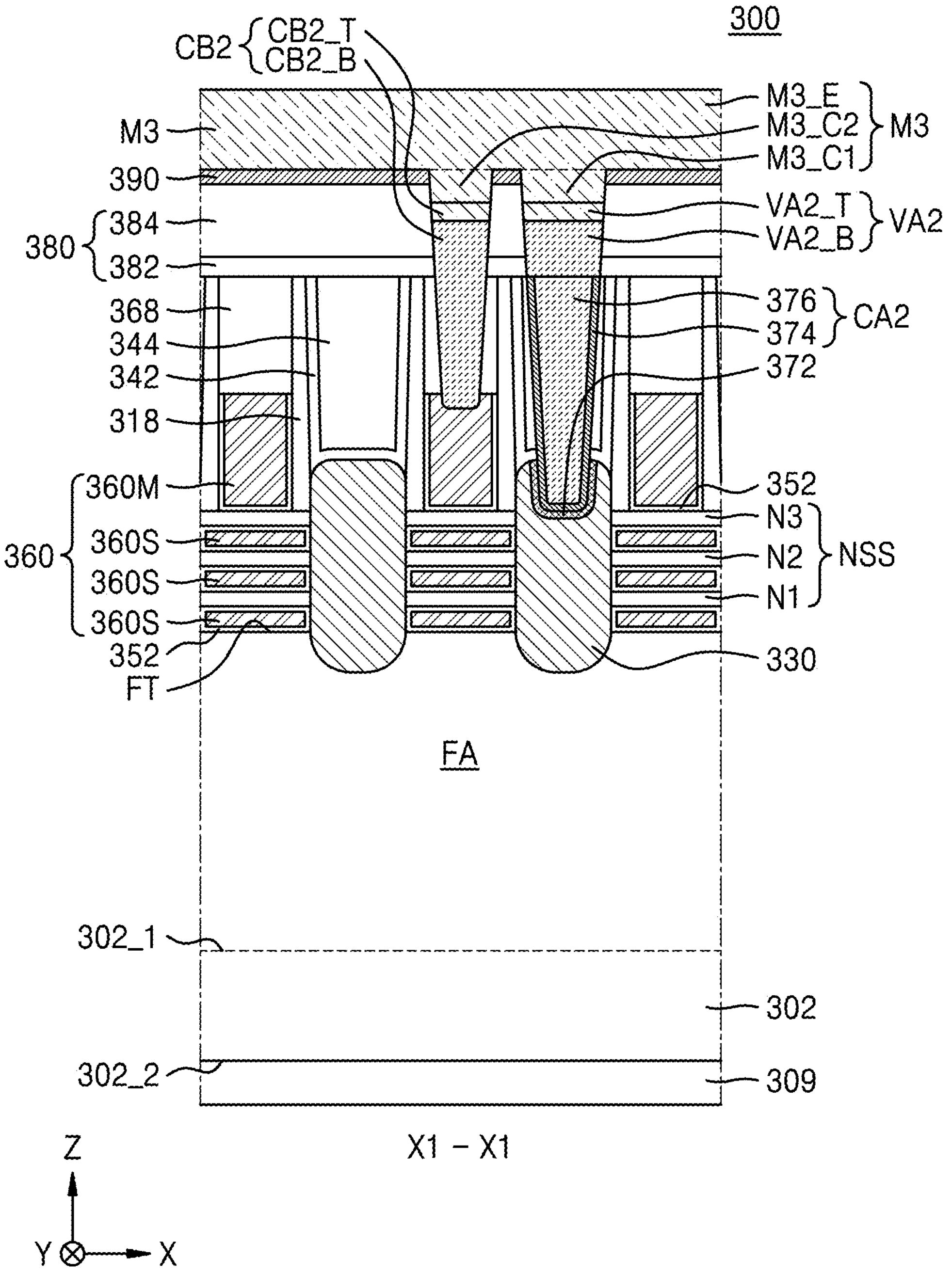
FIGS. 21 and 22 are cross-sectional views of an example of an integrated circuit device.
Figure 22:
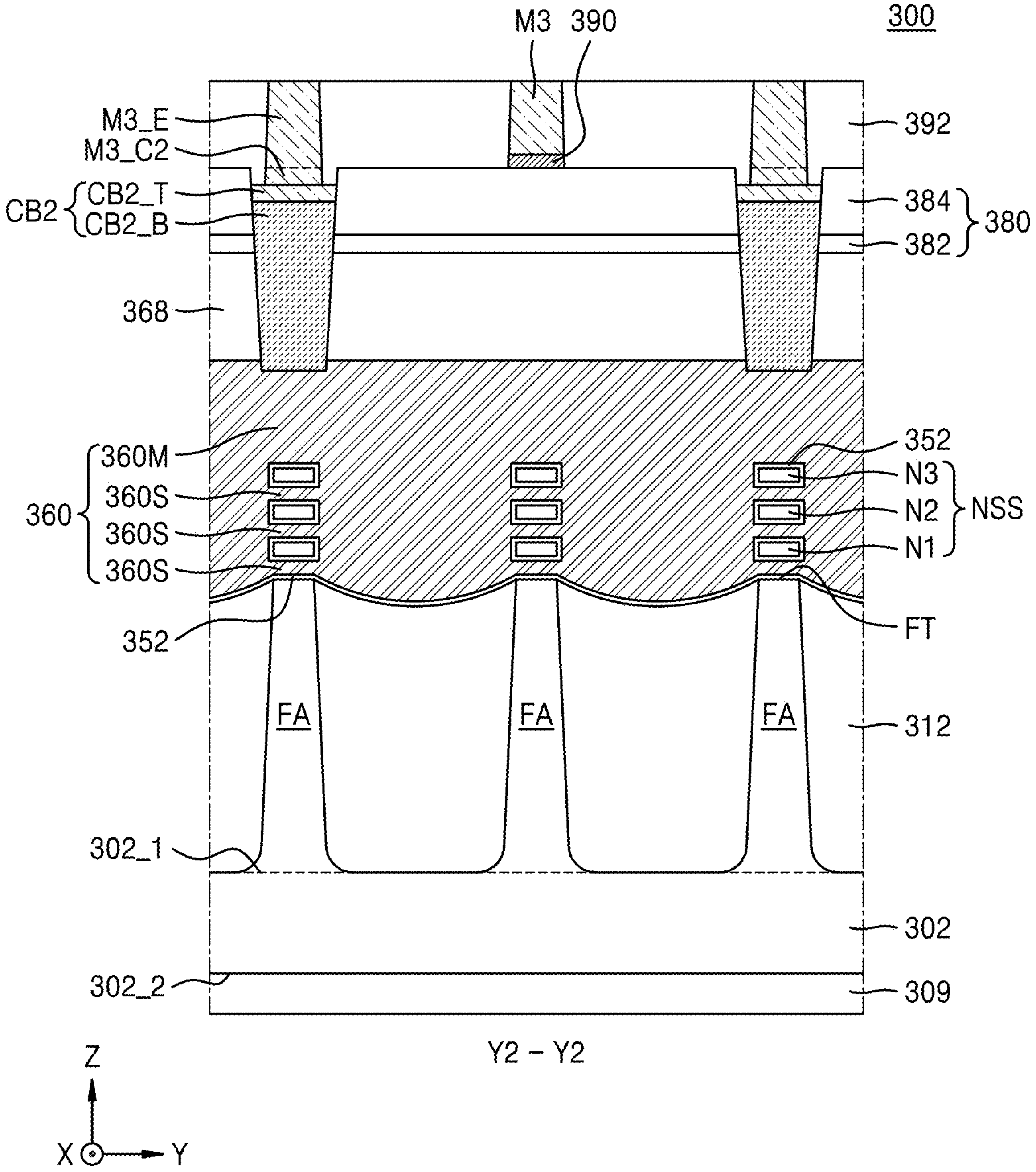

FIG. 20 is a floor layout diagram of an example of an integrated circuit device 300. FIGS. 21 and 22 are cross-sectional views of another integrated circuit device 300. More particularly, FIG. 21 is a cross-sectional view taken along a line X1-X1 shown in FIG. 20. FIG. 22 is a cross-sectional view taken along a line Y2-Y2 shown in FIG. 20.

Referring to FIGS. 20 to 22, the integrated circuit device 300 includes a substrate 302 and a plurality of fin-type active regions FA protruding on a first surface 302_1 of the substrate 302 and extending in the first horizontal direction (the X direction).

A plurality of gate lines 360 may be arranged on the plurality of fin-type active regions FA. Each of the plurality of gate lines 360 may extend in the second horizontal direction (the Y direction). Each of the plurality of gate lines 360 may include a main gate portion 360M and a plurality of sub gate portions 360S.

A plurality of nanosheet stacks NSS may be arranged on fin top surfaces FT of the plurality of fin-type active regions FA in regions in which the plurality of fin-type active regions FA cross the plurality of gate lines 360. The plurality of nanosheet stacks NSS may include at least one nanosheet facing fin top surface FT at a position apart from the fin top surface FT of the fin-type active region FA in the vertical direction (the Z direction).

The plurality of nanosheet stacks NSS may each include a first nanosheet N1, a second nanosheet N2, and a third nanosheet N3, which may each function as a channel region.

A plurality of source/drain regions 330 may be arranged on the fin-type active regions FA. Each of the plurality of source/drain regions 330 may be arranged at a position adjacent to at least one gate line 360 selected from among the plurality of gate lines 360. Each of the plurality of source/drain regions 330 may contact the first nanosheet N1, the second nanosheet N2, and the third nanosheet N3 included in an adjacent nanosheet stack NSS.

An active contact CA2 may be arranged on the source/drain region 330. The active contact CA2 may penetrate an inter-gate insulating film 344 and an insulating liner 342 in the vertical direction (the Z direction) and contact a metal silicide film 372. The active contact CA2 may be electrically connected to the source/drain region 330 through the metal silicide film 372. Regarding the active contact CA2, refer to the descriptions of the active contact CA with reference to FIGS. 2 to 5.

A via contact VA2 may be arranged on the active contact CA2. The via contact VA2 may penetrate a top insulating structure 380 and contact the active contact CA2. Each of the plurality of source/drain regions 330 may be electrically connected to the via contact VA2 through the metal silicide film 372 and the active contact CA2.

In some implementations, the via contact VA2 may include a top via contact VA2_T and a bottom via contact VA2_B. The top via contact VA2_T and the bottom via contact VA2_B may respectively include different kinds of metal. For example, while the top via contact VA2_T may include Ru, the bottom via contact VA2_B may include Mo. In some implementations, the top via contact VA2_T and the wiring line M3 may include a same kind of metal. Regarding the via contact VA2, refer to the descriptions of the via contact VA with reference to FIGS. 2 to 5.

A gate contact CB2 may be arranged on the gate line 360. The gate contact CB2 may penetrate the top insulating structure 380 and a capping insulating pattern 368 in the vertical direction (the Z direction) and may be connected to the gate line 360.

In some implementations, the gate contact CB2 may include a top gate contact CB2_T and a bottom gate contact CB2_B. The top gate contact CB2_T and the bottom gate contact CB2_B may respectively include different kinds of metal. For example, while the top gate contact CB2_T may include Ru, the bottom gate contact CB2_B may include Mo. In some implementations, the top gate contact CB2_T and the wiring line M3 may include a same kind of metal. Regarding the gate contact CB2, refer to the descriptions of the gate contact CB with reference to FIGS. 2 to 5.

A plurality of the wiring lines M3 may be arranged to penetrate a top insulating film 392. Each of the plurality of wiring lines M3 may be connected to one via contact VA2 selected from among the plurality of via contacts VA2 below the plurality of wiring lines M3. The plurality of wiring lines M3 may be connected to one gate contact CB2 selected from among the plurality of gate contacts CB2 below the plurality of wiring lines M3. In some implementations, the wiring line M3 may extend in the first horizontal direction (the X direction). In some implementations, the wiring line M3 may include: an extending part M3_E extending in the first horizontal direction (the X direction); a first connecting part M3_C1 arranged between the extending part M3_E and the via contact V2; and a second connecting part M3_C2 arranged between the extending part M3_E and the gate contact CB2. Regarding the wiring line M3, refer to the descriptions of the wiring line M1 with reference to FIGS. 2 to 5 and the descriptions of the wiring line M2 with reference to FIGS. 11 to 14B.

An adhesive layer 390 may be arranged on a portion of the wiring line M3. The adhesive layer 390 may include TiN. More particularly, the adhesive layer 390 may be arranged between the wiring line M3 and the top insulating structure 380. More particularly, the adhesive layer 390 may be arranged between the wiring line M3 and an interlayer insulating film 384. In some implementations, the adhesive layer 390 is not arranged on a contact portion of the wiring line to contact the via contact VA2 and a contact portion of the wiring line M3 to contact the gate contact CB2. That is, the wiring line M3 may directly contact the via contact VA2 and the gate contact CB2. More particularly, a first connecting part M3_C1 of the wiring line M3 may directly contact the via contact VA2. More particularly, a second connecting part M3_C2 of the wiring line M3 may directly contact the gate contact CB2. In some implementations, the wiring line M3, the top via contact VA2_T, and the top gate contact CB2_T may be integrally formed and may directly contact one another. Regarding the adhesive layer 390, refer to the descriptions of the adhesive layer 190 with reference to FIGS. 2 to 5 and the descriptions of the adhesive layer 290 with reference to FIGS. 11 to 14B.

In the integrated circuit device 300 described with reference to FIGS. 20 to 22, the adhesive layer 390 is not arranged on a contact portion to contact the via contact VA2 and a contact portion to contact the gate contact CB2. In some implementations, the wiring line M3 can have reduced resistance due to removal of the adhesive layer 390 from the contact portion to contact the via contact VA2 and the contact portion to contact the gate contact CB2 (compared to a wiring line in contact with an adhesive layer).

In the integrated circuit device 300 described with reference to FIGS. 20 to 22, the top via contact VA2_T and the bottom via contact VA2_B respectively include different kinds of metal. More particularly, in some implementations, the via contact VA2 can have reduced resistance and improved controllability compared to a via contact that is likely to oxidize, wherein the via contact VA2 includes the top via contact VA2_T including Ru and the bottom via contact VA2_B including a metal different from Ru.

In the integrated circuit device 300 described above with reference to FIGS. 20 to 22, the top gate contact CB2_T and the bottom gate contact CB2_B can respectively include different kinds of metal. More particularly, in some implementations, the gate contact CB2 can have reduced resistance and improved controllability compared to a gate contact that is likely to oxidize, wherein the gate contact CB2 includes the top gate contact CB2_T including Ru and the bottom gate contact CB2_B including a metal different from Ru.

FIGS. 23A to 23I are cross-sectional views illustrated according to process orders of an example of a method of manufacturing the integrated circuit device 100. More particularly, FIGS. 23A to 23I are cross-sectional views corresponding to a cross-section taken along a line Y1-Y1 shown in FIG. 2.

Figure 23A:
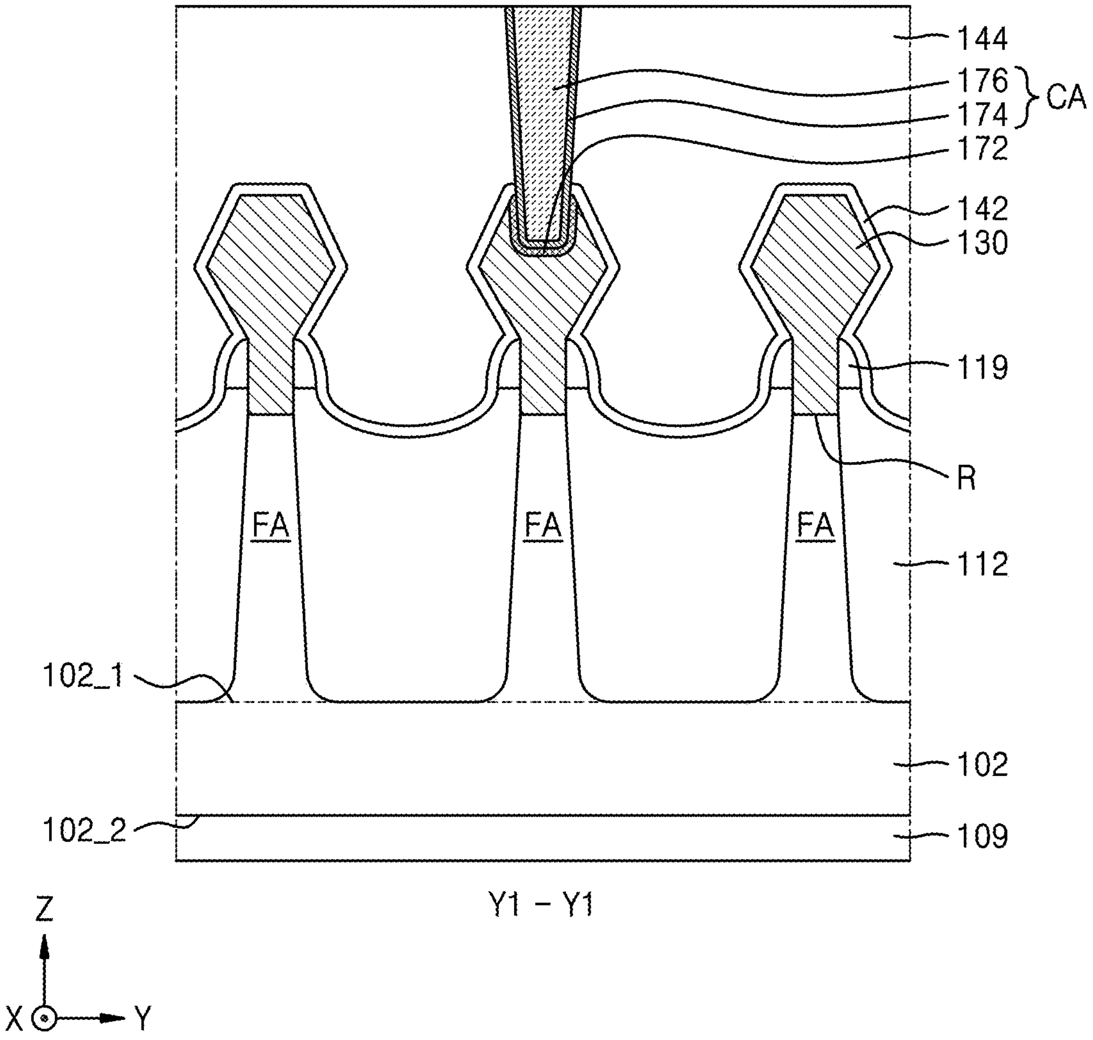
FIGS. 23A to 23I are cross-sectional views illustrated according to a process sequence of an example of a method of manufacturing an integrated circuit device.

Referring to FIG. 23A, the plurality of fin-type active regions FA protrude on the first surface 102_1 of the substrate 102. The source/drain region 130 may be arranged on the fin-type active region FA. The active contact CA may be arranged on the source/drain region 130 and electrically connected to the source/drain region 130. The active contact CA may penetrate the inter-gate insulating film 144 and the insulating liner 142 in the vertical direction (the Z direction) and contact a metal silicide film 172.

Figure 23B:
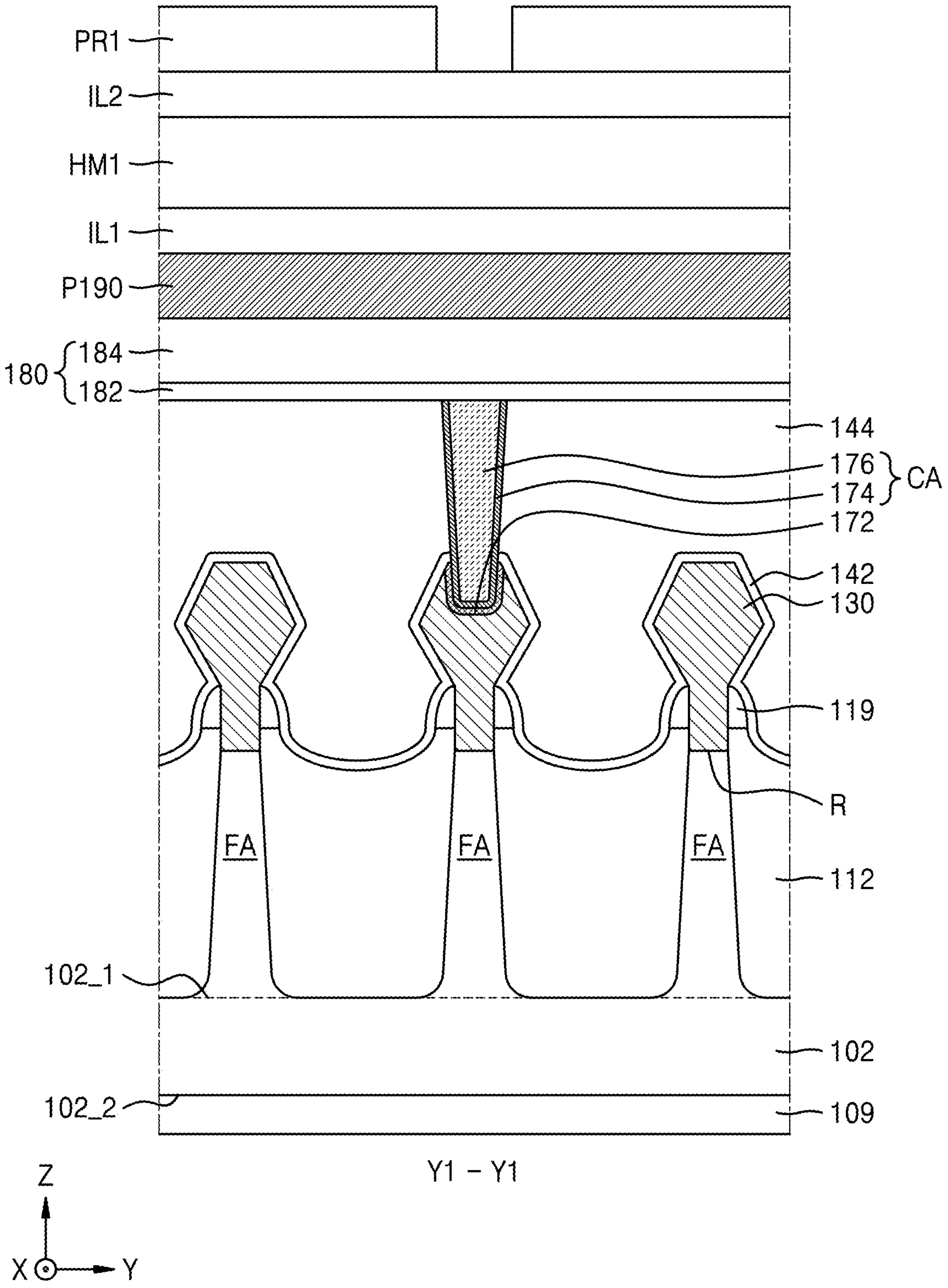

Referring to FIG. 23B, the top insulating structure 180, a pre-adhesive layer P190, a first insulating film IL1, a first hardmask film HM1, a second insulating film IL2, and a first photoresist pattern PR1 are disposed on the inter-gate insulating film 144 and the active contact CA. For example, the top insulating structure 180 may include the etch stop layer 182 including SiN and the interlayer insulating film 184 including silicon oxide ($SiO_2$). For example, the pre-adhesive layer P190 may include TiN. For example, the first insulating film IL1 and the second insulating film IL2 may include silicon oxynitride (SiON). For example, the first hardmask film HM1 may include a spin-on-hardmask (SOH) film.

The first photoresist pattern PR1 may expose a portion of the second insulating film IL2. The first photoresist pattern PR1 may expose the portion of the second insulating film IL2 overlapping the active contact CA in the vertical direction (the Z direction).

Figure 23C:
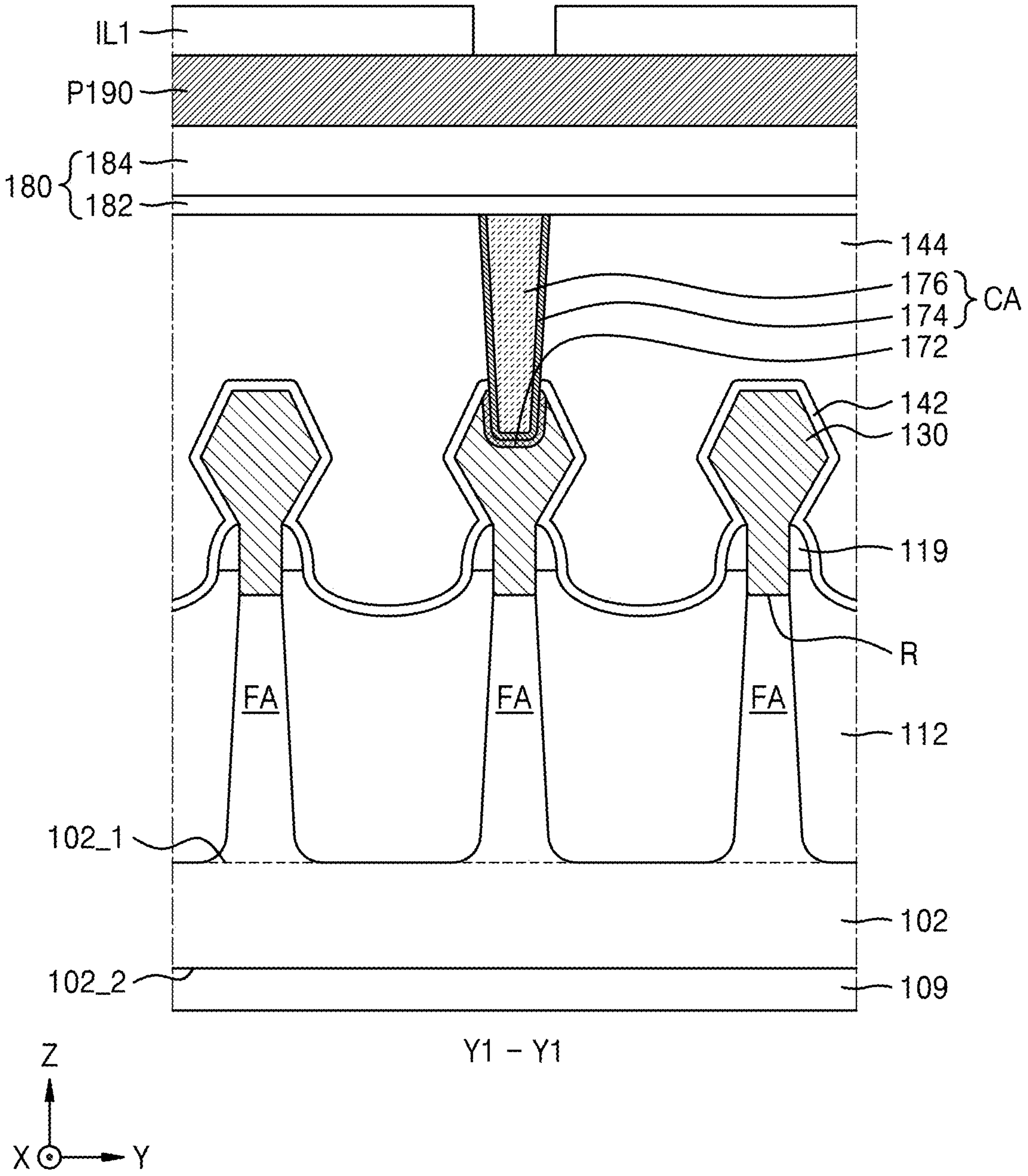
Figure 23D:
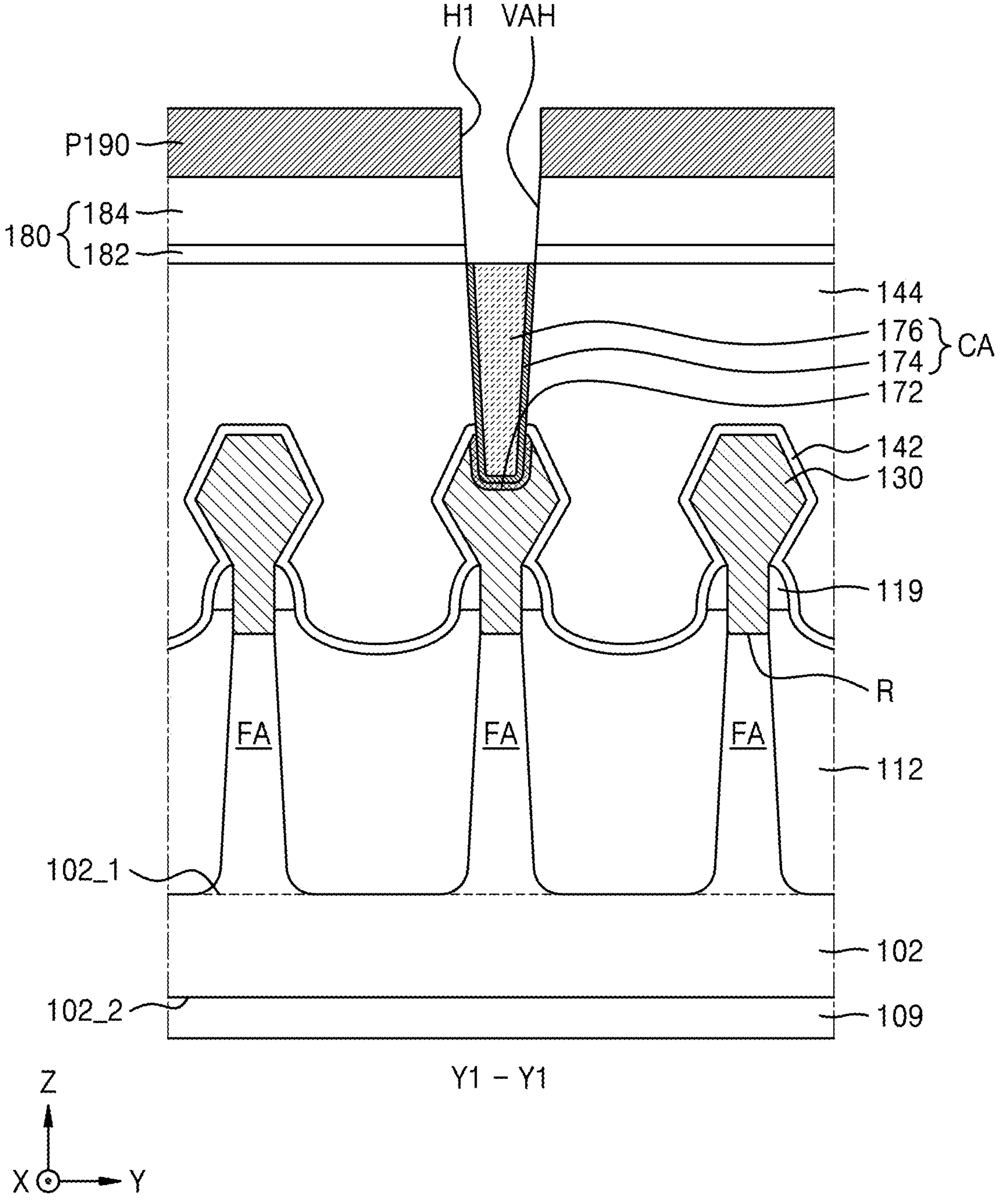

Referring to FIG. 23C, the second insulating film IL2, the first hardmask film HM1, and the first insulating film IL1 may be sequentially etched using the first photoresist pattern PR1 as a mask. More particularly, a portion of each of the second insulating film IL2, the first hardmask film HM1, and the first insulating film IL, which overlap the active contact CA in the vertical direction (the Z direction), may be sequentially etched. By doing so, a portion of the pre-adhesive layer P190 may be exposed. Next, the first photoresist pattern PR1, the second insulating film IL2, and the first hardmask film HM1 may be removed.

Referring to FIG. 23, the pre-adhesive layer P190, the interlayer insulating film 184, and the etch stop layer 182 may be sequentially etched using the first insulating film IL1, in which a portion thereof has been etched, as a mask. More particularly, the pre-adhesive layer P190, the interlayer insulating film 184, and the etch stop layer 182 overlapping the active contact CA may be sequentially etched. More particularly, a first hole H1 may be formed by etching the pre-adhesive layer P190 using the first insulating film IL1 as a mask. Next, a via contact hole VAH may be formed by etching the top insulating structure 180 exposed by the first hole H1.

The top surface of the active contact CA may exposed by the first hole H1 and the via contact hole VAH. Thereafter, the first insulating film IL1 may be removed.

Figure 23E:
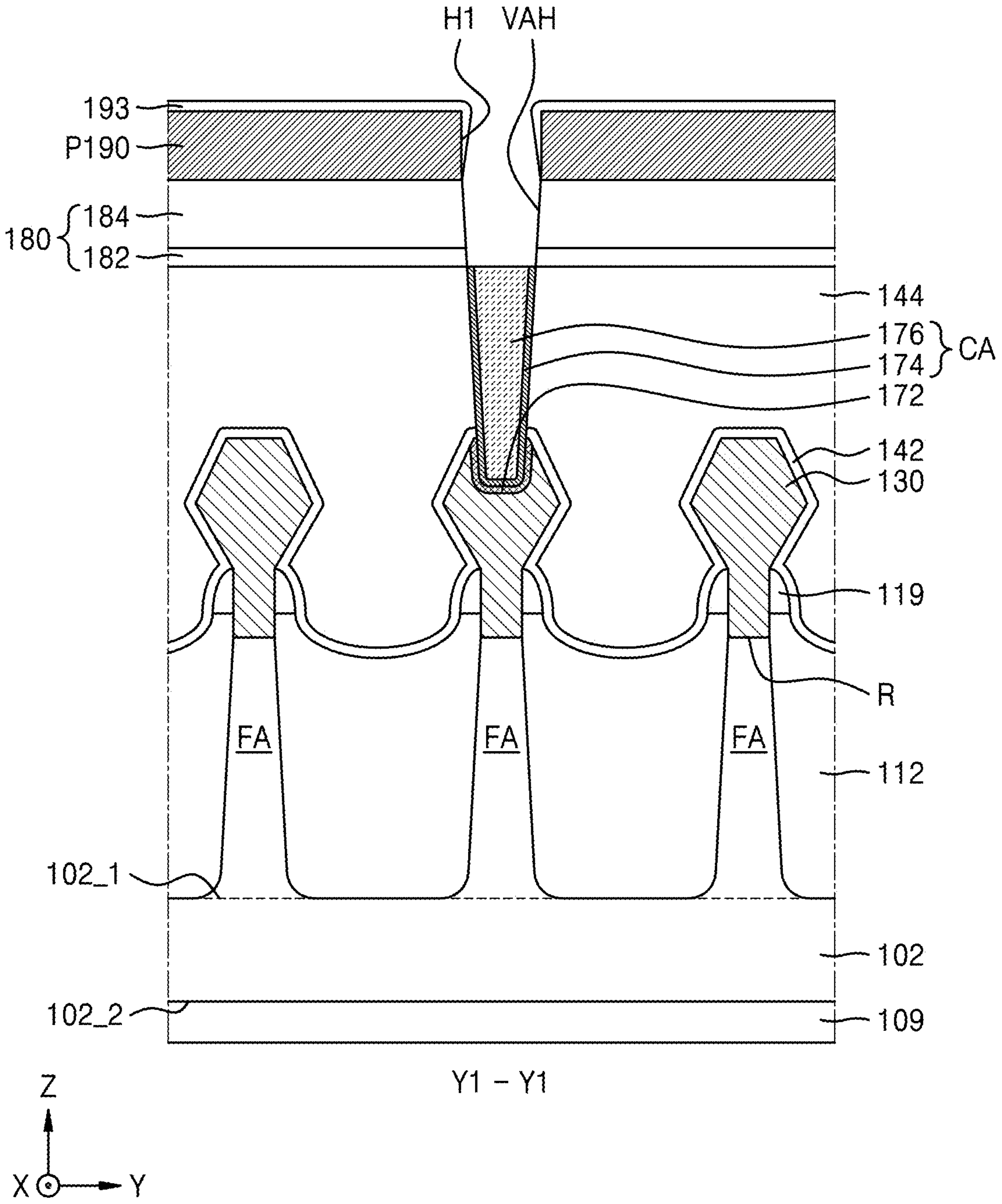

Referring to FIG. 23E, an inhibitor layer 193 may be formed on the pre-adhesive layer P190. More particularly, the inhibitor layer 193 may be selectively formed on a top surface of the pre-adhesive layer P190 and sidewalls of the first hole H1. For example, the inhibitor layer 193 may be selectively formed on the top surface of the pre-adhesive layer P190 and the sidewalls of the first hole H1, which include TiN. The inhibitor layer 193 may be formed not on sidewalls of the via contact hole VAH and the top surface of the active contact CA.

Figure 23F:
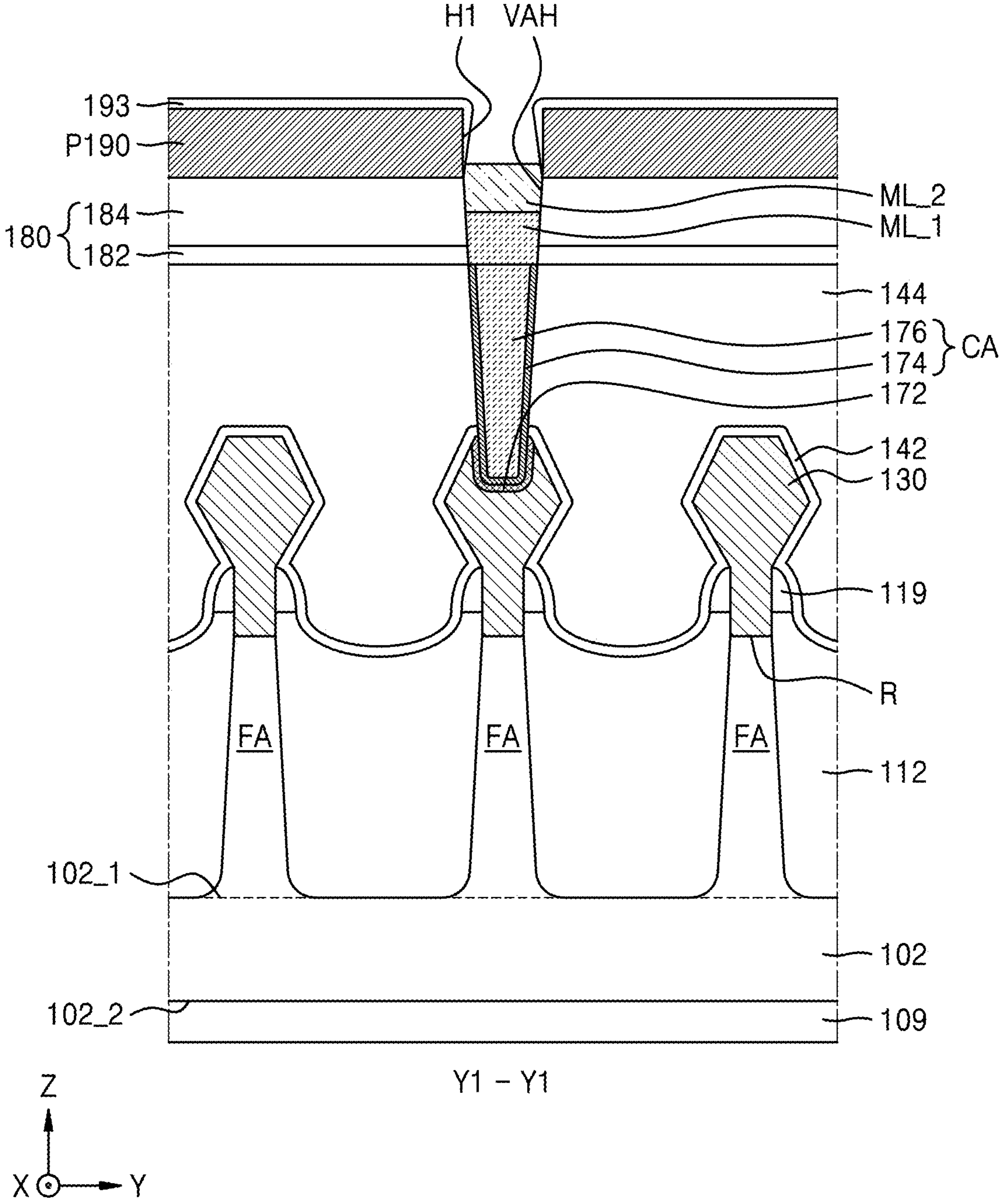

Referring to FIG. 23F, a first metal layer ML_1 and a second metal layer ML_2 may be sequentially formed in the via contact hole VAH. The first metal layer ML_1 and the second metal layer ML_2 may include different kinds of metal. For example, the first metal layer ML_1 may include Mo. For example, the second metal layer ML_2 may include Ru.

In some implementations, the first metal layer ML_1 may be deposited on the top surface of the active contact CA. More particularly, the first metal layer ML_1 may be deposited by selectively using atomic layer deposition (ALD) and/or chemical vapor deposition (CVD) on a metal. In some implementations, the first metal layer ML_1 may be conformally deposited on a non-metal material through ALD process and/or CVD process. A top surface of the first metal layer ML_1 may have a vertical level lower than a top surface of the top insulating structure 180.

The second metal layer ML_2 may be deposited on the first metal layer ML_1 through ALD process and/or CVD process. After the second metal layer ML_2 has been deposited to a vertical level of the top surface of the top insulating structure 180, a deposition rate in the first hole H1 may gradually decrease due to the inhibitor layer 193. As a result thereof, deposition of the second metal layer ML_2 in the first hole H1 may be finished. A top surface of the second metal layer ML_2 may have a vertical level higher than the top surface of the top insulating structure 180 and lower than the top surface of the pre-adhesive layer P190.

Figure 23G:
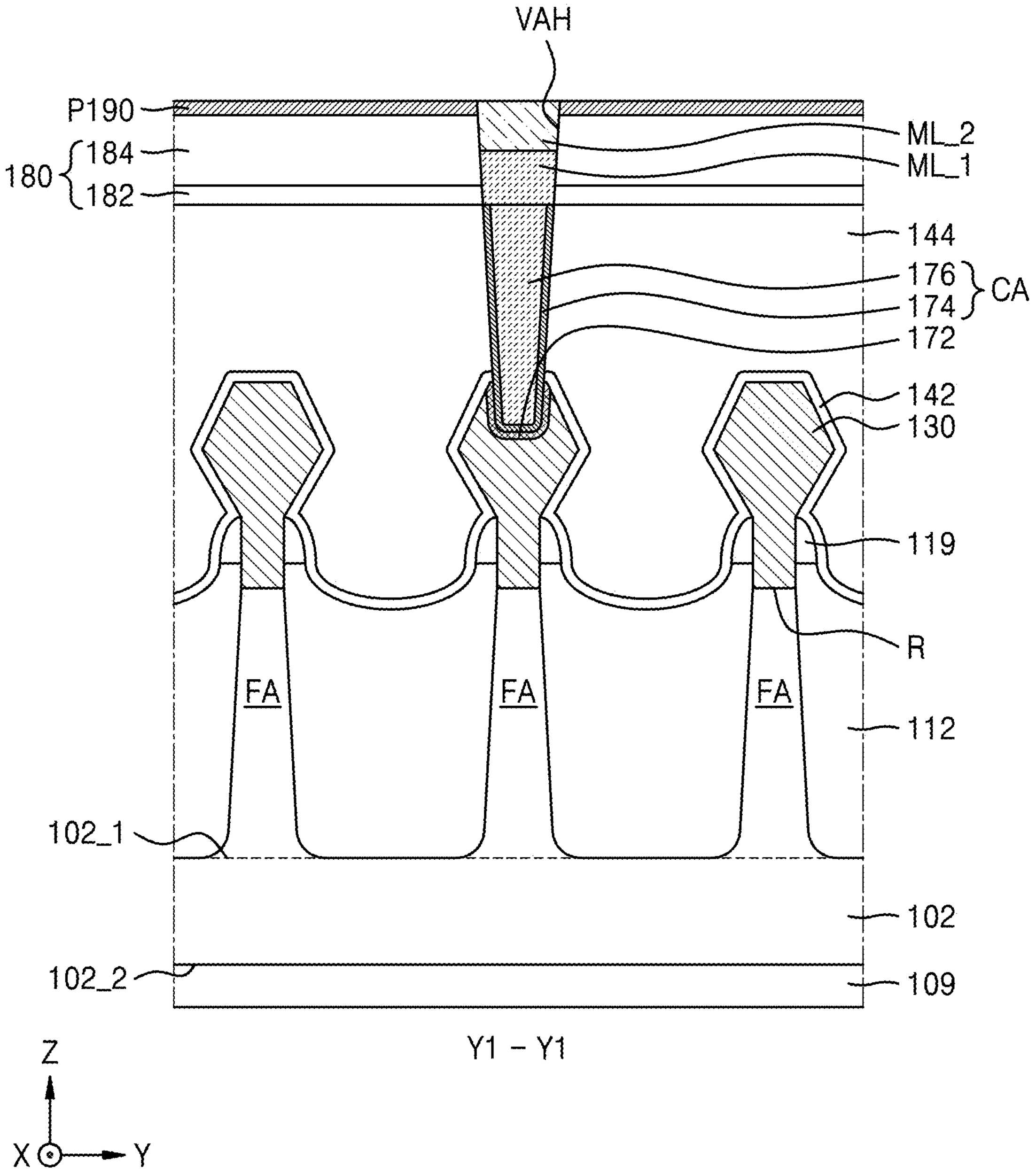

Referring to FIG. 23G, the inhibitor layer 193 may be removed, and the first hole H1 may be filled with a same material as the pre-adhesive layer P190. Filling the first hole H1 may be performed using physical vapor deposition (PVD) process, ALD process, and/or CVD process.

Thereafter, a portion of the pre-adhesive layer P190 may be removed by using chemical-mechanical polishing (CMP) process. As a result thereof, the top surface of the pre-adhesive layer P190 may be at a same vertical level as the top surface of the second metal layer ML_2.

Figure 23H:
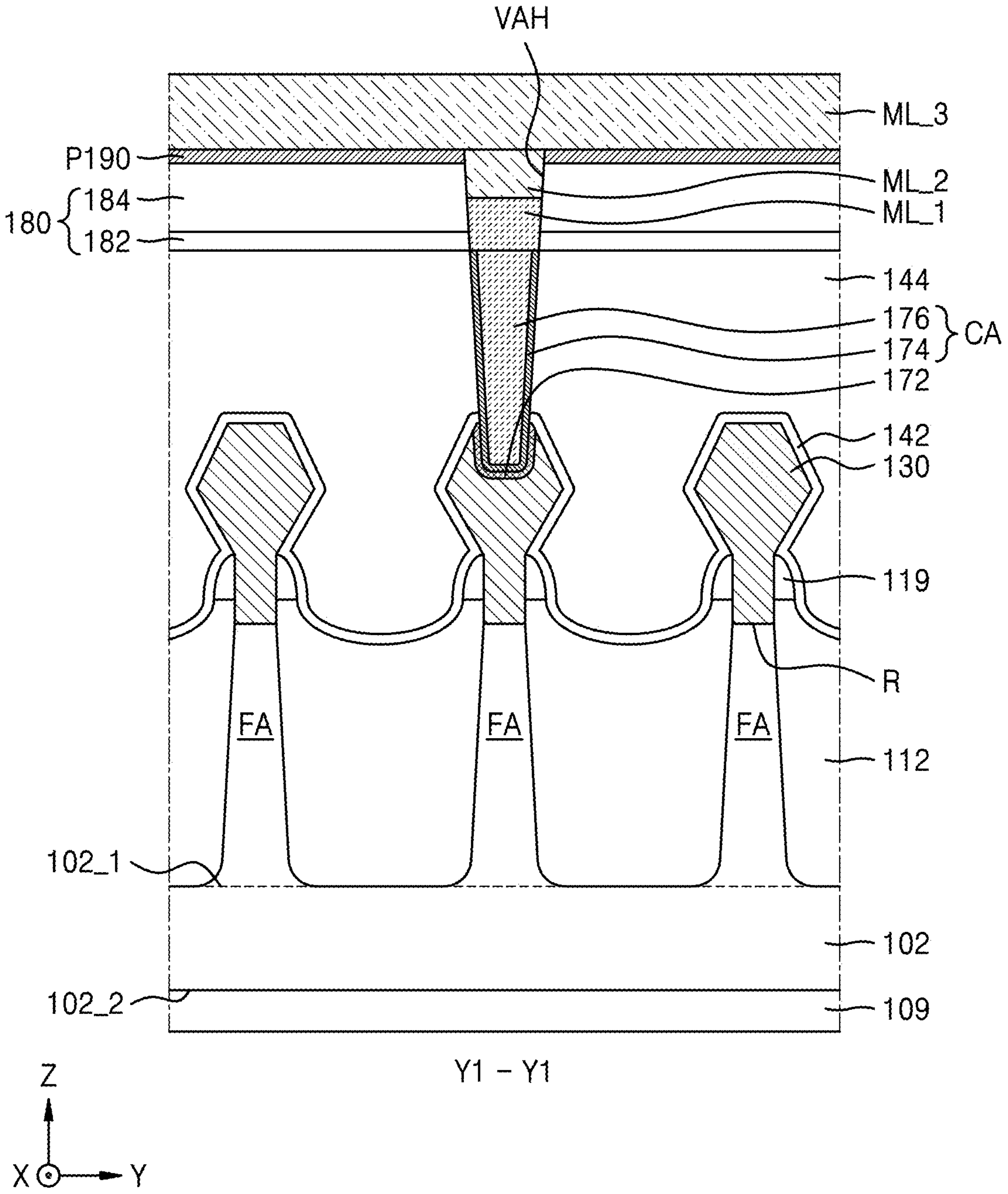

Referring to FIG. 23H, a third metal layer ML_3 may be formed on the top surfaces of the second metal layer ML_2 and the pre-adhesive layer P190. The third metal layer ML_3 may include a same kind of metal as the second metal layer ML_2. The third metal layer ML_3 and the second metal layer ML_2 may be integrally formed. For example, when the second metal layer ML_2 includes Ru, the third metal layer ML_3 may also include Ru. The third metal layer ML_3 may directly contact the second metal layer ML_2.

Figure 23I:
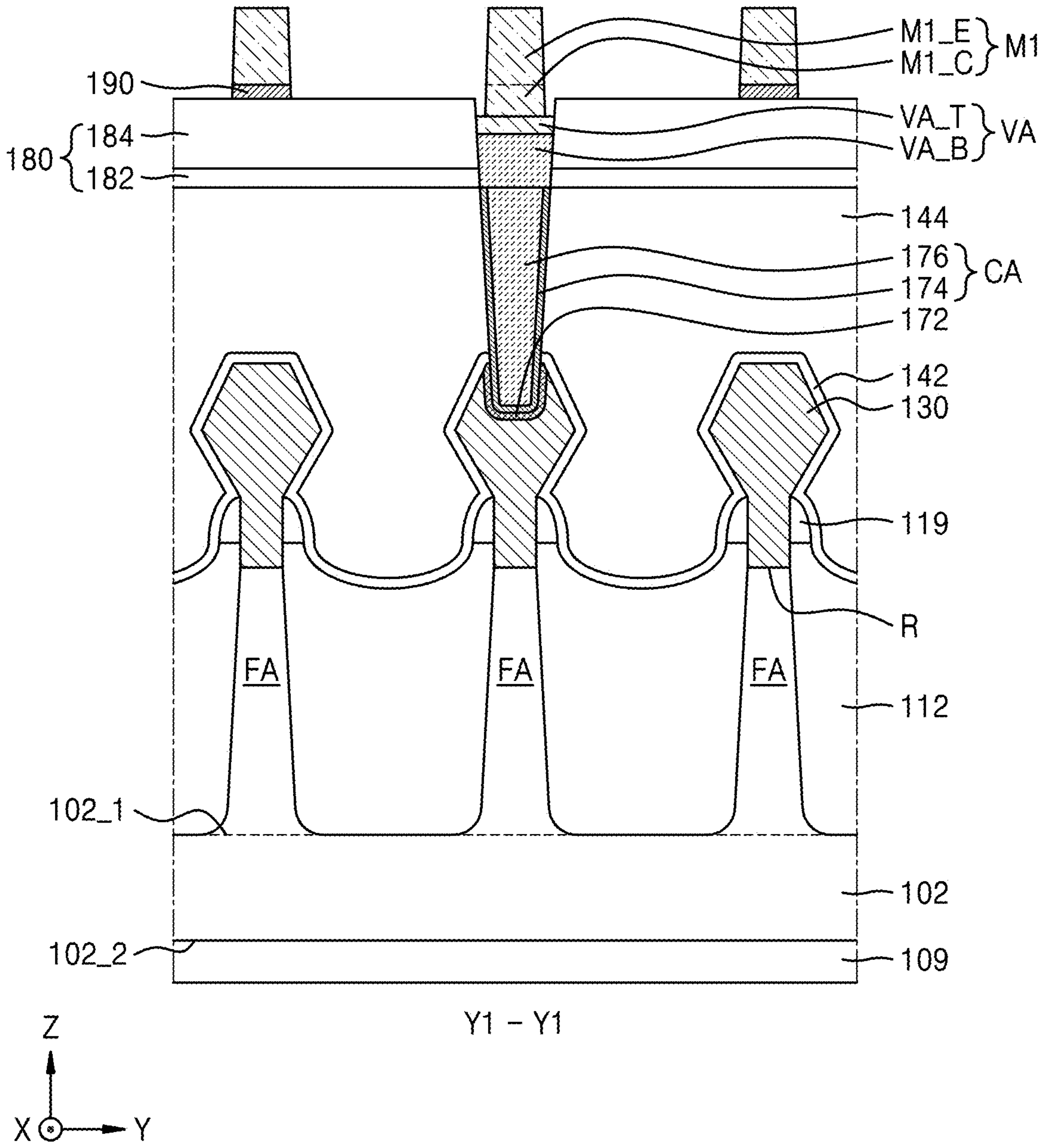

Referring to FIG. 23I, a plurality of wiring lines M1 may be formed by patterning the third metal layer ML_3. More particularly, the third pattern layer ML_3 may be patterned such that a thickness of the wiring line M1 in the second direction (the Y direction) is less than a thickness in the second horizontal direction (the Y direction) of the via contact VA under the wiring line M1. For example, subtractive etch scheme may be used.

In a process of patterning the third metal layer ML_3 to form the plurality of wiring lines M1, the top via contact VA_T may be formed by simultaneously etching the second metal layer ML_2. As a result thereof, a vertical level of the top surface of the via contact VA may be lower than a vertical level of the top surface of the top insulating structure 180. That is, the third metal layer ML_3 and the second metal layer ML_2 may be integrally formed and then formed into the wiring line M1 and the top via contact VA_T through the patterning process.

Next, the integrated circuit device 100 described with reference to FIGS. 2 to 5 may be manufactured by forming the top insulating film 192 surrounding the plurality of wiring lines M1.

According to the method of manufacturing the integrated circuit device 100 described with reference to FIGS. 23A to 23I, the first metal layer ML_1 may include Mo, and the second metal layer ML_2 may include Ru. When the second metal layer ML_2 including Ru is arranged on the first metal layer ML_1 including Mo, it is possible to improve increase in resistance caused by oxidation of Mo of the first metal layer ML_1 due to etching gas that may be used in the process of patterning the third metal layer ML_3 described with reference to FIG. 23I. In addition, even when the third metal layer ML_3 is over-etched, the second metal layer ML_2 may be first etched on the first metal layer ML_1 and increase an etching margin, and thus, process control may be improved.

An example of a method of manufacturing the integrated circuit device 100 has been described with reference to FIGS. 23A to 23I. However, it will be understood to those of skilled in the art that the integrated circuit devices 100A, 100B, 101, 101*a*, and 10B illustrated in FIGS. 6 to 10, the integrated circuit device 300 illustrated in FIGS. 20 to 22, and integrated circuit devices having various structures modified and changed based thereon may be manufactured by numerous modification and changes based on the description with reference to FIGS. 23A to 23I without departing from the spirit of the disclosure.

FIGS. 24A to 24J are cross-sectional views illustrated according to process orders to describe a method of manufacturing the integrated circuit device 200. More particularly, FIGS. 24A to 24J are cross-sectional views corresponding to a cross-section taken along a line Y2-Y2 shown in FIG. 11.

Figure 24A:
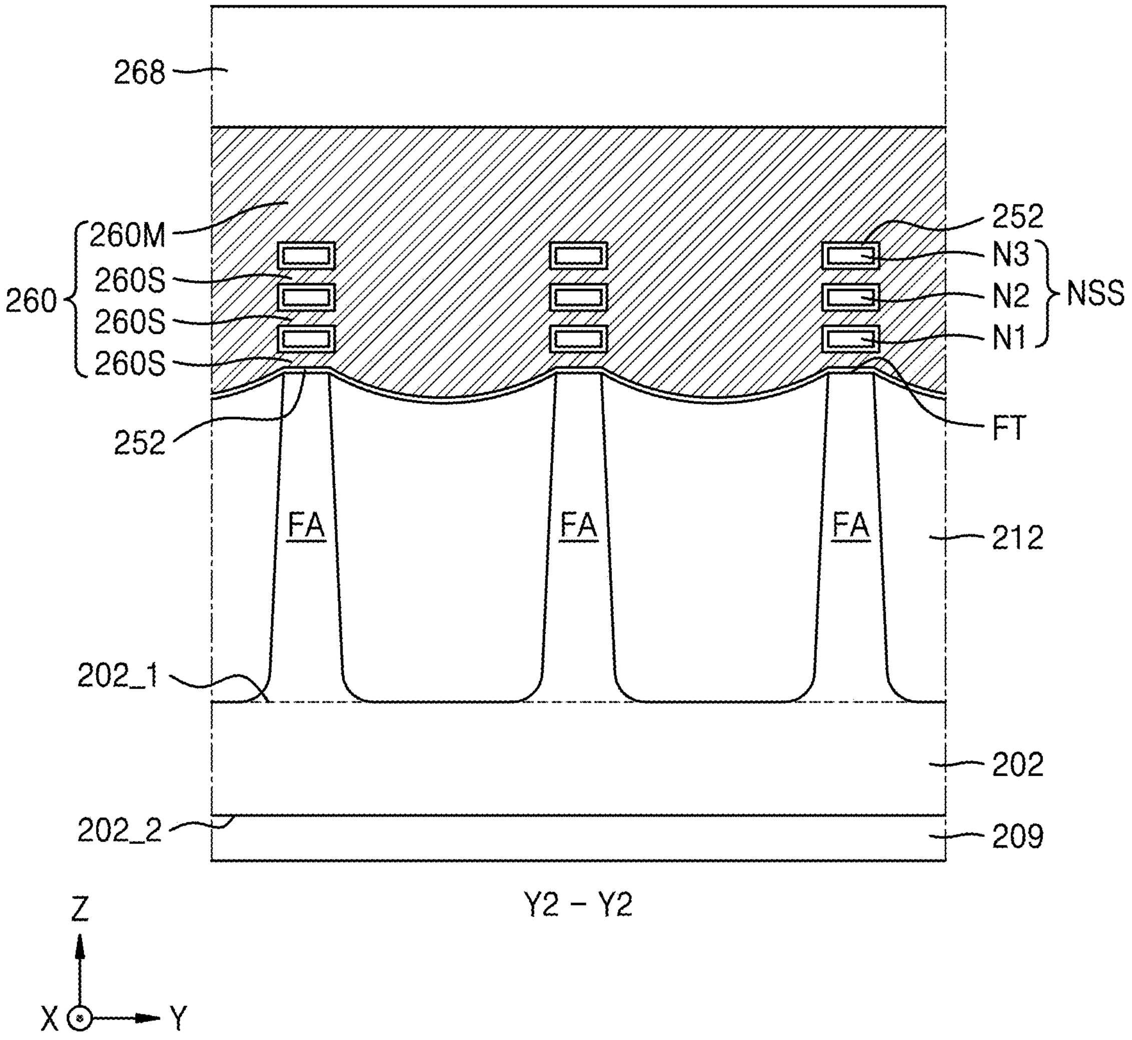
FIGS. 24A to 24J are cross-sectional views illustrated according to a process sequence of an example of a method of manufacturing an integrated circuit device.

Referring to FIG. 24A, the plurality of fin-type active regions FA protrude on the first surface 202_1 of the substrate 202. The plurality of gate lines 260 extending in the second horizontal direction (the Y direction) may be arranged on the plurality of fin-type active regions FA. The capping insulating pattern 268 on the plurality of gate lines 260.

Figure 24B:
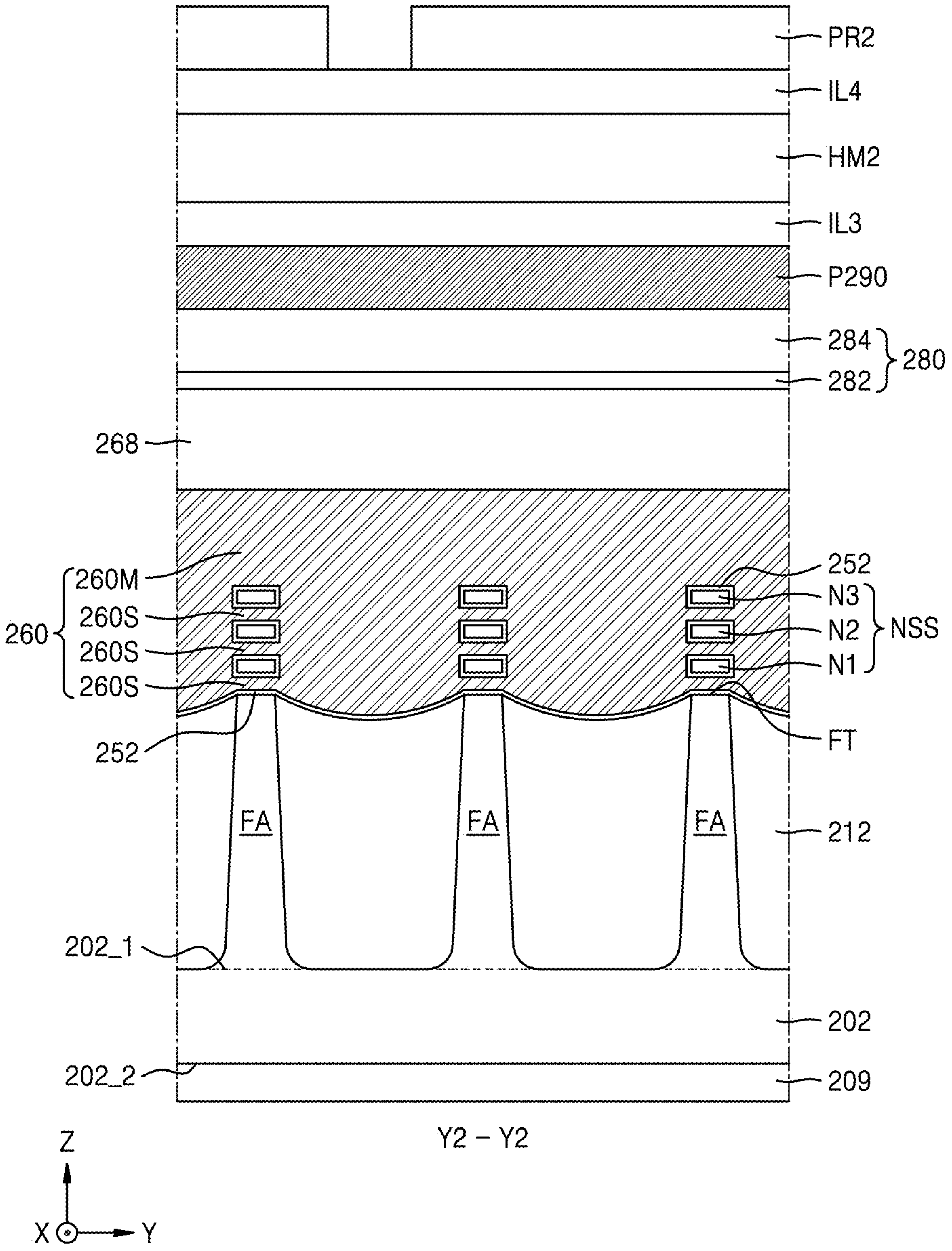

Referring to FIG. 24B, the top insulating structure 280, a pre-adhesive layer P290, a third insulating film IL3, a second hardmask film HM2, a fourth insulating film IL4, a second photoresist pattern PR2 are disposed on the capping insulating pattern 268. The second photoresist pattern PR2 may expose a region of the fourth insulating film IL4.

Figure 24C:
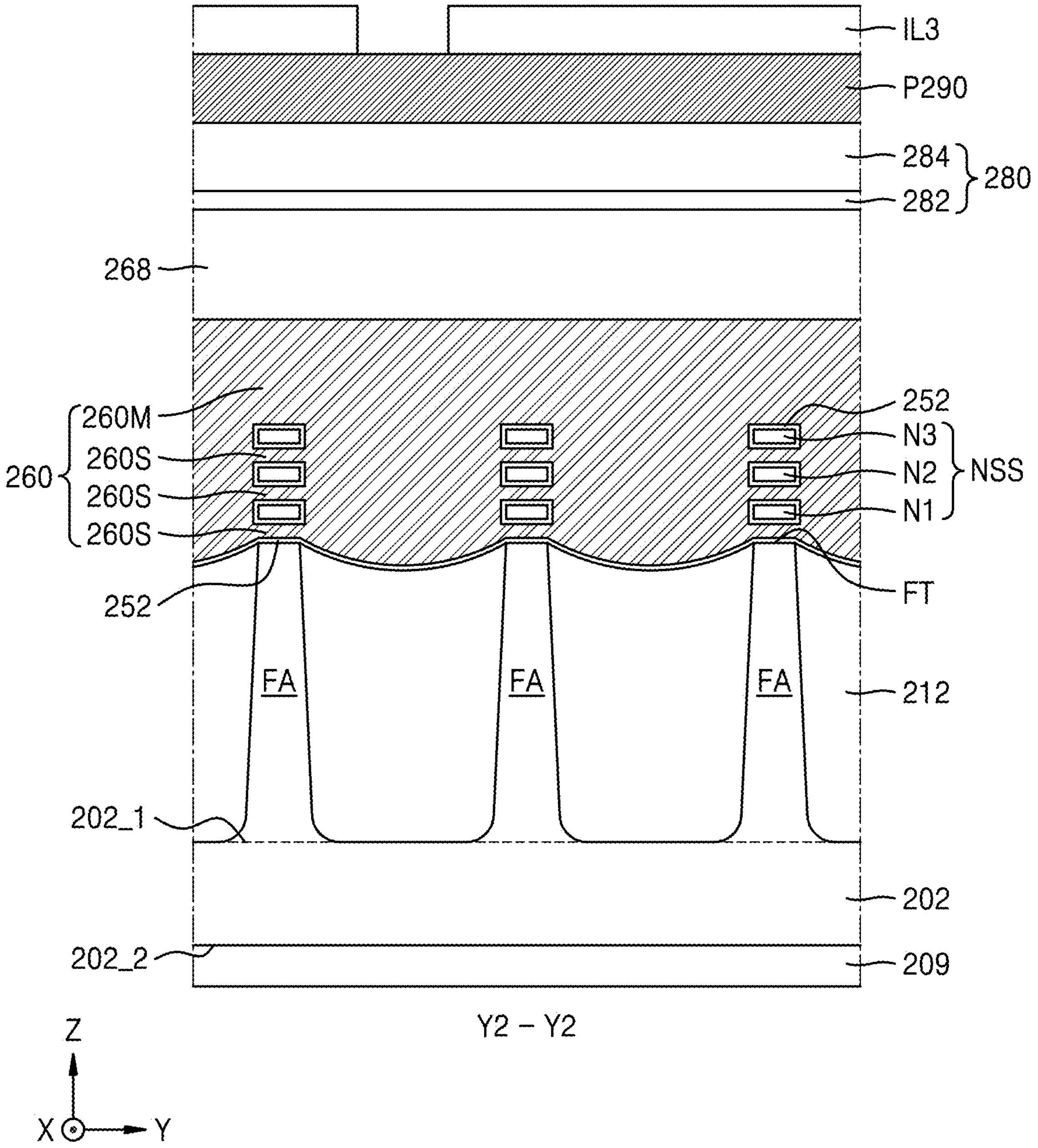

Referring to FIG. 24C, the fourth insulating film IL4, the second hardmask film HM2, and the third insulating film IL3 may be sequentially etched using the second photoresist pattern PR2 as a mask. By doing so, a region of the pre-adhesive layer P290 may be exposed. Next, the second photoresist pattern PR2, the fourth insulating film IL4, and the second hardmask film HM2 may be removed.

Figure 24D:
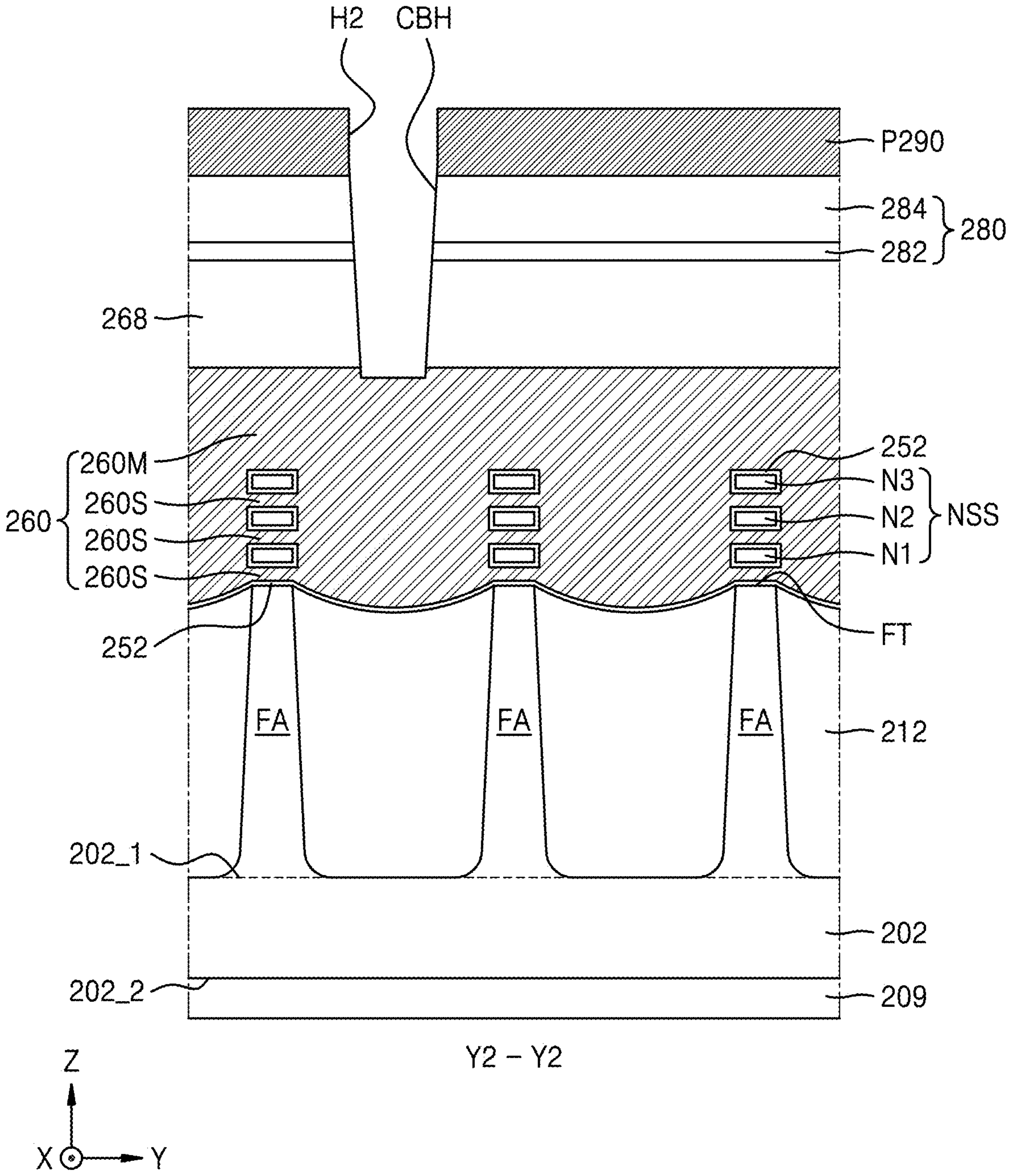

Referring to FIG. 24D, the pre-adhesive layer P290, the interlayer insulating film 284, an etch stop layer 282, and the capping insulating pattern 268 may be sequentially etched using the third insulating film IL3, in which a region thereof has been etched, as a mask. More particularly, a second hole H2 may be formed by etching the pre-adhesive layer P290 using the third insulating film IL3 as a mask. Next, a gate contact hole CBH may be formed by etching the top insulating structure 280 and the capping insulating pattern 268 exposed by the second hole H2. In some implementations, a portion of the gate line 260 may also be etched.

The gate line 260 may be exposed by the second hole H2 and the gate contact hole CBH. Thereafter, the third insulating film IL3 may be removed.

Figure 24E:
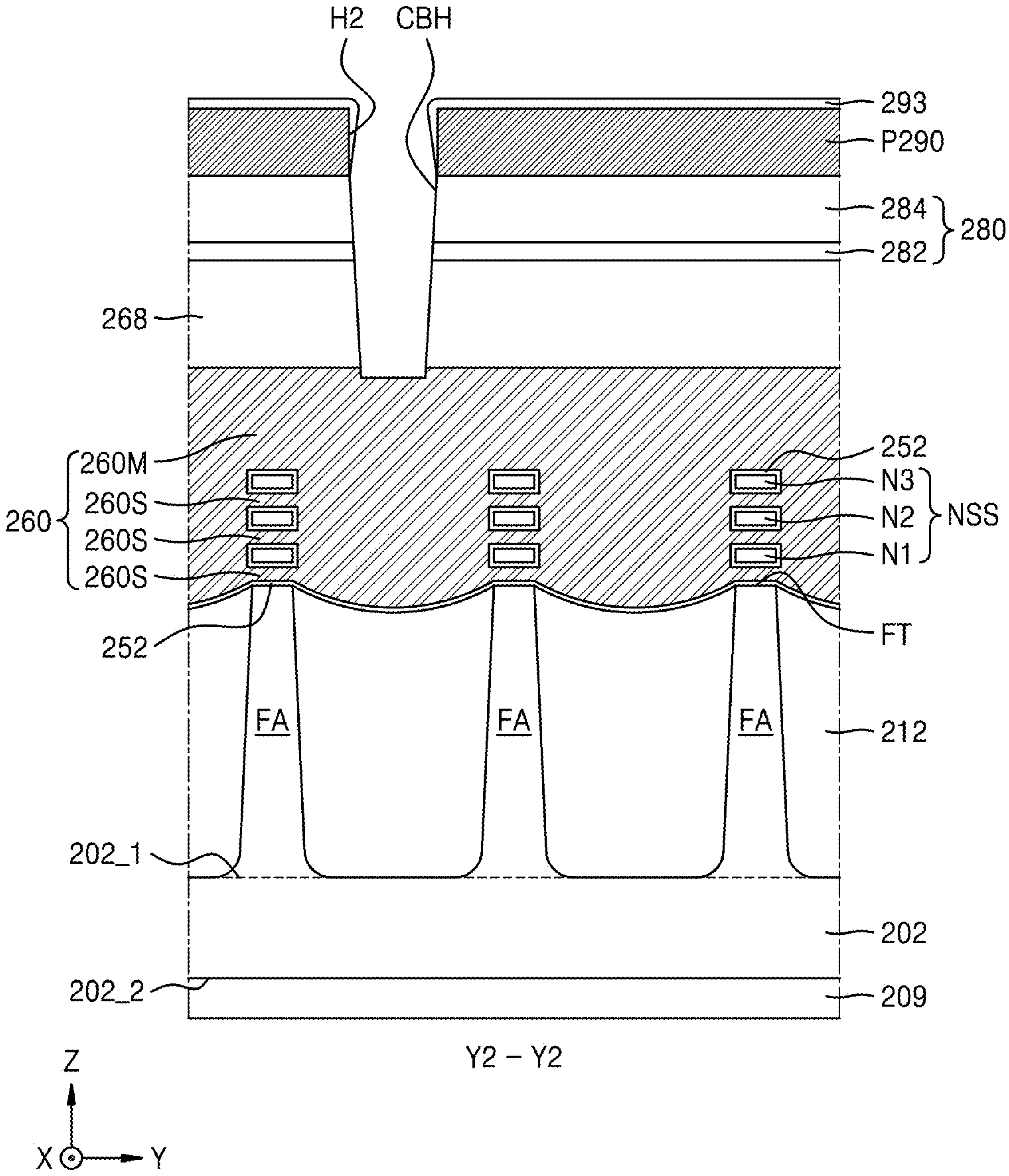

Referring to FIG. 24E, an inhibitor layer 293 may be formed on the pre-adhesive layer P290. More particularly, the inhibitor layer 293 may be selectively formed on a top surface of the pre-adhesive layer P290 and sidewalls of the second hole H2. For example, the inhibitor layer 293 may be selectively formed on the top surface of the pre-adhesive layer P290 and the sidewalls of the second hole H2, which include TiN. The inhibitor layer 293 may be formed not on sidewalls of the gate contact hole CBH and on the gate line 260.

Figure 24F:
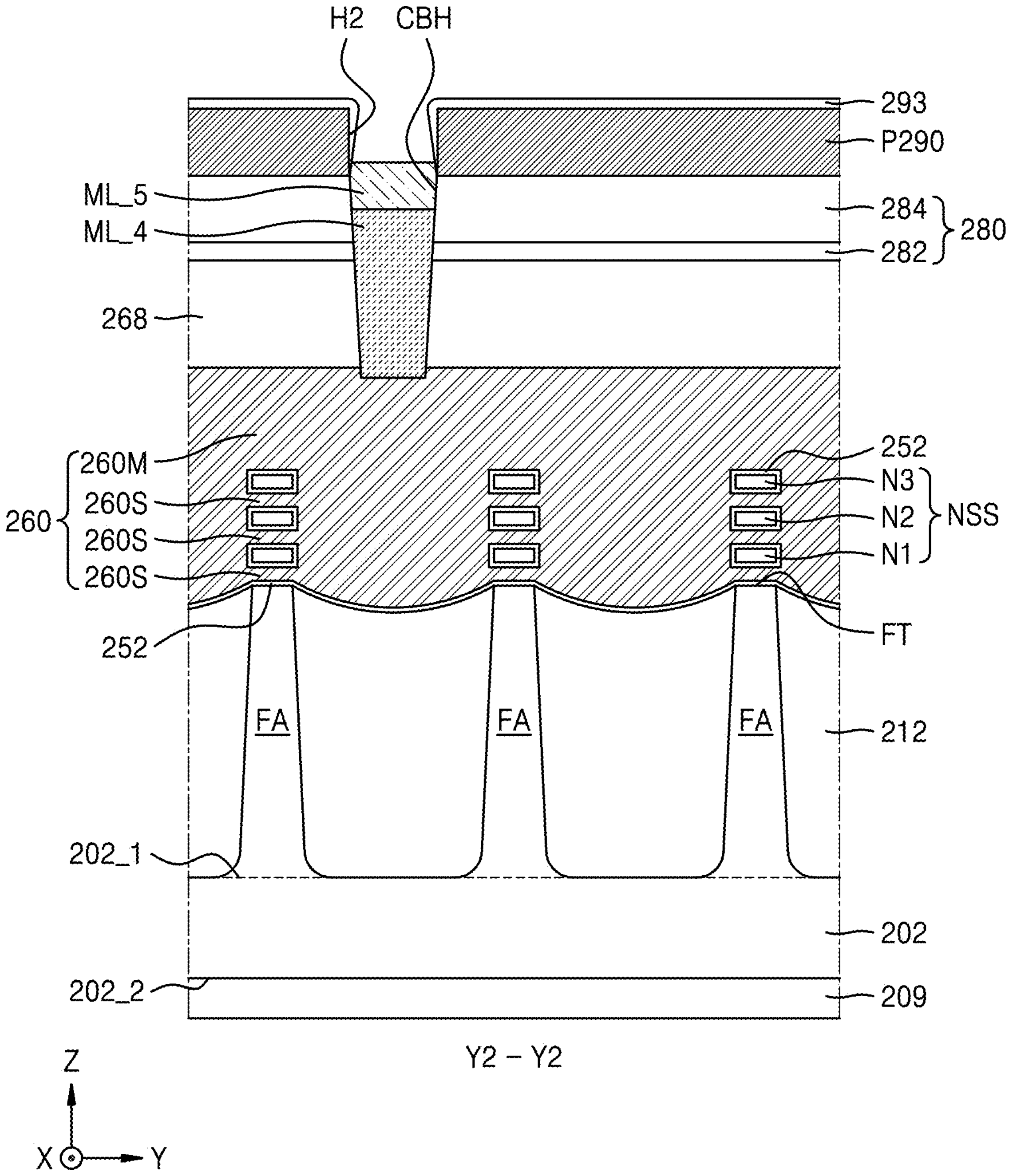

Referring to FIG. 24F, a fourth metal layer ML_4 and a fifth metal layer ML_5 may be sequentially formed in the gate contact hole CBH. The fourth metal layer ML_4 and the fifth metal layer ML_5 may include different kinds of metal. For example, the fourth metal layer ML_4 may include Mo. For example, the fifth metal layer ML_5 may include Ru. A top surface of the fourth metal layer ML_4 may have a vertical level lower than a vertical level of a top surface of the top insulating structure 280. A top surface of the fifth metal layer ML_5 may have a vertical level higher than a vertical level of the top surface of the top insulating structure 280 and lower than a vertical level of the top surface of the pre-adhesive layer P290.

Figure 24G:
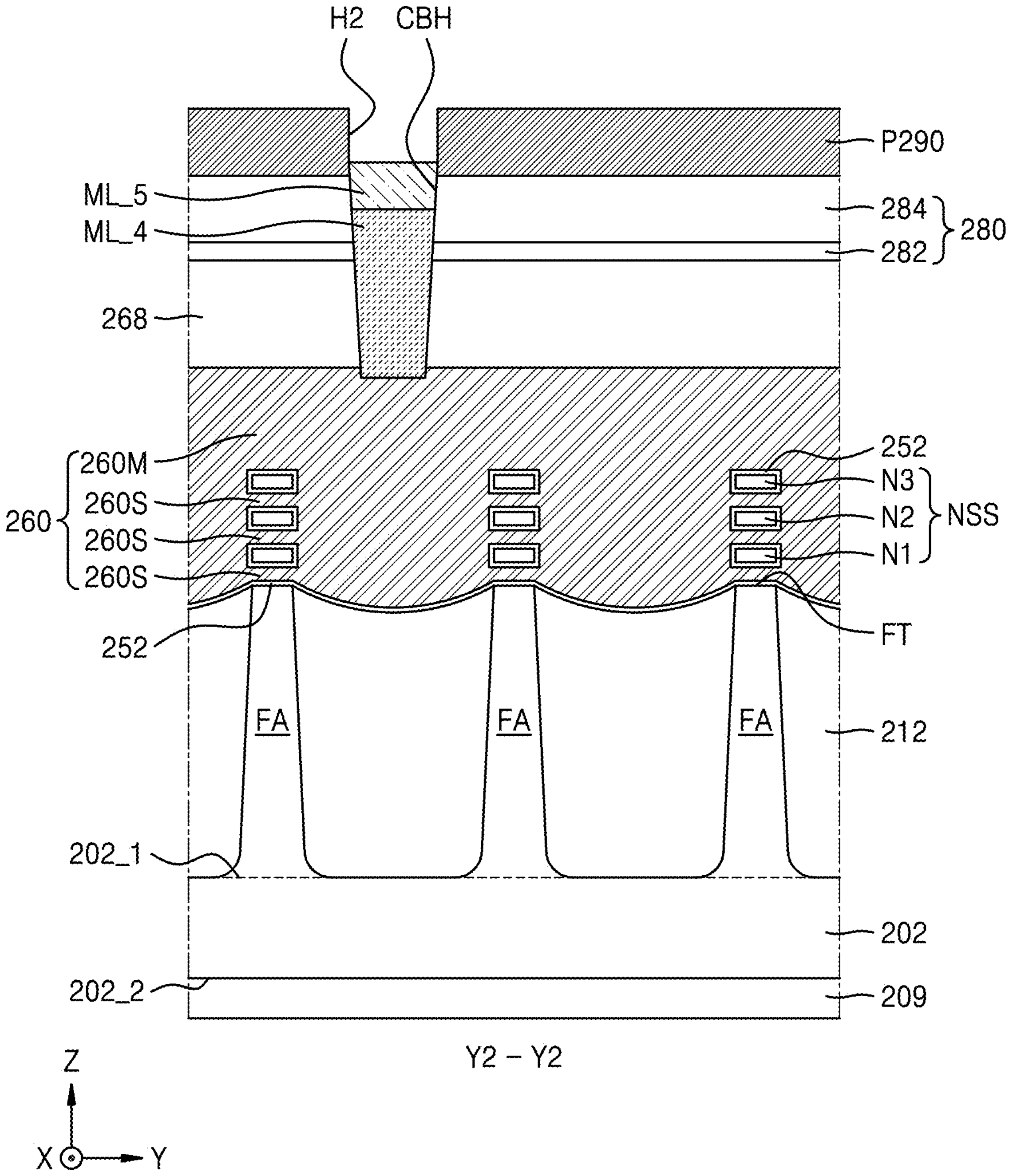
Figure 24H:
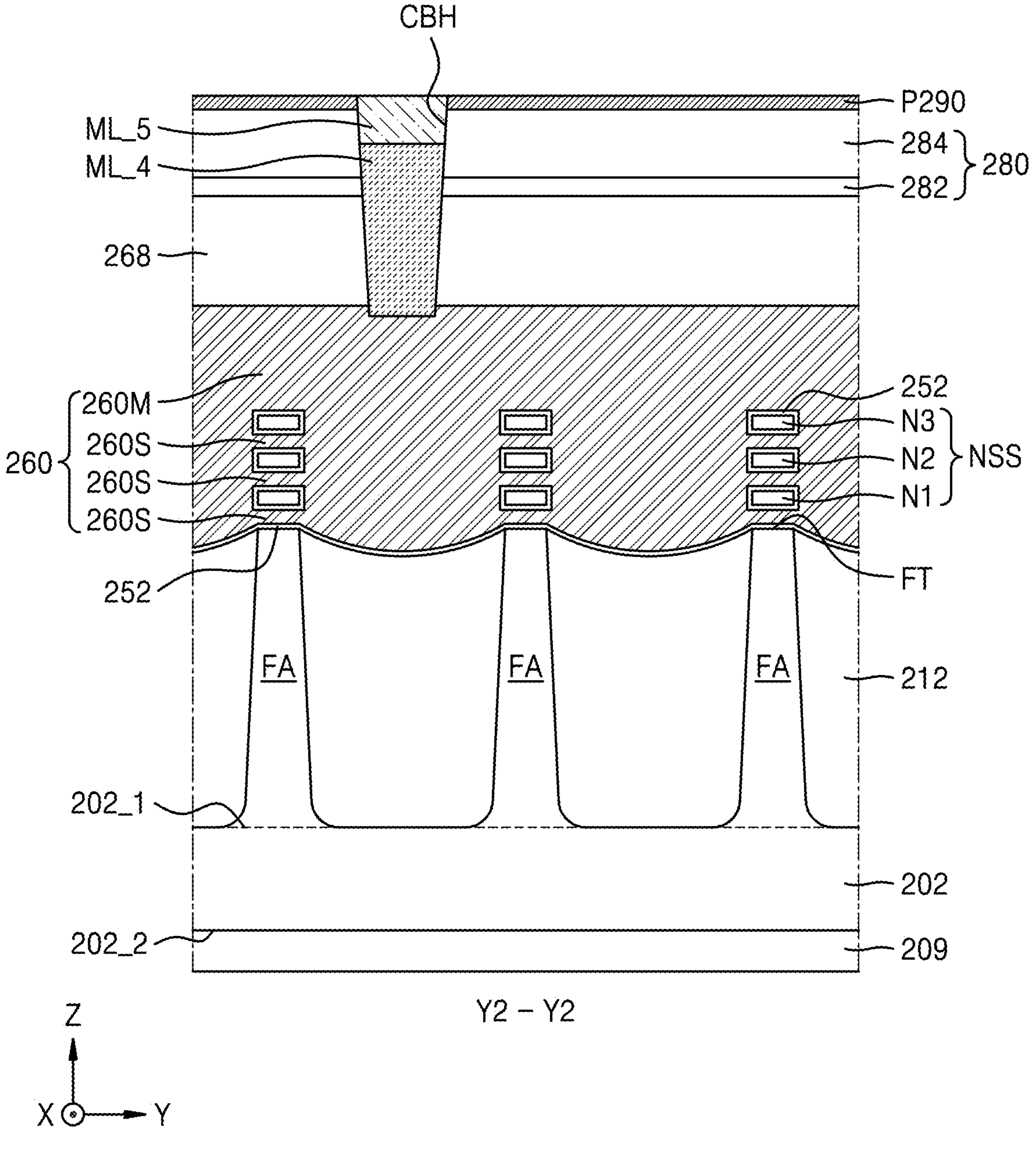

Referring to FIGS. 24G and 24H, the inhibitor layer 293 may be removed, and the second hole H2 may be filled with a same material as the pre-adhesive layer P290. A process of filling the second hole H2 may be performed using PVD process, ALD process, and/or CVD process.

Next, a portion of the pre-adhesive layer P290 may be removed using CMP process. As a result thereof, the top surface of the pre-adhesive layer P290 may be at a same vertical level as a vertical level of the top surface of the fifth metal layer ML_5.

Figure 24I:
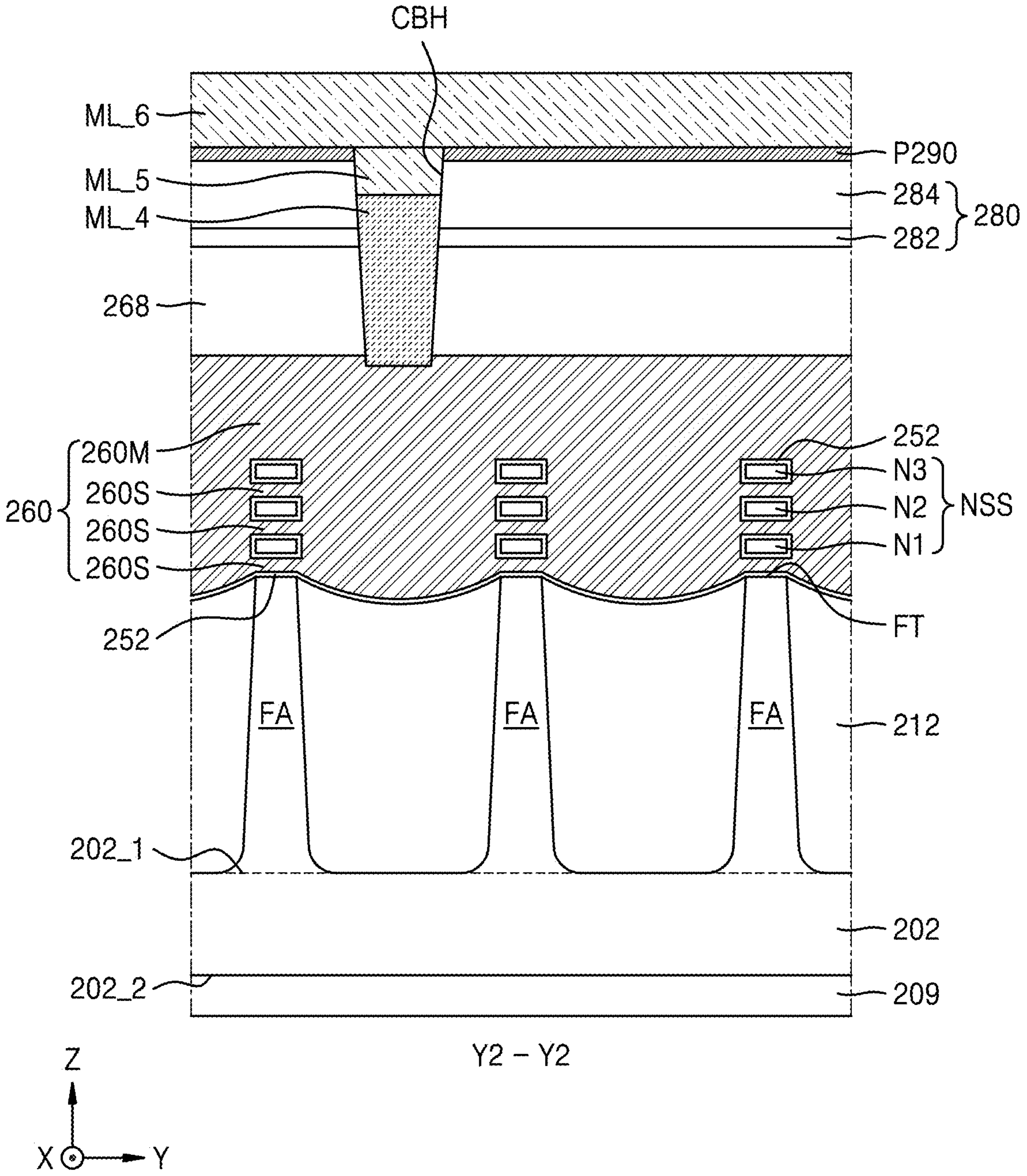

Referring to FIG. 24I, a sixth metal layer ML_6 may be formed on top surfaces of the fifth metal layer ML_5 and the pre-adhesive layer P290. The sixth metal layer ML_6 may include a same kind of metal as the fifth metal layer ML_5. The sixth metal layer ML_6 and the fifth metal layer ML_5 may be formed in one. For example, when the fifth metal layer ML5 includes Ru, the sixth metal layer ML6 may include Ru. The sixth metal layer ML_6 may directly contact the fifth metal layer ML_5.

Figure 24J:
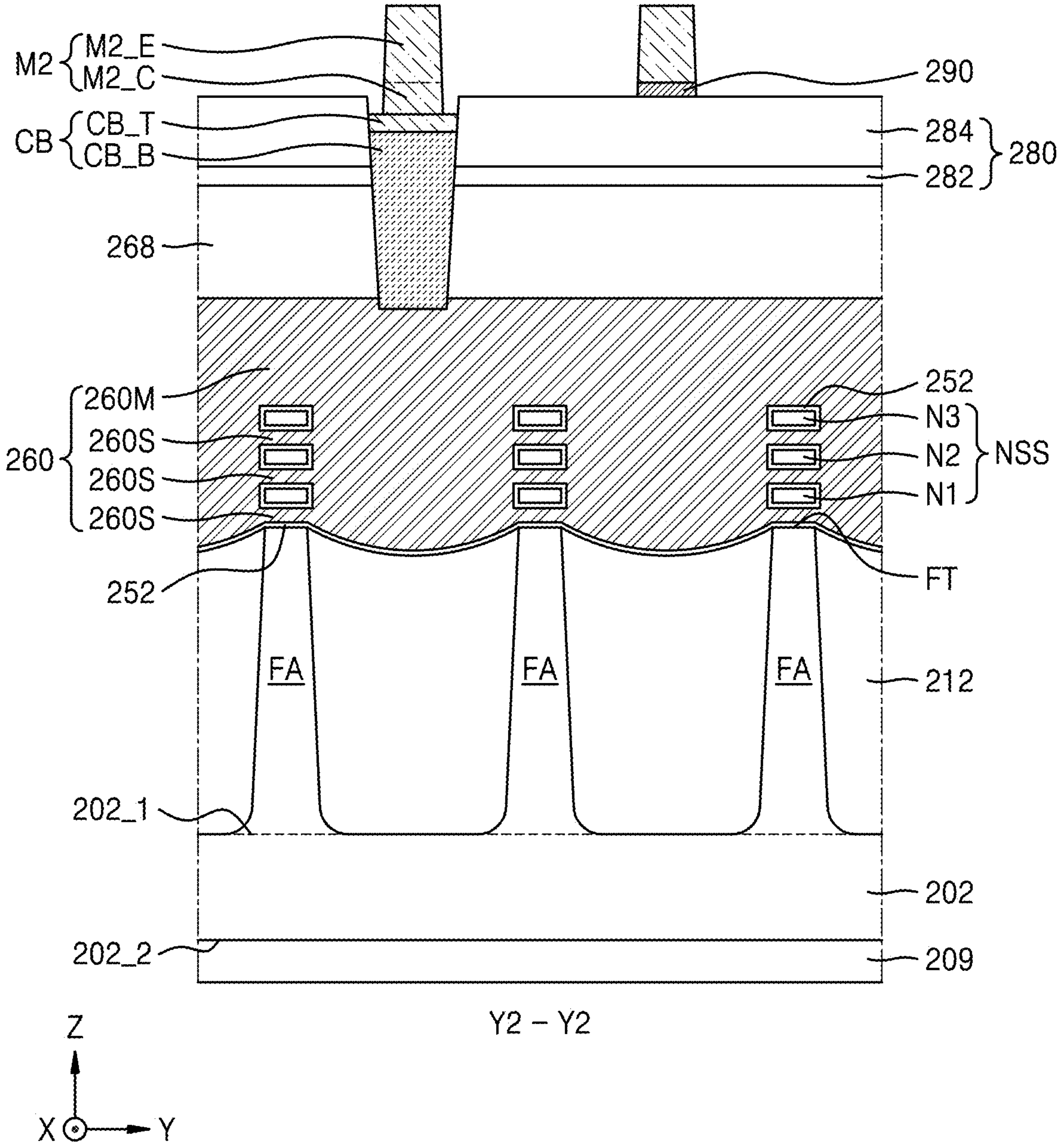

Referring to FIG. 24J, a plurality of wiring lines M2 may be formed by patterning the sixth metal layer ML_6. More particularly, the sixth metal layer ML_6 may be patterned such that a thickness of the wiring line M2 in the second horizontal direction (the Y direction) is less than a thickness of the gate contact CB under the wiring line M2 in the second horizontal direction (the Y direction). For example, a subtractive etch scheme may be used.

In a process of patterning the sixth metal layer ML_6 to form the plurality of wiring lines M2, the top gate contact CB_T may be formed by simultaneously etching the fifth metal layer ML_5. As a result thereof, a vertical level of the top surface of the gate contact CB may be lower than a vertical level of the top surface of the top insulating structure 280. That is, the sixth metal layer ML_6 and the fifth metal layer ML_5 may be formed in one and then formed into the wiring line M2 and the top gate contact CB_T through the patterning process.

Next, the integrated circuit device 200 described with reference to FIGS. 11 to 14B may be manufactured by forming an upper insulating film 292 surrounding the plurality of wiring lines M2.

An example of a method of manufacturing the integrated circuit device 200 has been described with reference to FIGS. 24A to 24J. However, it will be understood to those of skilled in the art that the integrated circuit devices 200A, 200B, 201, 201A, and 201B illustrated in FIGS. 15 to 19, the integrated circuit device 300 illustrated in FIGS. 20 to 22, and integrated circuit devices having various structures modified and changed based thereon may be manufactured by numerous modification and changes based on the description with reference to FIGS. 24A to 23J without departing from the spirit of the disclosure.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While the inventive concept has been particularly shown and described with reference to embodiments thereof, it will be understood that various changes in form and details may be made therein without departing from the spirit and scope of the following claims.

What is claimed is:

1. An integrated circuit device comprising:

a substrate;

a fin-type active region extending in a first horizontal direction on a first surface of the substrate;

a source/drain region on the fin-type active region;

an active contact arranged on the source/drain region and electrically connected to the source/drain region;

a wiring line extending at a vertical level higher than a vertical level of the source/drain region;

a via contact penetrating an insulating layer on the source/drain region, wherein the active contact and the wiring line are electrically connected through the via contact; and an adhesive layer between the wiring line and the insulating layer, the adhesive layer directly contacting the wiring line, wherein the via contact comprises a top via contact and a bottom via contact, wherein the top via contact comprises a metal different from a metal included in the bottom via contact, and wherein the wiring line and the top via contact directly contact each other.

2. The integrated circuit device of claim 1, wherein the metal included in the bottom via contact is different from a metal included in the wiring line.

3. The integrated circuit device of claim 2, wherein the metal of the top via contact and the metal included in the wiring line both comprise a same first metal.

4. The integrated circuit device of claim 1, wherein a thickness of the top via contact along a vertical direction perpendicular to the first surface of the substrate is less than a thickness of the bottom via contact along the vertical direction.

5. The integrated circuit device of claim 1, wherein the wiring line comprises an extending part and a connecting part that connects the extending part to the top via contact, and a thickness of the extending part along a vertical direction perpendicular to the first surface of the substrate is greater than a thickness of the adhesive layer along the vertical direction.

6. The integrated circuit device of claim 1, wherein the metal of the top via contact and a metal included in the active contact both comprise a same first metal.

7. The integrated circuit device of claim 6, wherein the metal included in the bottom via contact comprises the first metal.

8. The integrated circuit device of claim 1, wherein the wiring line comprises an extending part and a connecting part that connects the extending part to the top via contact, and wherein the adhesive layer is arranged between the extending part and the insulating layer, and wherein the adhesive layer is not arranged between the extending part and the connecting part and between the connecting part and the top via contact.

9. The integrated circuit device of claim 1, wherein a vertical level of a top surface of the top via contact is equal to or lower than a vertical level of a bottom surface of the adhesive layer.

10. The integrated circuit device of claim 1, wherein the wiring line extends in the first horizontal direction, and wherein a width of the via contact in a second horizontal direction is greater than a width of the wiring line in the second horizontal direction.

11. An integrated circuit device comprising:

a substrate;

a fin-type active region extending in a first horizontal direction on a first surface of the substrate;

a source/drain region on the fin-type active region;

a gate line extending, on the fin-type active region, in a second horizontal direction crossing the first horizontal direction;

a wiring line extending at a vertical level higher than a vertical level of the source/drain region;

a gate contact penetrating an insulating layer on the gate line, wherein the gate line and the wiring line are electrically connected through the gate contact; and an adhesive layer between the wiring line and the insulating layer and contacting the wiring line, wherein the gate contact comprises a top gate contact and a bottom gate contact, the top gate contact comprises a metal different from a metal included in the bottom gate contact, and the wiring line and the top gate contact directly contact each other.

12. The integrated circuit device of claim 11, wherein the metal included in the bottom gate contact is different from a metal included in the wiring line.

13. The integrated circuit device of claim 12, wherein the metal of the top gate contact and the metal included in the wiring line both comprise a same first metal.

14. The integrated circuit device of claim 11, wherein a thickness of the top gate contact along a vertical direction perpendicular to the first surface of the substrate is less than a thickness along the vertical direction of the bottom gate contact.

15. The integrated circuit device of claim 11, wherein the wiring line comprises an extending part and a connecting part that connects the extending part to the top gate contact, the extending part and the connecting part directly contact each other, and the connecting part directly contacts the top gate contact.

16. The integrated circuit device of claim 11, wherein a vertical level of a top surface of the top gate contact is equal to or lower than a vertical level of a bottom surface of the adhesive layer.

17. The integrated circuit device of claim 11, wherein the wiring line extends in the first horizontal direction, and wherein a width of the top gate contact in the second horizontal direction is greater than a width of the wiring line in the second horizontal direction.

18. An integrated circuit device comprising:

a substrate;

a fin-type active region extending in a first horizontal direction on a first surface of the substrate;

a source/drain region on the fin-type active region;

a gate line extending, on the fin-type active region, in a second horizontal direction crossing the first horizontal direction;

a wiring line extending in the first horizontal direction at a vertical level higher than a vertical level of the source/drain region;

an active contact on the source/drain region and electrically connected to the source/drain region;

a via contact penetrating an insulating layer in the source/drain region, wherein the active contact and the wiring line are electrically connected through the via contact;

a gate contact penetrating the insulating layer, wherein the gate line and the wiring line are electrically connected through the gate contact; and a titanium nitride (TiN) layer between the wiring line and the insulating layer, and contacting the wiring line, wherein the via contact comprises a top via contact comprising ruthenium (Ru) and a bottom via contact comprising molybdenum (Mo), wherein the gate contact comprises a top gate contact comprising Ru and a bottom gate contact comprising Mo, wherein a width of the top via contact in a second horizontal direction is greater than a width of the wiring line in the second horizontal direction, wherein a width of the top gate contact in the second horizontal direction is greater than a width of the wiring line in the second horizontal direction, wherein the wiring line and the top via contact are in direct contact with each other, and wherein the wiring line and the top gate contact are in direct contact with each other.

19. The integrated circuit device of claim 18, wherein the wiring line comprises an extending part, a first connecting part that connects the extending part to the top via contact, and a second connecting part that connects the extending part to the top gate contact, wherein the TiN layer is arranged between the extending part and the insulating layer, and wherein the TiN layer is not arranged between the extending part and the first connecting part, between the extending part and the second connecting part, between the first connecting part and the top via contact, and between the second connecting part and the top gate contact.

20. The integrated circuit device of claim 18, wherein a width of the top via contact in the second horizontal direction and a width of the top gate contact in the second horizontal direction are greater than a width of the wiring line in the second horizontal direction.

* * * * *